(12) United States Patent
Yamaguchi et al.

(10) Patent No.: US 11,541,502 B2
(45) Date of Patent: Jan. 3, 2023

(54) SUBSTRATE PROCESSING APPARATUS

(71) Applicant: EBARA CORPORATION, Tokyo (JP)

(72) Inventors: Kuniaki Yamaguchi, Tokyo (JP); Hiroshi Shimomoto, Tokyo (JP); Soichi Isobe, Tokyo (JP); Koji Maeda, Tokyo (JP); Kenji Shinkai, Tokyo (JP); Hidetatsu Isokawa, Tokyo (JP); Dai Yoshinari, Tokyo (JP); Masayuki Tamura, Tokyo (JP); Haiyang Xu, Tokyo (JP); Shun Ehara, Tokyo (JP); Kentaro Asano, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 17/041,734

(22) PCT Filed: Mar. 4, 2020

(86) PCT No.: PCT/JP2020/009018
§ 371 (c)(1),
(2) Date: Sep. 25, 2020

(87) PCT Pub. No.: WO2020/179804
PCT Pub. Date: Sep. 10, 2020

(65) Prior Publication Data
US 2021/0394332 A1    Dec. 23, 2021

(30) Foreign Application Priority Data

Mar. 6, 2019  (JP) .............................. JP2019-041015

(51) Int. Cl.
*B24B 49/00* (2012.01)
*B24B 37/015* (2012.01)
(Continued)

(52) U.S. Cl.
CPC .......... *B24B 37/015* (2013.01); *B24B 53/005* (2013.01); *B24B 57/02* (2013.01); *B24B 53/017* (2013.01)

(58) Field of Classification Search
CPC ..... B24B 37/015; B24B 53/005; B24B 57/02; B24B 53/017
(Continued)

(56) References Cited

U.S. PATENT DOCUMENTS 6,412,134 B1    7/2002  Oikawa
2002/0164932 A1*  11/2002  Kamimura ............ B24B 53/017
257/E21.23
(Continued)

FOREIGN PATENT DOCUMENTS

JP    H10-264011 A    10/1998
JP    2000-173966 A    6/2000
(Continued)

OTHER PUBLICATIONS

International Search Report issued in Patent Application No. PCT/JP2020/009018 dated May 26, 2020.
(Continued)

*Primary Examiner* — Joseph J Hail
*Assistant Examiner* — Shantese L McDonald
(74) *Attorney, Agent, or Firm* — Pearne & Gordon LLP

(57) ABSTRACT

A substrate processing apparatus includes a polishing section and a transport section. The polishing section has a first polishing unit, a second polishing unit, and a transport mechanism. The first polishing unit has a first polishing apparatus and a second polishing apparatus. The second polishing unit has a third polishing apparatus and a fourth polishing apparatus. Each of the first to fourth polishing apparatuses has a polishing table to which a polishing pad is mounted, a top ring, and auxiliary units that perform a (Continued)

process on the polishing pad during polishing. Around the polishing table, a pair of auxiliary unit mounting units for mounting the respective auxiliary units in a left-right switchable manner with respect to a straight line connecting a swing center of the top ring and a center of rotation of the polishing table is provided at respective positions symmetrical with respect to the straight line.

9 Claims, 63 Drawing Sheets

(51) Int. Cl.
  *B24B 53/00* (2006.01)
  *B24B 57/02* (2006.01)
  *B24B 53/017* (2012.01)
(58) Field of Classification Search
  USPC ................................. 451/7, 41, 56, 287, 288
  See application file for complete search history.

(56) References Cited

U.S. PATENT DOCUMENTS

| | | | |
|---|---|---|---|
| 2012/0193506 A1 | 8/2012 | Takahashi et al. | |
| 2016/0099156 A1* | 4/2016 | Yamaguchi | H01L 21/67109 438/692 |
| 2018/0001440 A1* | 1/2018 | Aono | H01L 21/67173 |
| 2018/0093360 A1 | 4/2018 | Shinozaki et al. | |
| 2019/0039203 A1 | 2/2019 | Toriyabe | |

FOREIGN PATENT DOCUMENTS

| | | |
|---|---|---|
| JP | 2010-050436 A | 3/2010 |
| JP | 2010-238850 A | 10/2010 |
| JP | 2016-043471 A | 4/2016 |
| JP | 2016-074048 A | 5/2016 |
| JP | 2018-006549 A | 1/2018 |
| JP | 2018-058197 A | 4/2018 |
| JP | 2019-029562 A | 2/2019 |
| WO | 2002-034467 A1 | 5/2002 |
| WO | 2007-099976 A1 | 9/2007 |

OTHER PUBLICATIONS

Written Opinion issued in Patent Application No. PCT/JP2020/009018 dated May 26, 2020.

* cited by examiner

TOP VIEW

SIDE VIEW (CLEANING SIDE)

TOP VIEW

SIDE VIEW (CLEANING SIDE)

TOP VIEW

SIDE VIEW (CLEANING SIDE)

SUBSTRATE PROCESSING APPARATUS

TECHNICAL FIELD

The present disclosure relates to a substrate processing apparatus, and more particularly to a substrate processing apparatus used for flatly polishing a substrate such as a semiconductor wafer.

BACKGROUND

In recent years, with the progress of higher integration of semiconductor devices, the wiring of circuits has become finer and the inter-wiring distance is becoming narrower. In the manufacture of semiconductor devices, many kinds of materials are formed in film form on a silicon wafer to form a laminated structure. In order to form this laminated structure, a technique for making the surface of the wafer flat is important. As a means for planarizing the surface of such a wafer, a polishing apparatus (also referred to as chemical mechanical polishing apparatus) which performs chemical mechanical polishing (CMP) is widely used.

The chemical mechanical polishing (CMP) apparatus generally includes a polishing table having a polishing pad mounted thereto, a top ring that holds the wafer, and a nozzle that supplies the polishing liquid onto the polishing pad. While the polishing liquid is supplied onto the polishing pad from the nozzle, the wafer is pressed against the polishing pad by the top ring, and the top ring and the polishing table are relatively moved, thereby to polish the wafer to make the surface flat.

In addition to such a CMP apparatus, the substrate processing apparatus is a device having a function of cleaning a wafer after polishing, and further drying the wafer. Such a substrate processing apparatus is required to improve the throughput of substrate processing. Since the substrate processing apparatus has various processing units that perform polishing, cleaning, etc., the delay in processing in each processing unit reduces the throughput of the entire substrate processing apparatus. For example, in the conventional substrate processing apparatus described in WO 2007/099976 A, even when the polishing section has a plurality of polishing units, only one cleaning line is provided in the cleaning section, so that it is not possible to clean and dry a plurality of polished wafers simultaneously.

Further, in the conventional substrate processing apparatus, in a case where the polishing section has a first polishing unit and a second polishing unit, when polishing a wafer in the first polishing unit, the wafer is directly transferred from the load/unload unit to the first polishing unit, and when the substrate is polished by the second polishing unit, the wafer is transferred from the load/unload unit to the second polishing unit via the first polishing unit. Therefore, congestion occurs in the same carry-in route portion of the first polishing unit and the second polishing unit, and the throughput is reduced.

Further, in the conventional substrate processing apparatus, the transport robot disposed in the load/unload unit directly loads the wafer before polishing from the load/unload unit to the polishing section, and loads the wafer after cleaning from the cleaning section to the load/unload unit. While the high degree of cleanliness is required for the hand of the transport robot that holds the wafer after cleaning, there is a concern that the hand may come into contact with the polishing environment and become contaminated when the wafer before polishing is directly loaded into the polishing section.

SUMMARY

To compensate for such drawbacks of the conventional substrate processing apparatus, as shown in FIG. 32, the applicants of the present application propose a substrate processing apparatus 10 including a polishing section 12 that polishes a substrate, a transport section 14 that transports the substrate before polishing to the polishing section 12, and a cleaning section 13 that cleans the substrate after polishing, wherein the polishing section 12 has a first polishing unit 20a and a second polishing unit 20b, and a polishing section transport mechanism 22 disposed so as to be adjacent to each of the first polishing unit 20a and the second polishing unit 20a, and the polishing section transport mechanism 22 has a first transport unit 24a that transports a substrate to the first polishing unit 20a, a second transport unit 24b that transports the substrate to the second polishing unit 20b, and a transport robot 23 disposed between the first transport unit 24a and the second transport unit 24b, where the transport robot 23 performs the transfer of the substrate between the cleaning section 13, and the first transport unit 24a and the second transport unit 24b while performing the transfer of the substrate between the transport section 14 and the first transport unit 24a and the second transport unit 24b.

As shown in FIG. 32, it is conceivable that the substrate processing apparatus 10 has a configuration in which the first polishing unit 20a has a first polishing apparatus 21a and a second polishing apparatus 21b, the second polishing unit 20b has a third polishing apparatus 21c and a fourth polishing apparatus 21d, and the first polishing apparatus 21a, the second polishing apparatus 21b, the third polishing apparatus 21c, and the fourth polishing apparatus 21d are disposed side by side along the longitudinal direction of the substrate processing apparatus 10. In FIG. 32, reference numerals 21aA, 21bA, 21cA, and 21dA indicate the swing ranges of the top rings of the first to fourth polishing apparatuses 21a to 21d, respectively, and the reference numeral 23A indicates the operation range of the transport robot 23.

As shown in FIG. 32, in such a configuration, the layout of the first polishing apparatus 21a and the second polishing apparatus 21b is mirrored (symmetrically disposed with respect to each other), and the layout of the third polishing apparatus 21c and the fourth polishing apparatus 21d is mirrored, so that it is possible to secure a space for disposing the transport robot 23 in the center of the device, and reduce the size of the device. However, due to the mirroring arrangement, the rotation directions of the polishing tables are opposite between the adjacent polishing apparatuses. Different rotation directions of the polishing table may affect the process.

On the other hand, as shown in FIG. 33, when the layout is such that the rotation directions of the polishing tables of the first to fourth polishing apparatuses 21a to 21d are aligned in the same direction (clockwise CW in the illustrated example), the operation range 23A of the transport robot 23, and the swing range 21bA of the top ring of the polishing apparatus located in the vicinity of the transport robot 23 (the second polishing apparatus 21b in the illustrated example) are, in this figure, partially overlap, so that it is not possible to secure a sufficient space for disposing the transport robot 23 in the center of the device, and in some cases, there is a problem that the size of the device may be increased.

It is desired to provide a substrate processing apparatus capable of changing the rotation direction of the polishing table for each polishing apparatus.

A substrate processing apparatus according to an aspect of the present disclosure includes a polishing section that polishes a substrate, and a transport section that transports a substrate before polishing to the polishing section, wherein the polishing section has a first polishing unit and a second polishing unit, and a polishing section transport mechanism disposed so as to be adjacent to each of the transport section, the first polishing unit, and the second polishing unit, the polishing section transport mechanism has a first transport unit that transports a substrate to the first polishing unit, a second transport unit that transports a substrate to the second polishing unit, and a transport robot disposed between the first transport unit and the second transport unit, the transport robot performing a transfer of a substrate between the transport section, and the first transport unit and the second transport unit, the first polishing unit has a first polishing apparatus and a second polishing apparatus, the second polishing unit has a third polishing apparatus and a fourth polishing apparatus, each of the first polishing apparatus, the second polishing apparatus, the third polishing apparatus and the fourth polishing apparatus has a polishing table to which a polishing pad having a polishing face is mounted, a top ring that polishes a wafer while holding the wafer and pressing the wafer against the polishing pad on the polishing table, and auxiliary units that perform a process on the polishing pad during polishing, and a pair of auxiliary unit mounting units for mounting the respective auxiliary units in a left-right switchable manner with respect to a straight line connecting a swing center of the top ring and a center of rotation of the polishing table is provided at respective positions symmetrical with respect to the straight line around the polishing table.

DESCRIPTION OF EMBODIMENTS

Figure 1:
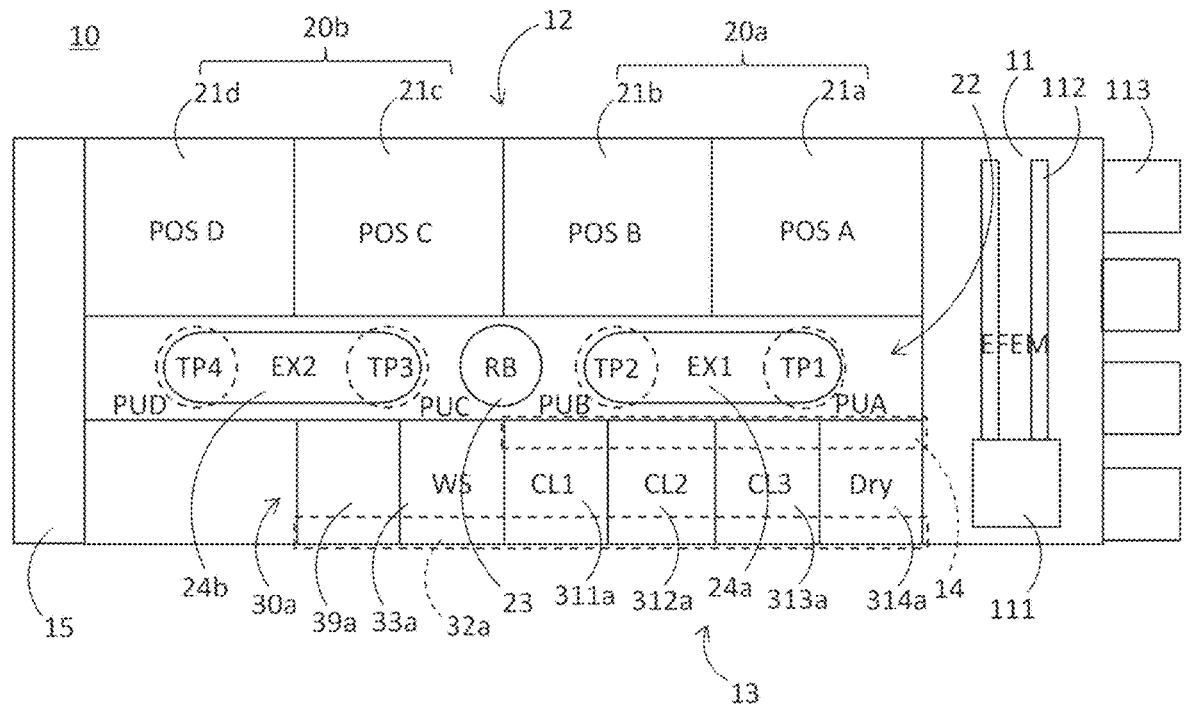
FIG. 1 is a plan view of an overall configuration of a substrate processing apparatus in an embodiment.

A substrate processing apparatus according to a first aspect of the embodiment includes a polishing section that polishes a substrate, and a transport section that transports a substrate before polishing to the polishing section, wherein the polishing section has a first polishing unit and a second polishing unit, and a polishing section transport mechanism disposed so as to be adjacent to each of the transport section, the first polishing unit, and the second polishing unit, the polishing section transport mechanism has a first transport unit that transports a substrate to the first polishing unit, a second transport unit that transports a substrate to the second polishing unit, and a transport robot disposed between the first transport unit and the second transport unit, the transport robot performing a transfer of a substrate between the transport section, and the first transport unit and the second transport unit, the first polishing unit has a first polishing apparatus and a second polishing apparatus, the second polishing unit has a third polishing apparatus and a fourth polishing apparatus, each of the first polishing apparatus, the second polishing apparatus, the third polishing apparatus and the fourth polishing apparatus has a polishing table to which a polishing pad having a polishing face is mounted, a top ring that polishes a wafer while holding the wafer and pressing the wafer against the polishing pad on the polishing table, and auxiliary units that perform a process on the polishing pad during polishing, and a pair of auxiliary unit mounting units for mounting the respective auxiliary units in a left-right switchable manner with respect to a straight line connecting a swing center of the top ring and a center of rotation of the polishing table is provided at respective positions symmetrical with respect to the straight line around the polishing table.

According to such an aspect, in each polishing apparatus, a pair of auxiliary unit mounting units is provided at respective positions symmetrical with respect to the straight line connecting the swing center of the top ring and the center of rotation of the polishing table, so that it is possible to switch, symmetrically with respect to the straight line, the position of the auxiliary unit that performs a process on the polishing pad during polishing according to the rotation direction of the polishing table. Accordingly, the rotation direction of the polishing table can be changed for each polishing apparatus while maintaining the positional relationship of the rotation direction of the polishing pad during polishing and the auxiliary unit with respect to the wafer.

The substrate processing apparatus according to a second aspect of the embodiment is a substrate processing apparatus according to the first aspect, wherein the first polishing apparatus, the second polishing apparatus, the third polishing apparatus and the fourth polishing apparatus are disposed in a line, a distance between a swing center of a top ring of the first polishing apparatus and a swing center of a top ring of the second polishing apparatus is shorter than a distance between a center of rotation of a polishing table of the first polishing apparatus and a center of rotation of a polishing table of the second polishing apparatus, and a distance between a swing center of a top ring of the third polishing apparatus and a swing center of a top ring of the fourth polishing apparatus is shorter than a distance between a center of rotation of a polishing table of the third polishing apparatus and a center of rotation of a polishing table of the fourth polishing apparatus.

According to such an aspect, the interval between the swing range of the top ring of the second polishing apparatus and the swing range of the top ring of the third polishing apparatus is increased, so that it is possible to secure a space for disposing the transport robot in the center of the apparatus, and reduce the size of the device.

The substrate processing apparatus according to a third aspect of the embodiment is the substrate processing apparatus according to the first or second aspect, wherein the auxiliary units are one or more of a polishing liquid supply nozzle that supplies a polishing liquid or dressing liquid to a polishing pad, a dressing device that dresses a polishing face of the polishing pad, an atomizer that atomizes a mixed gas of a liquid and a gas, or a liquid to spray the atomized mixed gas or the atomized liquid onto a polishing face, and a polishing pad temperature control slider that adjust a surface temperature of the polishing pad.

The substrate processing apparatus according to a fourth aspect of the embodiment is the substrate processing apparatus according to any one of the first to third aspects, wherein the auxiliary unit mounting units each include a hole, opened in a base, through which a swing shaft or a column of each of the auxiliary units passes, or a pedestal, provided on the base, to which the swing shaft or the column of each of the auxiliary units is mounted.

The substrate processing apparatus according to a fifth aspect of the embodiment is the substrate processing apparatus according to any one of the first to fourth aspects, wherein unit cleaning mechanisms that clean the respective auxiliary units are provided around the polishing table at respective positions symmetrical with respect to the straight line.

According to such an aspect, even when the position of the auxiliary unit is symmetrically switched according to the rotation direction of the polishing table, the auxiliary unit can be washed under the same condition.

The substrate processing apparatus according to a sixth aspect of the embodiment is the substrate processing apparatus according to any one of the first to fifth aspects, wherein with respect to the polishing table, first end point detection sensor mounting holes each for mounting a first end point detection sensor are formed at a position away from a center of rotation of the polishing table by a first distance, and second end point detection sensor mounting holes each for mounting a second end point detection sensor are formed at a position away from the center of rotation of the polishing table by a second distance different from the first distance, and the first end point detection sensor mounting holes are formed one by one at respective positions symmetrical with respect to one reference line, on the polishing table, that passes through a center of rotation defined on the polishing table, and the second end point detection sensor mounting holes are formed one by one respective positions symmetrical with respect to the one reference line on the polishing table.

The substrate processing apparatus according to a seventh aspect of the embodiment is the substrate processing apparatus according to any one of the first to fifth aspects, wherein with respect to the polishing table, first end point detection sensor mounting holes each for mounting a first end point detection sensor are formed at a position away from a center of rotation of the polishing table by a first distance, and a second end point detection sensor mounting hole for mounting a second end point detection sensor is formed at a position away from the center of rotation of the polishing table by a second distance different from the first distance, and the first end point detection sensor mounting holes are formed one by one at respective positions symmetrical with respect to one reference line, on the polishing table, that passes through a center of rotation defined on the polishing table, and the second end point detection sensor mounting hole is formed on the one reference line on the polishing table.

The substrate processing apparatus according to an eighth aspect of the embodiment is the substrate processing apparatus according to the sixth or seventh aspect, wherein each of the first end point detection sensor and the second end point detection sensor is an optical end point detection sensor or an eddy current end point detection sensor.

Hereinafter, specific examples of the embodiments will be described with reference to the drawings. In the following description and the drawings used in the following description, the same reference numerals are used for parts that can be constituted in the same manner, and redundant explanations are omitted.

Figure 2:
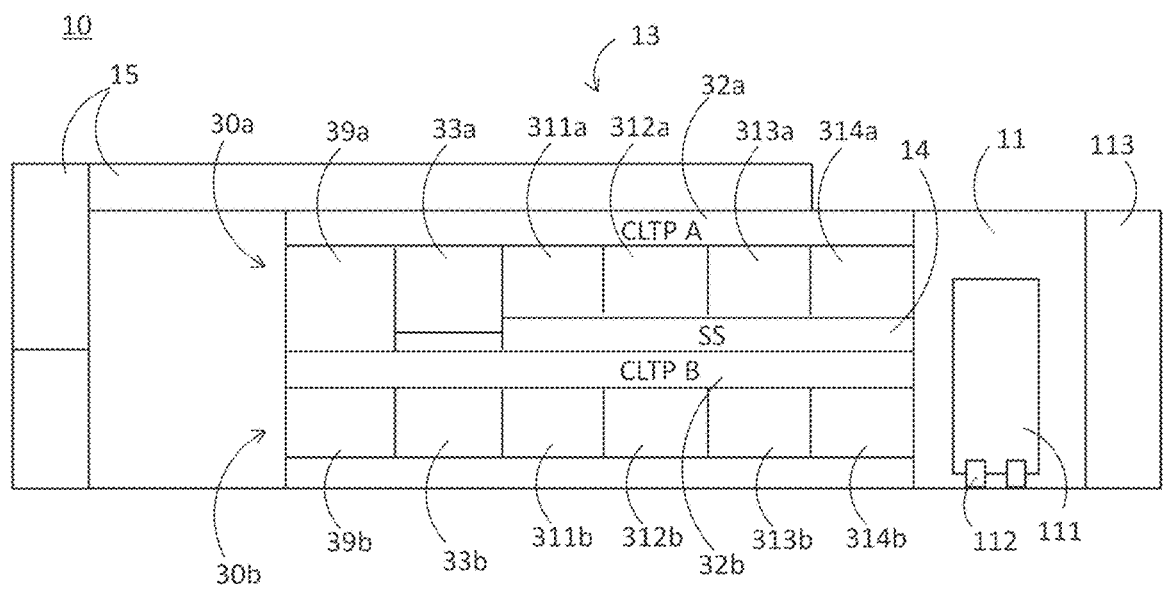
FIG. 2 is a side view of the substrate processing apparatus shown in FIG. 1 as viewed from a cleaning section.

FIG. 1 is a plan view of the overall configuration of a substrate processing apparatus according to an embodiment, and FIG. 2 is a side view of the polishing apparatus shown in FIG. 1 as seen from the cleaning section. As shown in FIGS. 1 and 2, a substrate processing apparatus 10 according to the present embodiment includes a substantially rectangular housing in plan view, and the interior of the housing is partitioned by a partition wall into a load/unload unit 11, a polishing section 12, a cleaning section 13, and a transport section 14. The load/unload unit 11, the polishing section 12, the cleaning section 13, and the transport section 14 are independently assembled and independently evacuated. Further, the substrate processing apparatus 10 includes a control unit 15 (also referred to as a control panel) that controls the operations of the load/unload unit 11, the polishing section 12, the cleaning section 13, and the transport section 14.

<Load/Unload Unit>

The load/unload unit 11 includes a plurality of (four in the illustrated example) front loading units 113 that places a wafer cassette for stocking a large number of wafers (substrates) W. These front loading units 113 are disposed adjacent to each other in the width direction (the direction orthogonal to the longitudinal direction) of the substrate processing apparatus 10. An open cassette, a standard manufacturing interface (SMIF) pod, or a front opening unified pod (FOUP) can be mounted on the front loading unit 113. Here, the SMIF and the FOUP are airtight containers that can accommodate wafer cassettes inside and that can hold an environment independent of the external space by covering the wafer cassettes with partition walls.

In addition, a traveling mechanism 112 is installed along the arrangement direction of the front loading units 113 in the load/unload unit 11, and a transport robot 111 is installed on the traveling mechanism 112 so as to be movable along the arrangement direction of the front loading unit 113. The transport robot 111 can access the wafer cassette mounted on the front loading unit 113 by moving on the traveling mechanism 112. The transport robot 111 has two hands on the upper and lower sides. For example, the upper hand is used when returning a wafer W to the wafer cassette, and the lower hand is used when transporting the wafer W before polishing. Thus, the upper and lower hands can be used selectively.

Instead of this, the wafer W may be transported by only a single hand.

Since the load/unload unit 11 is a region where it is necessary to maintain the cleanest state, the inside of the load/unload unit 11 is maintained at any time at a pressure higher than the pressure of any of the outside of the apparatus, the polishing section 12, the cleaning section 13, and the transport section 14. In addition, a filter fan unit (not shown) having a clean air filter such as a HEPA filter or an ULPA filter is provided above the traveling mechanism 112 of the transport robot 111. This filter fan unit constantly blows downward clean air from which particles, a toxic steam and a gas have been removed.

<Transport Section>

The transport section 14 represents a region where the wafer before polishing is transferred from the load/unload unit 11 to the polishing section 12, and is provided so as to extend along the longitudinal direction of the substrate processing apparatus 10. As shown in FIG. 1, the transport section 14 is disposed adjacent to both the load/unload unit 11, which is the cleanest region, and the polishing section 12, which is the dirtiest region. Therefore, in order to prevent the particles in the polishing section 12 from diffusing into the load/unload unit 11 through the transport section 14, as described later, a current of air flowing from the load/unload unit 11 side to the polishing section 12 side is formed inside of the transport section 14.

Figure 3:
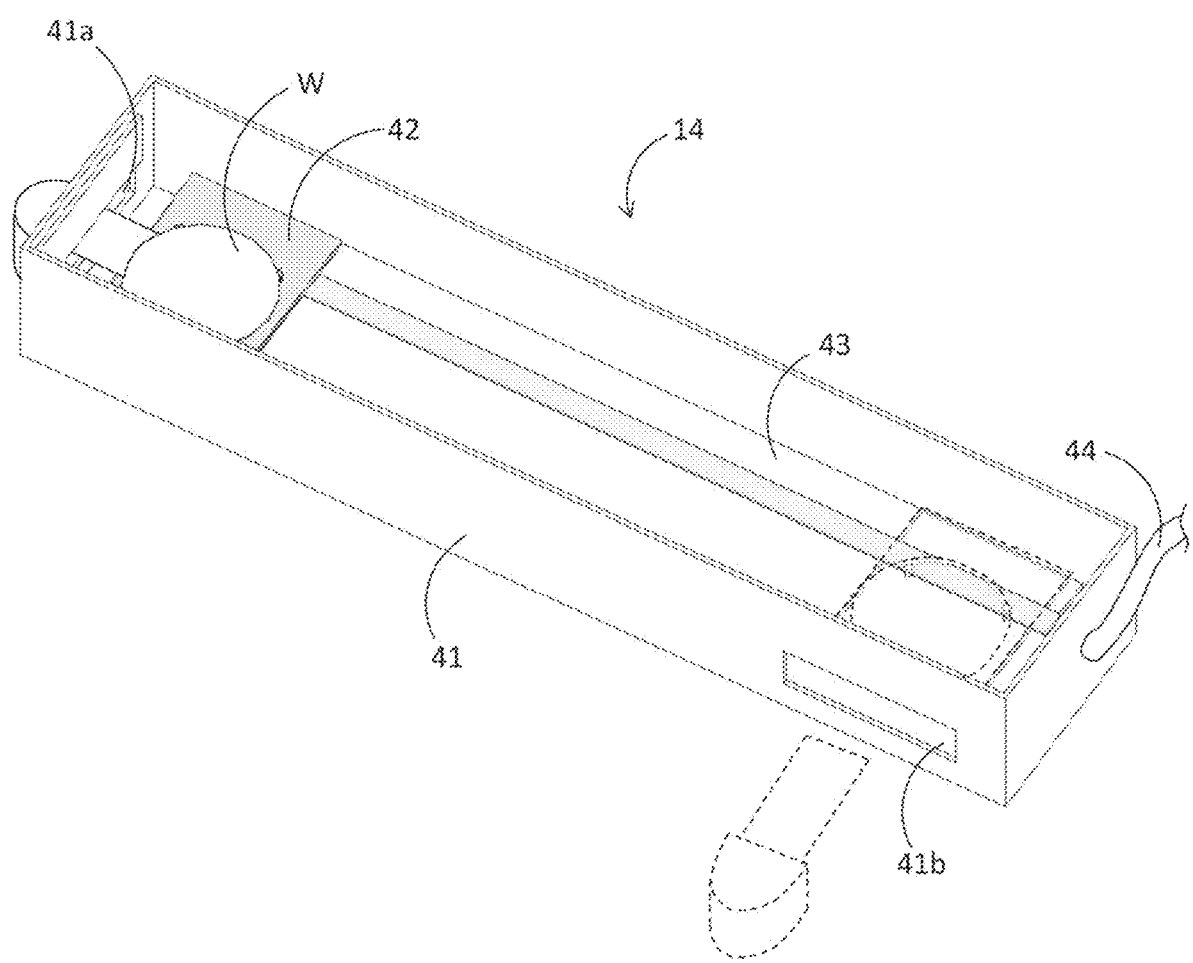
FIG. 3 is an exploded perspective view of a transport section of the substrate processing apparatus shown in FIG. 1.

The structure of the transport section 14 will be described in detail. FIG. 3 is an exploded perspective view showing an internal configuration of the transport section 14. As shown in FIG. 3, the transport section 14 has a cover 41 extending in the longitudinal direction, a slide stage 42 disposed inside the cover 41 and holding the wafer W, a stage movement mechanism 43 that linearly moves the slide stage 42 along the longitudinal direction, and an exhaust duct 44 that exhausts the inside of the cover 41.

The cover 41 has a bottom plate, four side plates, and a top plate (not shown in FIG. 3). A carry-in port 41*a* communicating with the load/unload unit 11 is formed on the one side plate in the longitudinal direction. Further, a carry-out port 41*b* communicating with the polishing section 12 is formed at an end, of the one side plate in the width direction, opposite to the carry-in port 41*a*. The carry-in port 41*a* and the carry-out port 41*b* can be opened and closed by a shutter (not shown). The transport robot 111 of the load/unload unit 11 is accessible to the slide stage 42 inside the cover 41 from the carry-in port 41*a*, and the transport robot 23 of the polishing section 12 is accessible to the slide stage 42 inside the cover 41 from the carry-out port 41*b*.

For example, a motor drive mechanism including a ball screw or an air cylinder is used as the stage movement mechanism 43. The use of a rodless cylinder as the stage movement mechanism 43 is preferable because dust from the sliding portion can be prevented. The slide stage 42 is fixed to a movable portion of the stage movement mechanism 43, and is linearly moved along the longitudinal direction inside the cover 41 by the power given from the stage movement mechanism 43.

Four pins are provided so as to protrude upward on the outer peripheral part of the slide stage 42. The wafer W placed on the slide stage 42 by the transport robot 111 of the load/unload unit 11 is supported on the slide stage 42 in a state where the outer peripheral edge of the wafer W is guided and positioned by four pins. These pins are made of resin such as polypropylene (PP), polychlorotrifluoroethylene (PCTFE) or polyetheretherketone (PEEK).

The exhaust duct 44 is provided on the other side plate of the cover 41 in the longitudinal direction (the side plate opposite to the carry-in port 41*a*). The exhaust is performed by the exhaust duct 44 in a state where the carry-in port 41*a* is opened, so that an airflow flowing from the carry-in port 41*a* to the carry-out port 41*b* is formed inside the cover 41. This prevents particles in the polishing section 12 from passing through the transport section 14 and diffusing into the load/unload unit 11.

<Polishing Section>

As shown in FIG. 1, the polishing section 12 is a region where the wafer W is polished, and has a first polishing unit 20*a* having a first polishing apparatus 21*a* and a second polishing apparatus 21*b*, a second polishing unit 20*b* having a third polishing apparatus 21*c* and a fourth polishing apparatus 21*d*, and a polishing section transport mechanism 22 disposed so as to be adjacent to the transport section 14, the first polishing unit 20*a*, and the second polishing unit 20*b*. The polishing section transport mechanism 22 is disposed between the cleaning section 13 and each of the first polishing unit 20*a* and the second polishing unit 20*b* in the width direction of the substrate processing apparatus 10.

The first polishing apparatus 21*a*, the second polishing apparatus 21*b*, the third polishing apparatus 21*c*, and the fourth polishing apparatus 21*d* are disposed along the longitudinal direction of the substrate processing apparatus 10. The second polishing apparatus 21*b*, the third polishing apparatus 21*c*, and the fourth polishing apparatus 21*d* have the same configuration as the first polishing apparatus 21*a*, and therefore the first polishing apparatus 21*a* will be described below.

Figure 4A:
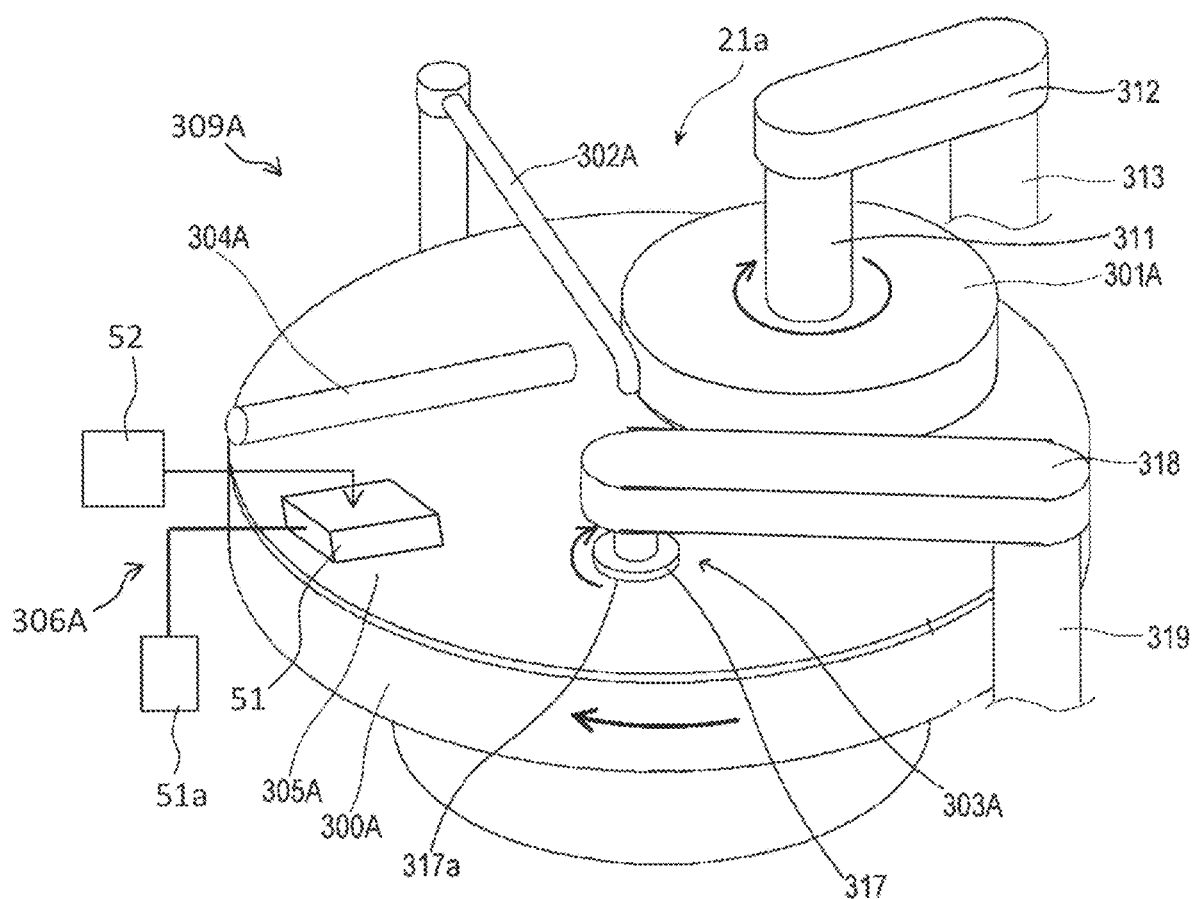
FIG. 4A is a perspective view schematically showing a first polishing apparatus of the substrate processing apparatus shown in FIG. 1.
Figure 4B:
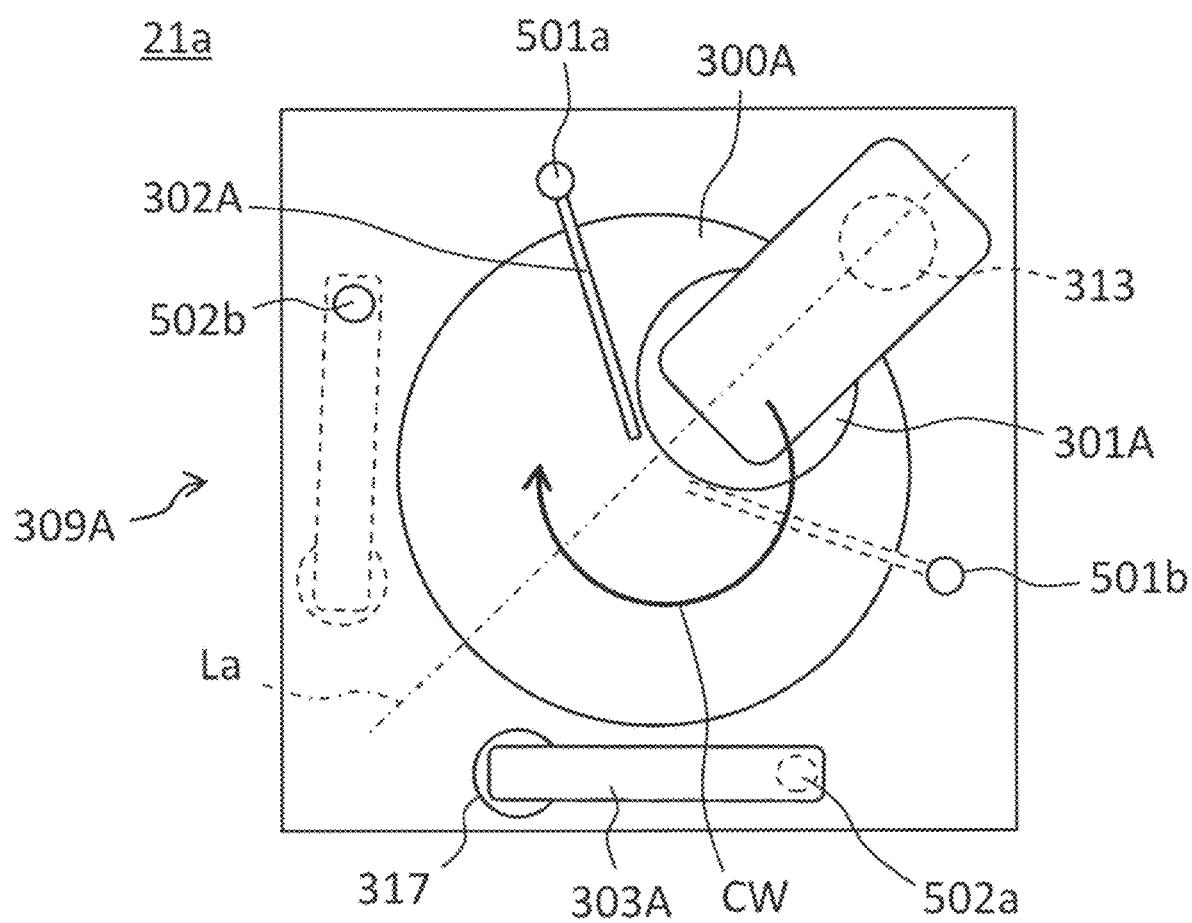
FIG. 4B is a plan view schematically showing the first polishing apparatus of the substrate processing apparatus shown in FIG. 1.

FIG. 4A is a perspective view schematically showing the overall configuration of the first polishing apparatus 21*a*. FIG. 4B is a plan view schematically showing the overall configuration of the first polishing apparatus 21*a*. In FIG. 4B, an atomizer 304A and a polishing pad temperature control slider 51, which will be described later, are not shown.

As shown in FIGS. 4A and 4B, the first polishing apparatus 21*a* has a polishing table 300A to which a polishing pad 305A having a polishing face is mounted, a top ring 301A that holds a semiconductor wafer that is an object to be polished and that presses the semiconductor wafer against the polishing pad 305A on the polishing table 300A, and an auxiliary unit 309A that performs a process on the polishing pad 305A during polishing.

Of these, the auxiliary unit 309A is any one or more of a polishing liquid supply nozzle 302A that supplies a polishing liquid or a dressing liquid to the polishing pad 305A, a dresser 303A that dresses the polishing face of the polishing pad 305A, the atomizer 304A that atomizes a mixed gas of a liquid and a gas or a liquid and sprays the mixed gas or the liquid on the polishing face, and a polishing pad temperature control slider 306A that adjusts the surface temperature of the polishing pad 305A.

Here, the configuration where one nozzle, one dresser, one atomizer, and one slider are provided around the polishing table 300A is described, but a plurality of nozzles, dressers, atomizers, and sliders may be provided. Alternatively, the shaft may be branched into a plurality of parts.

Further, when there is equipment such as a pure water supply nozzle (not shown) for the polishing pad, which is added as necessary, these are also included.

The polishing table 300A is connected via a table shaft to a polishing table rotation motor (not shown) disposed below the table, and is rotatable around the table shaft. The polishing pad 305A is attached to the upper face of the polishing table 300A, and the surface of the polishing pad 305A constitutes a polishing face on which a semiconductor wafer is polished. As the polishing pad 305A, a commercially available product such as a nonwoven fabric or urethane foam may be used.

The polishing liquid supply nozzle 302A is installed above the polishing table 300A, and the polishing liquid supply nozzle 302A supplies the polishing liquid (slurry) to the polishing pad 305A on the polishing table 300A.

The top ring 301A is connected to a shaft 311, and the shaft 311 vertically moves with respect to a support arm 312. By vertically moving the shaft 311, the entire top ring 301A is vertically moved with respect to the support arm 312 and positioned. The shaft 311 is adapted to rotate by driving the top ring rotation motor (not shown). The rotation of the shaft 311 causes the top ring 301A to rotate around the shaft 311. Basically, the rotation direction of the top ring 301A is the same as the rotation direction of the polishing table 300A.

The top ring 301A can hold a semiconductor wafer on its lower face. The support arm 312 is configured to be pivotable around a shaft 313, and pivots the top ring 301A to a wafer transfer position TP1 (see FIG. 1) to vacuum-suck the semiconductor wafer transported to the wafer transfer position TP1. Then, the top ring 301A holding the semiconductor wafer on the lower face can be moved above the polishing table 300A from the wafer transfer position TP1 by the pivot of the support arm 312.

In a state where when viewed from above, the center of the semiconductor wafer held on the lower face of the top ring 301A is positioned on a straight line La (see FIG. 4B) connecting the swing center of the top ring 301A and the center of rotation of the polishing table 300A, the top ring 301A presses the semiconductor wafer held on the lower face against the surface of the polishing pad 305A. At this time, the polishing table 300A and the top ring 301A are respectively rotated to supply the polishing liquid (slurry) onto the polishing pad 305A from the polishing liquid supply nozzle 302A provided above the polishing table 300A. As the polishing liquid, a polishing liquid containing silica ($SiO_2$) or ceria ($CeO_2$) as abrasive grains is used. The polishing step by the first polishing unit 20a is performed as follows. While supplying the polishing liquid onto the polishing pad 305A, the semiconductor wafer is pressed against the polishing pad 305A by the top ring 301A to relatively move the semiconductor wafer and the polishing pad 305A to polish the insulating film, the metal film, etc. on the semiconductor wafer.

As shown in FIG. 4A, a dressing device 303A includes a dresser arm 318 and a dresser 317 rotatably mounted to the tip of the dresser arm 318. The lower part of the dresser 317 is composed of a dressing member 317a, and the dressing member 317a has a circular dressing face, and hard particles are fixed to the dressing face by electrodeposition or the like. Examples of the hard particles include diamond particles and ceramic particles. A motor (not shown) is built in the dresser arm 318, and the dresser 317 is rotated by this motor. The dresser arm 318 is supported by a shaft 319.

The dressing step of the surface (polishing face) of the polishing pad 305A is performed as follows. While rotating the polishing table 300A, the motor rotates the dresser 317, and then the elevating mechanism lowers the dresser 317, and the dressing member 317a on the lower face of the dresser 317 is brought into sliding contact with the polishing face of the rotating polishing pad 305A. In this state, by swinging (swinging) the dresser arm 318, the dresser 317 located at the tip of the dresser arm 318 can move from the outer peripheral end of the polishing face of the polishing pad 305A to the center. By this swinging operation, the dressing member 317a can dress the polishing face of the polishing pad 305A over the entire face including the center thereof.

As shown in FIG. 4A, the atomizer 304A is a unit that atomizes a mixed fluid of a liquid (for example, pure water) and a gas (for example, nitrogen) or a liquid (for example, pure water) and sprays the mixed fluid or the liquid from one or more nozzles onto the polishing pad 305A. The atomizer 304A is disposed above the polishing pad 305A, and is disposed so as to extend in the substantially radial direction of the polishing pad 305A in parallel with the surface (polishing face) of the polishing pad 305A.

The cleaning step (polishing pad cleaning) of the polishing pad 305A by the atomizer 304A shown in FIG. 4A is performed as follows. While rotating the polishing table 300A, a mixed fluid of a liquid and a gas or a liquid is sprayed onto the polishing pad 305A from one or a plurality of nozzles to remove foreign matters (aggregated abrasive grains, polishing debris, etc.) on the polishing pad.

As shown in FIG. 4A, the polishing pad temperature control slider 306A has a pad contact member 51 that contacts the surface of the polishing pad 305A, and a liquid supply system 52 that supplies a temperature-adjusted liquid to the pad contact member 51. Inside the pad contact member 51, a liquid flow path through which the liquid supplied from the liquid supply system 52 passes is formed.

The pad contact member 51 is connected to a movement mechanism 51a. The movement mechanism 51a moves the pad contact member 51, and has a slide mechanism that slides the pad contact member 51, an elevating mechanism that elevates the pad contact member 51, and the like. The pad contact member 51 slides on a polishing pad 22 by the movement mechanism 51a. The surface temperature of the polishing pad 305A is adjusted by transmitting the amount of heat of the liquid passing through the pad contact member 51 to the polishing pad 305A via the surface of the pad contact member 51.

As shown in FIG. 4B, around the polishing table 300A when viewed from above, pairs of auxiliary unit mounting units 501a, 501b and 502a, 502b for mounting the auxiliary unit 309A in a left-right switchable manner with respect to the straight line La connecting the swing center of the top ring 301A (that is, the center of a swing shaft 313) and the center of rotation of the polishing table 300A are provided at positions symmetrical with respect to the straight line La (that is, positions that are mirror image symmetrical with the straight line La as an axis of symmetry).

In the illustrated example, a pair of polishing liquid supply nozzle mounting units 501a and 501b for mounting the polishing liquid supply nozzle 302A symmetrically with respect to the straight line La when viewed from above is provided at respective positions symmetrical with respect to the straight line La. Further, a pair of dressing device mounting units 502a and 502b for mounting the dressing device 303a symmetrically with respect to the straight line La when viewed from above is provided at respective positions symmetrical with respect to the straight line La.

As shown in FIG. 4B, when the polishing table 300A rotates clockwise CW when viewed from above, the polishing liquid supply nozzle 302A is required to supply the polishing liquid upstream of the wafer in the rotational direction held by the top ring 301A, so that the polishing liquid supply nozzle 302A is mounted to a first polishing liquid supply nozzle mounting unit 501a. Further, since the dressing device 303a is required to perform dressing downstream of the wafer in the rotational direction held by the top ring 301A, the dressing device 303a is mounted to a first dressing device mounting unit 502a.

Figure 4C:
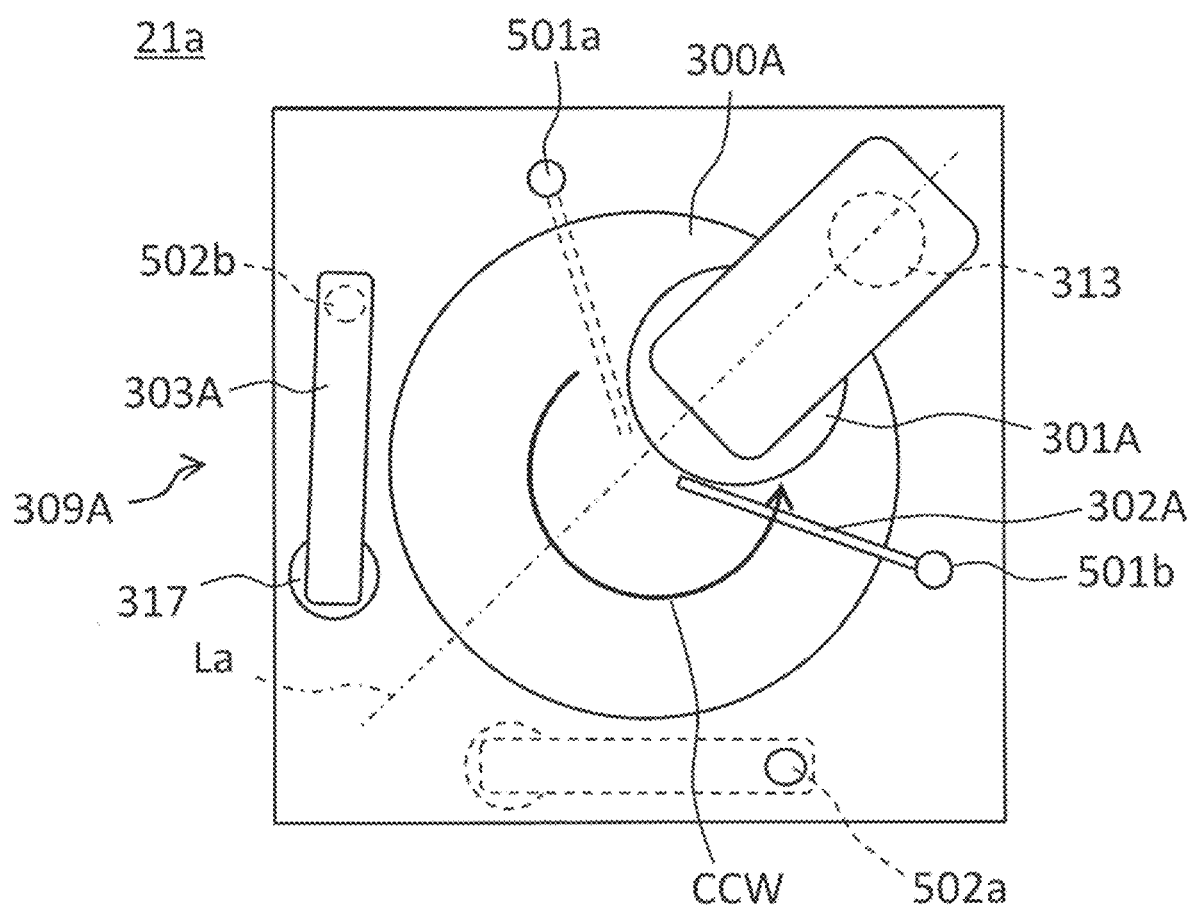
FIG. 4C is a plan view schematically showing the first polishing apparatus of the substrate processing apparatus shown in FIG. 1.

On the other hand, as shown in FIG. 4C, when the polishing table 300A rotates counterclockwise CCW when viewed from above, the polishing liquid supply nozzle 302A is required to supply the polishing liquid upstream of the wafer in the rotational direction held by the top ring 301A, so that the polishing liquid supply nozzle 302A is mounted to a second polishing liquid supply nozzle mounting unit 501b. Further, since the dressing device 303A is required to perform dressing downstream of the wafer in the rotational direction held by the top ring 301A, the dressing device 303a is mounted to a second dressing device mounting unit 502b.

Similarly, a pair of atomizer mounting units (not shown) for mounting the atomizer 304A symmetrically with respect to the straight line La when viewed from above may be provided at respective positions symmetrical with respect to the straight line La. Also, a pair of polishing pad temperature control slider mounting units (not shown) for mounting the polishing pad temperature control slider 306A symmetrically with respect to the straight line La when viewed from above may be provided at respective positions symmetrical with respect to the straight line La. Of these, the auxiliary unit 309A is any one or more of a polishing liquid supply nozzle 302A that supplies a polishing liquid or a dressing liquid to the polishing pad 305A, a dresser 303A that dresses the polishing face of the polishing pad 305A, the atomizer 304A that atomizes a mixed gas of a liquid and a gas or a liquid and sprays the mixed gas or the liquid on the polishing face, and a polishing pad temperature control slider 306A that adjusts the surface temperature of the polishing pad 305A. Furthermore, when there are devices such as a pure water supply nozzle (not shown) to the polishing pad, which are added as necessary, they may be provided at positions symmetrical with respect to the straight line La when viewed from above.

As a modification, the pair of auxiliary unit mounting units 501a and 501b may be used for mounting the different types of auxiliary units 309A (for example, the polishing liquid supply nozzle 302A and the atomizer 304A) by switching them between left and right (changing the positions between left and right). Specifically, for example, as shown in FIG. 4B, when the polishing table 300A rotates clockwise CW when viewed from above, the polishing liquid supply nozzle 302A may be mounted to the first auxiliary unit mounting unit 501a, and the atomizer 304A may be mounted to the second auxiliary unit mounting unit 501b. As shown in FIG. 4C, when the polishing table 300A rotates counterclockwise CCW when viewed from above, the polishing liquid supply nozzle 302A may be mounted to the second auxiliary unit mounting unit 501b, and the atomizer 304A may be mounted to the first auxiliary unit mounting unit 501a. In this case, the number of auxiliary unit mounting units 501a and 501b can be reduced, and the mechanism can be simplified.

In the illustrated example, each of the auxiliary unit mounting units 501a, 501b and 502a, 502b is hole, formed in a base (not shown), through which the swing shaft or column of the auxiliary unit 509A passes, but the present invention is not limited to this. For example, it may be a pedestal, a jig, a groove, a protrusion, a wall or the like, provided on the base, to which the swing shaft or the column of the auxiliary unit 309A is mounted. In addition, referring to FIG. 4B, to improve appearance and maintainability, when one of the auxiliary unit mounting units (auxiliary unit mounting units with the reference numerals 501a and 502a in the illustrated example) is engaged with the swing shaft or column of the auxiliary unit 509A, the other of the auxiliary unit mounting units (auxiliary unit mounting units with the reference numerals 501b and 502b in the illustrated example) may be covered with a removable cover (not shown) to be blindfolded.

A unit cleaning mechanism (not shown) that cleans the auxiliary unit 309A may be provided around the polishing table 300A when viewed from above at positions symmetrical with respect to the straight line La. This makes it possible to clean the auxiliary unit 309A under the same conditions even when the arrangement of the auxiliary unit 309A is switched symmetrically according to the rotation direction of the polishing table 300A.

Also, around the polishing table 300A when viewed from above, the maintenance space used during maintenance of the auxiliary unit 309A may be provided symmetrically with respect to the straight line La, and the jig mounting space for mounting the jig of the auxiliary unit 309A may be provided symmetrically with respect to the straight line La. In addition, pipes or wiring (not shown) connected to the auxiliary unit 309A may be provided around the polishing table 300A when viewed from above at positions symmetrical with respect to the straight line La.

Figure 37:
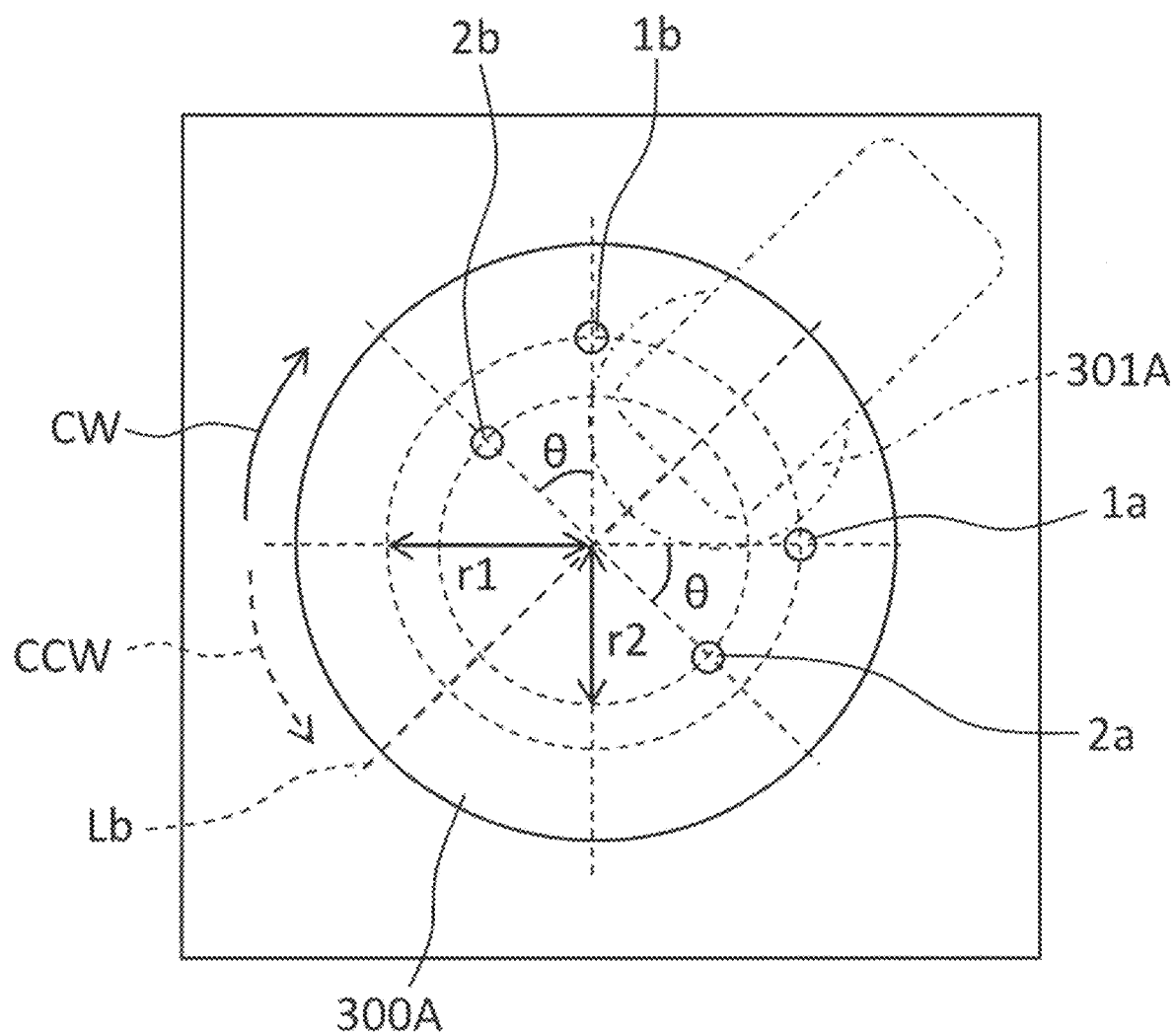
FIG. 37 is a diagram for explaining the arrangement of an end point detection sensor mounting hole according to the present embodiment.

As shown in FIG. 37, with respect to the polishing table 300A when viewed from above, first end point detection sensor mounting holes 1a and 1b for mounting the respective first end point detection sensors (not shown) may be formed at positions away from the center of rotation of the polishing table 300A by a first distance r1, and second end point detection sensor mounting holes 2a and 2b for mounting the respective second end point detection sensors (not shown) may be formed at positions away from the center of rotation of the polishing table 300A by a second distance r2 different from the first distance r1. Each of the first end point detection sensor and the second end point detection sensor may be an optical end point detection sensor or an eddy current end point detection sensor.

As an example, as shown in FIG. 37, when viewed from above, the first end point detection sensor mounting holes 1a and 1b are formed one by one at respective positions symmetrical with respect to one straight line Lb passing through the center of rotation set on the polishing table 300A (hereinafter, referred to as a reference line on the polishing table), and the second end point detection sensor mounting holes 2a and 2b may be formed one by one at respective positions symmetrical with respect to the polishing table reference line Lb. As a result, the mounting positions of the first end point detection sensors (not shown) when viewed from above can be switched symmetrically with respect to the polishing table reference line Lb, and the mounting positions of the second end point detection sensors (not shown) can be switched symmetrically with respect to the polishing table reference line Lb.

For example, referring to FIG. 37, when the polishing table 300A rotates counterclockwise CCW when viewed from above, the first end point detection sensor (not shown) is mounted to the one first end point detection sensor mounting hole 1a, and the second end point detection sensor (not shown) is mounted to the one second end point detection sensor mounting holes 2a. As a result, when the polishing table 300A rotates counterclockwise CCW, the second end point detection sensor mounted in the second end point detection sensor mounting hole 2a passes through a position facing the wafer held by the top ring 301A at timing which is delayed by the angle θ with respect to the first end point detection sensor mounted in the first end point detection sensor mounting hole 1a.

On the other hand, referring to FIG. 37, when the polishing table 300A rotates clockwise CW when viewed from above, the first end point detection sensor (not shown) is mounted to the other first end point detection sensor mounting hole 1b, and the second end point detection sensor (not shown) is mounted to the other second end point detection sensor mounting hole 2b. As a result, when the polishing table 300A rotates clockwise CW, the second end point detection sensor mounted in the second end point detection sensor mounting hole 2b passes through a position facing the wafer held by the top ring 301A at timing which is delayed by the angle θ with respect to the first end point detection sensor mounted in the first end point detection sensor mounting hole 1b.

That is, by switching the mounting positions of the first end point detection sensor and the second end point detection sensor symmetrically with respect to the reference line Lb on the polishing table according to the rotation direction of the polishing table 300A, it is possible to pass the first end point detection sensor and the second end point detection sensor through the position facing the wafer held by the top ring 301A when the polishing table 300A rotates clockwise CW in the order and at the timing same as those when rotating counterclockwise CCW. As a result, it is possible to prevent the end point detection accuracy from varying between when the polishing table 300A rotates clockwise CW and when it rotates counterclockwise CCW.

Figure 38:
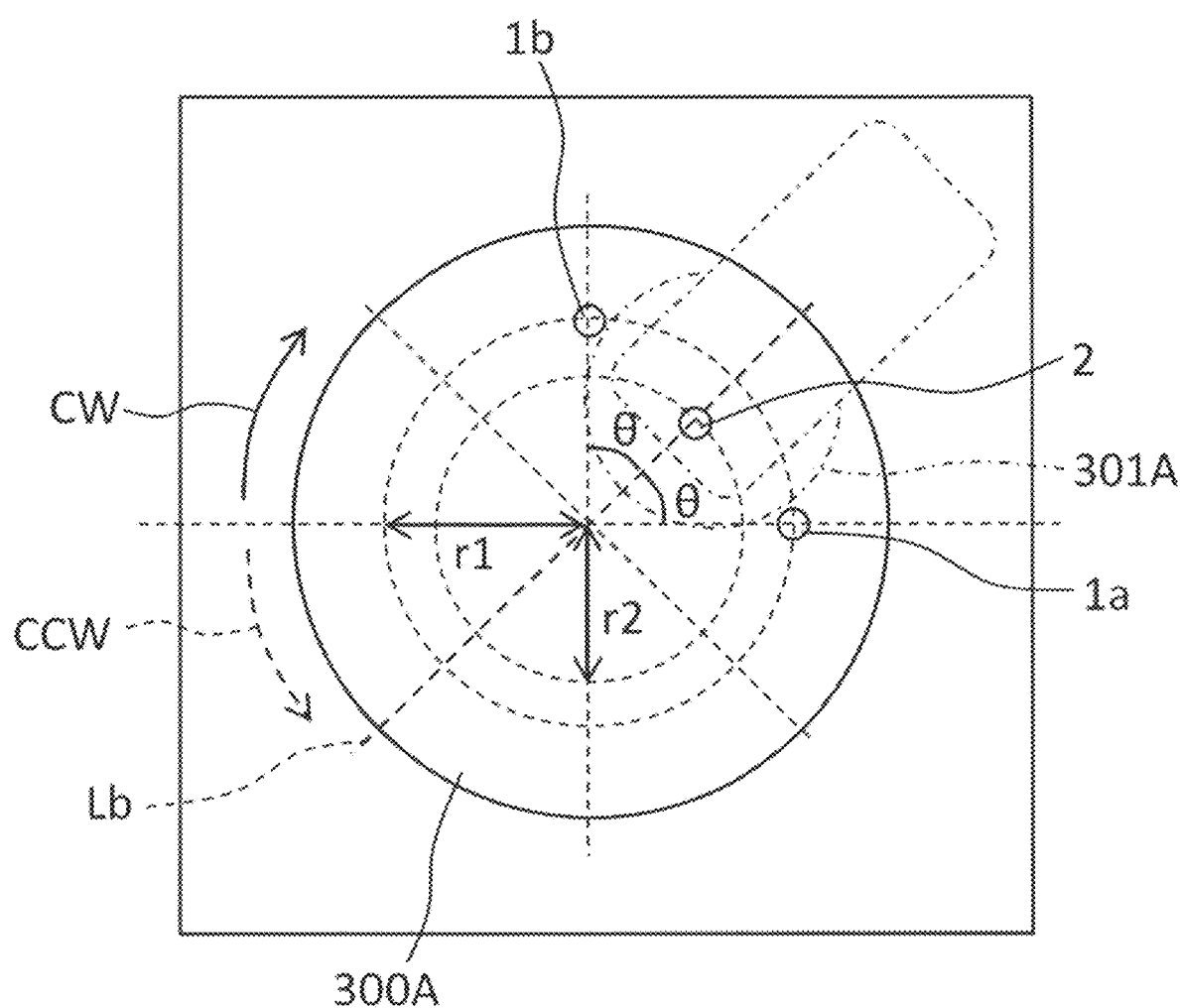
FIG. 38 is a diagram for explaining the arrangement of an end point detection sensor mounting hole according to a modification of the present embodiment.

As a modification, as shown in FIG. 38, only one second end point detection sensor mounting hole 2 may be formed on the reference line Lb on the polishing table. The second end point detection sensor (not shown) may be non-detachably mounted to this single second end point detection sensor mounting hole 2.

For example, referring to FIG. 38, when the polishing table 300A rotates counterclockwise CCW when viewed from above, the first end point detection sensor (not shown) is mounted to the one first end point detection sensor mounting hole 1a. As a result, when the polishing table 300A rotates counterclockwise CCW, the first end point detection sensor mounted to the first end point detection sensor mounting hole 1a passes through a position facing the wafer held by the top ring 301A at timing which is delayed by the angle θ with respect to the second end point detection sensor mounted to the second end point detection sensor mounting hole 2.

On the other hand, referring to FIG. 38, when polishing table 300A rotates clockwise CW when viewed from above, the first end point detection sensor (not shown) is mounted to the other first end point detection sensor mounting hole 1b. As a result, when the polishing table 300A rotates clockwise CW, the first end point detection sensor mounted in the first end point detection sensor mounting hole 1b passes through a position facing the wafer held by the top ring 301A at timing which is delayed by an angle θ with respect to the second end point detection sensor mounted in the second end point detection sensor mounting hole 2.

That is, by switching the mounting position of the first end point detection sensor symmetrically with respect to the reference line Lb on the polishing table according to the rotation direction of the polishing table 300A, it is possible to pass the first end point detection sensor and the second end point detection sensor through the position facing the wafer held by the top ring 301A when the polishing table 300A rotates clockwise CW in the order and at the timing same as those when rotating counterclockwise CCW. As a result, it is possible to prevent the end point detection accuracy from varying between when the polishing table 300A rotates clockwise CW and when it rotates counterclockwise CCW. Further, as compared with the embodiment shown in FIG. 37, the number of second end point detection sensor mounting holes can be reduced, resulting in cost reduction and process risk reduction.

Figure 34:
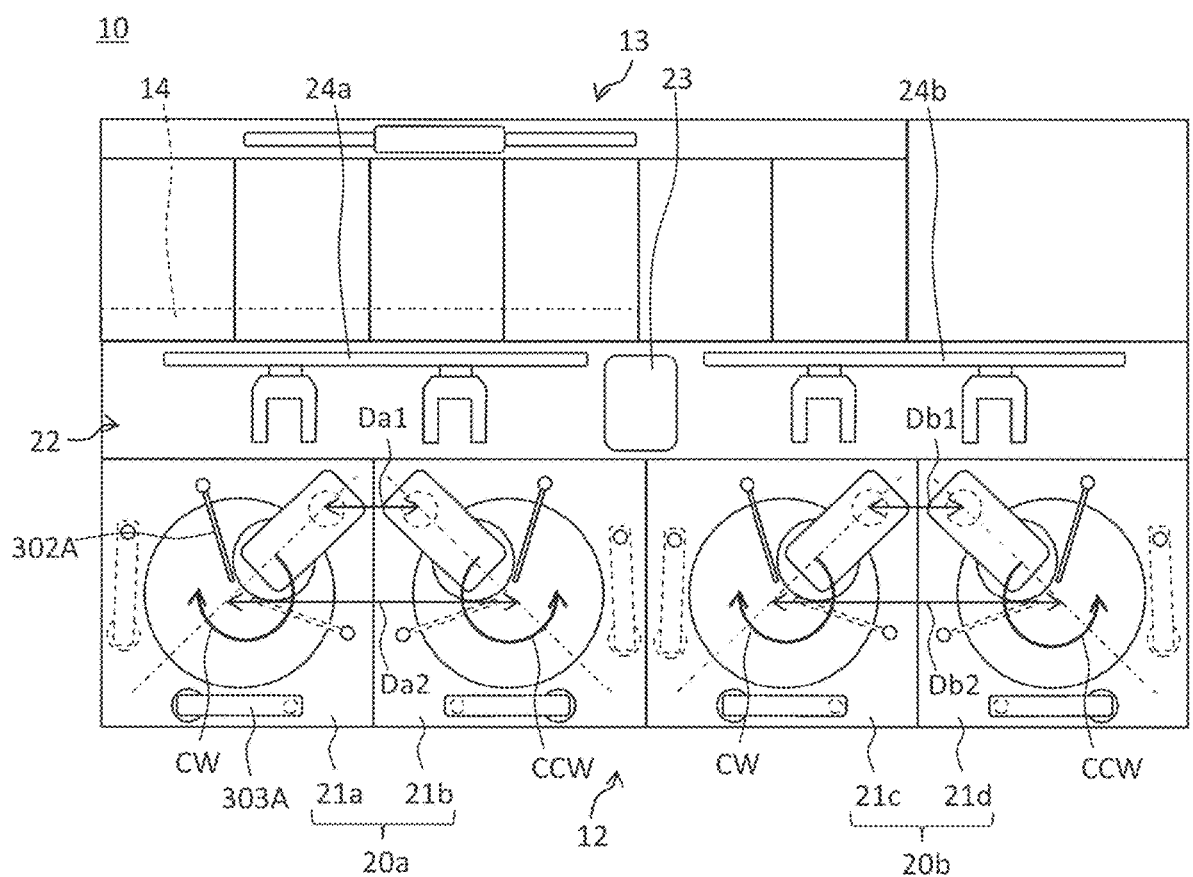
FIG. 34 is a diagram for explaining a configuration of a polishing section according to the present embodiment.

As shown in FIG. 34, in the polishing section 12 according to the present embodiment, the first polishing apparatus 21a, the second polishing apparatus 21b, the third polishing apparatus 21c and the fourth polishing apparatus 21d are disposed in a line in this order in the longitudinal direction of the substrate processing apparatus 10.

As shown in FIG. 34, a distance Da1 between the swing center of the top ring of the first polishing apparatus 21a and the swing center of the top ring of the second polishing apparatus 21b is shorter than a distance Da2 between the center of rotation of the polishing table of the first polishing apparatus 21a and the center of rotation of the polishing table of the second polishing apparatus 21b. Similarly, a distance Db1 between the swing center of the top ring of the third polishing apparatus 21c and the swing center of the top ring of the fourth polishing apparatus 21d is shorter than a distance Db2 between the center of rotation of the polishing table of the third polishing apparatus 21c and the center of rotation of the polishing table of the fourth polishing apparatus 21d.

Figure 33:
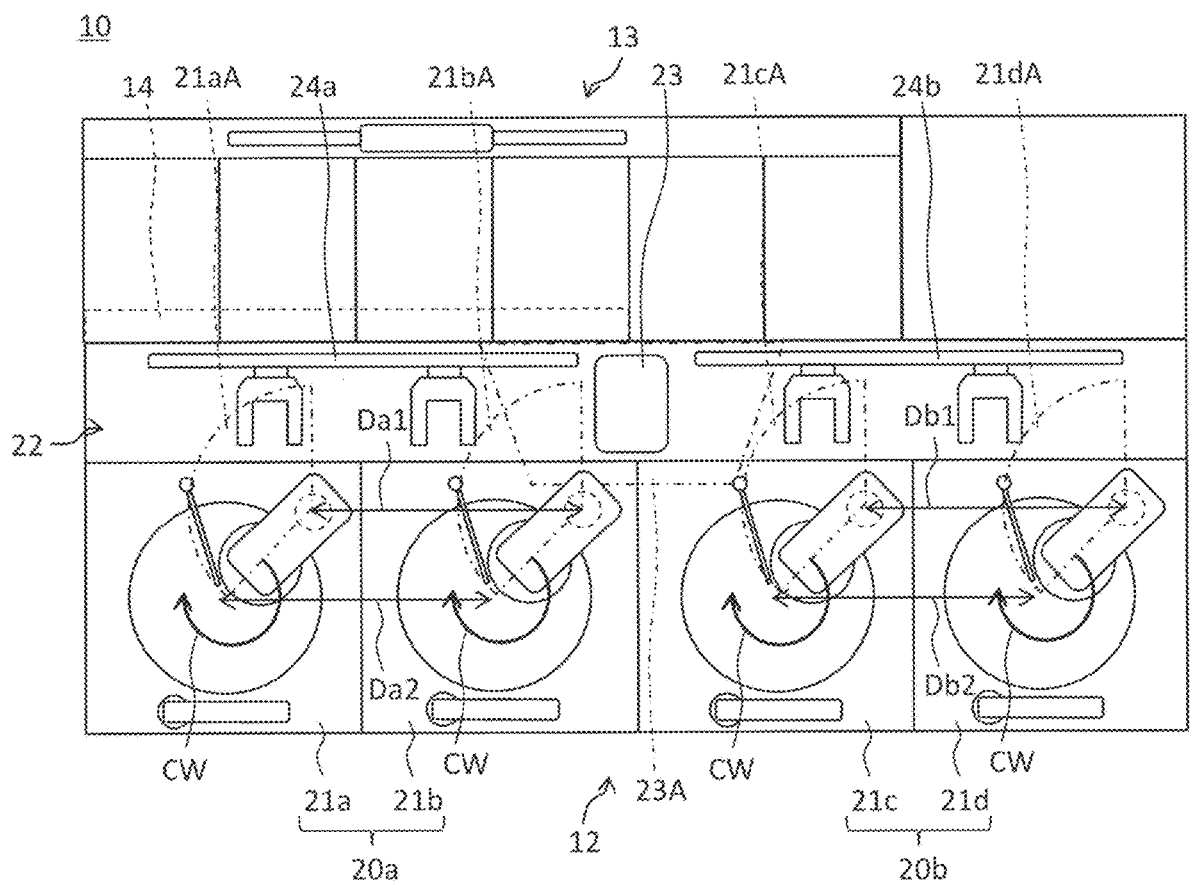
FIG. 33 is a diagram for explaining a configuration of a polishing section according to the first comparative example.

Here, as shown in FIG. 33, as a first comparative example, an arrangement is considered in which the distance Da1 between the swing center of the top ring of the first polishing apparatus 21a and the swing center of the top ring of the second polishing apparatus 21b is equal to the distance Da2 between the center of rotation of the polishing table of the first polishing apparatus 21a and the center of rotation of the polishing table of the second polishing apparatus 21b, and the distance Db1 between the swing center of the top ring of the third polishing apparatus 21c and the swing center of the top ring of the fourth polishing apparatus 21d is equal to the distance Db2 between the center of rotation of the polishing table of the third polishing apparatus 21c and the center of rotation of the polishing table of the fourth polishing apparatus 21d. In this case, an operation range 23A of the transport robot 23, and an swing range 21bA of the top ring of the polishing apparatus (the second polishing apparatus 21b in the illustrated example) located in the vicinity of the transport robot 23 partially overlap in this figure, so that it is not possible to secure a sufficient space for disposing the transport robot 23 in the center of the device, and in some cases, there is a problem that the size of the device may be increased.

In contrast, as shown in FIG. 34, according to this embodiment, since the distance between the swing range of the top ring of the second polishing apparatus 21b and the swing range of the top ring of the third polishing apparatus 21d increases, it is possible to secure a space for disposing the transport robot 23 in the center of the device, and reduce the size of the device.

Figure 32:
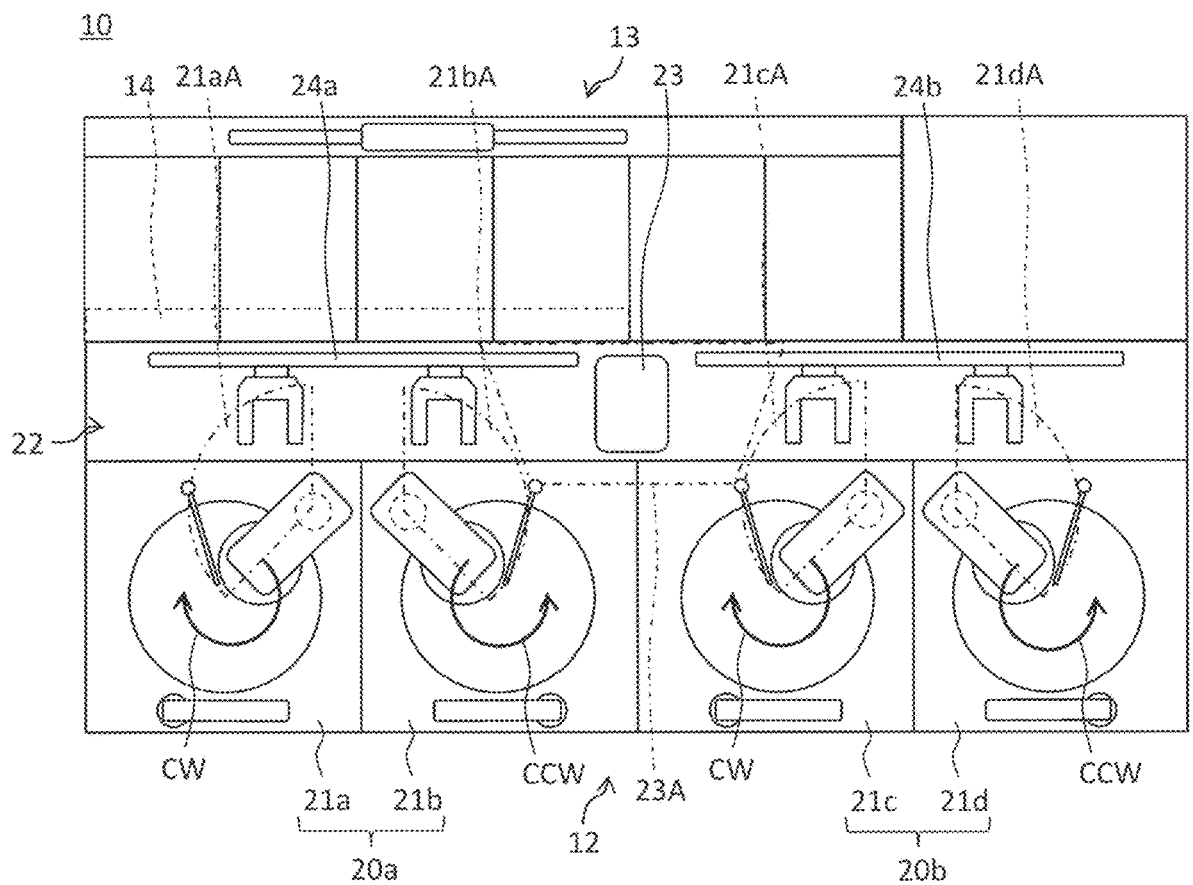
FIG. 32 is a diagram for explaining a configuration of a polishing section according to a second comparative example.

Also, as shown in FIG. 32, as a second comparative example, a configuration is considered in which the layout of the first polishing apparatus 21a and the second polishing apparatus 21b is mirrored (symmetrically disposed with respect to each other), the layout of the third polishing apparatus 21c and the fourth polishing apparatus 21d are mirrored, and the pairs of auxiliary unit mounting units 501a, 501b and 502a, 502b described above are not provided around the polishing tables of the first to fourth polishing apparatuses 21a to 21d. In this case, since the interval between the swing range 21bA of the top ring of the second polishing apparatus 21b and the swing range 21cA of the top ring of the third polishing apparatus 21c is increased, it is possible to secure a space for disposing the transport robot 23 in the center of the device, and reduce the size of the device. However, as shown in FIG. 32, it is necessary to make the rotation directions of the polishing tables of the respective polishing apparatuses 21a to 21d opposite to each other between the adjacent polishing apparatuses 21a to 21d by the mirroring arrangement. In the illustrated example, the rotation direction of the polishing tables of the first polishing apparatus 21a and the third polishing apparatus 21c is clockwise CW, and the rotation direction of the polishing tables of the second polishing apparatus 21b and the fourth polishing apparatus 21d is counterclockwise CCW. In this way, when the rotation directions of the polishing tables of the respective polishing apparatuses 21a to 21d are different, the process may be affected.

In contrast, as shown in FIGS. 34, 4B, and 4C, according to this embodiment, in each of the polishing apparatuses 21a to 21d, the pairs of auxiliary unit mounting units 501a, 501b and 502a, 502b are provided at respective positions symmetrical with respect to the straight line La connecting the swing center of the top ring 301A and the center of rotation of the polishing table 300A, so that it is possible to switch, symmetrically with respect to the straight line La, the position of the auxiliary unit 309A that performs a process on the polishing pad 305A during polishing according to the rotation direction of the polishing table 300A.

Specifically, for example, as shown in FIG. 4B, when the polishing table 300A rotates clockwise CW when viewed from above, since the polishing liquid supply nozzle 302A is required to supply the polishing liquid upstream of the wafer in the rotational direction held by the top ring 301A, the polishing liquid supply nozzle 302A is mounted to the first polishing liquid supply nozzle mounting unit 501a, and since the dressing device 303a is required to perform dressing on downstream of the wafer in the rotational direction held by the top ring 301A, the dressing device 303a is mounted to the first dressing device mounting unit 502a. On the other hand, as shown in FIG. 4C, when the polishing table 300A rotates counterclockwise CCW when viewed from above, since the polishing liquid supply nozzle 302A is required to supply the polishing liquid upstream of the wafer in the rotational direction held by the top ring 301A, the polishing liquid supply nozzle 302A is mounted to the second polishing liquid supply nozzle mounting unit 501b, and since the dressing device 303A is required to perform dressing downstream of the wafer in the rotational direction held by the top ring 301A, the dressing device 303a is mounted to the second dressing device mounting unit 502b.

As a result, while maintaining the rotation direction of the polishing table 300A and the relative positional relationship between the wafer held by the top ring 301A and the auxiliary unit 309A, both of which influence the process, constant, the rotation direction of the polishing table can be changed appropriately for each of the polishing apparatuses 21a to 21d.

Figure 35:
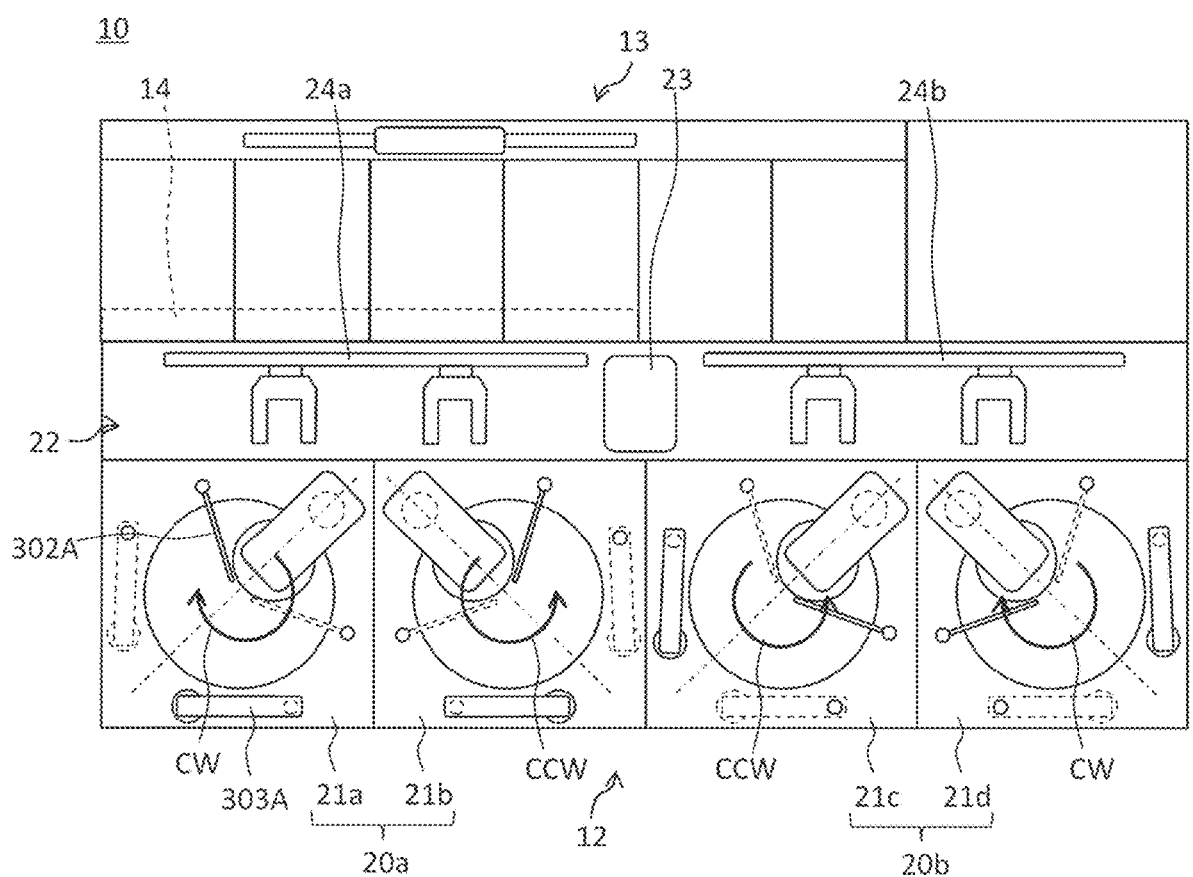
FIG. 35 is a diagram for explaining the configuration of the polishing section according to the present embodiment.

As an example, as shown in FIG. 35, the rotation directions of the polishing tables of the first polishing apparatus 21a and the fourth polishing apparatus 21d may be set in the same direction (clockwise CW in the illustrated example), and the rotation directions of the polishing tables of the second polishing apparatus 21b and the third polishing apparatus 21c may be set in the same direction (counterclockwise CCW in the illustrated example). In this case, after the wafers transported from the transport section 14 are distributed to the first polishing unit 20a and the second polishing unit 20b by the transport robot 23 in the center of the apparatus to polish the wafers sequentially (successively) with the two polishing apparatuses of each polishing unit, in the substrate processing step in which the wafers are transported to the cleaning section 13 via the transport robot 23 in the center of the device, since the wafers distributed to the first polishing unit 20a are polished by the first polishing apparatus 21a and the second polishing apparatus 21b in this order, and the wafers distributed to the second polishing unit 20b are polished by the fourth polishing apparatus 21d and the third polishing apparatus 21c in this order, the wafer distributed to the first polishing unit 20a and the wafer distributed to the second polishing unit 20b can be polished under the same conditions. Further, since the wafer polished by the first polishing unit 20a is transported to the cleaning section 13 from the second polishing apparatus 21b at the center of the apparatus by the transport robot 23, and the wafer polished by the second polishing unit 20b is transported to the cleaning section 13 from the third polishing apparatus 21c at the center of the device by the transport robot 23, it is possible to make uniform the time until the transport robot 23 loads the wafer into the cleaning section 13 since polishing by each polishing unit 20a and 20b is finished. Since the polishing liquid tends to dry and harden in a short time, by making uniform the time until the transport robot 23 loads the wafer into the cleaning section 13 since polishing by each polishing unit 20a and 20b is finished, it is possible to suppress variations in cleaning efficiency in the cleaning section 13.

In the example shown in FIG. 35, when wafers distributed to the first polishing unit 20a and the second polishing unit 20b by the transport robot 23 in the center of the apparatus are sequentially polished by the two polishing apparatuses of each polishing unit (continuously), the wafer distributed to the first polishing unit 20a may be polished by the second polishing apparatus 21b and the first polishing apparatus 21a in this order, and the wafer distributed to the second polishing unit 20b may be polished by the third polishing apparatus 21c and the fourth polishing apparatus 21d in this order. Also in this case, the wafer distributed to the first polishing unit 20a and the wafer distributed to the second polishing unit 20b can be polished under the same conditions. Further, since it is possible to make uniform the time until the transport robot 23 loads the wafer into the cleaning section 13 since polishing by each polishing unit 20a and 20b is finished, it is possible to suppress variations in cleaning efficiency in the cleaning section 13.

Figure 36:
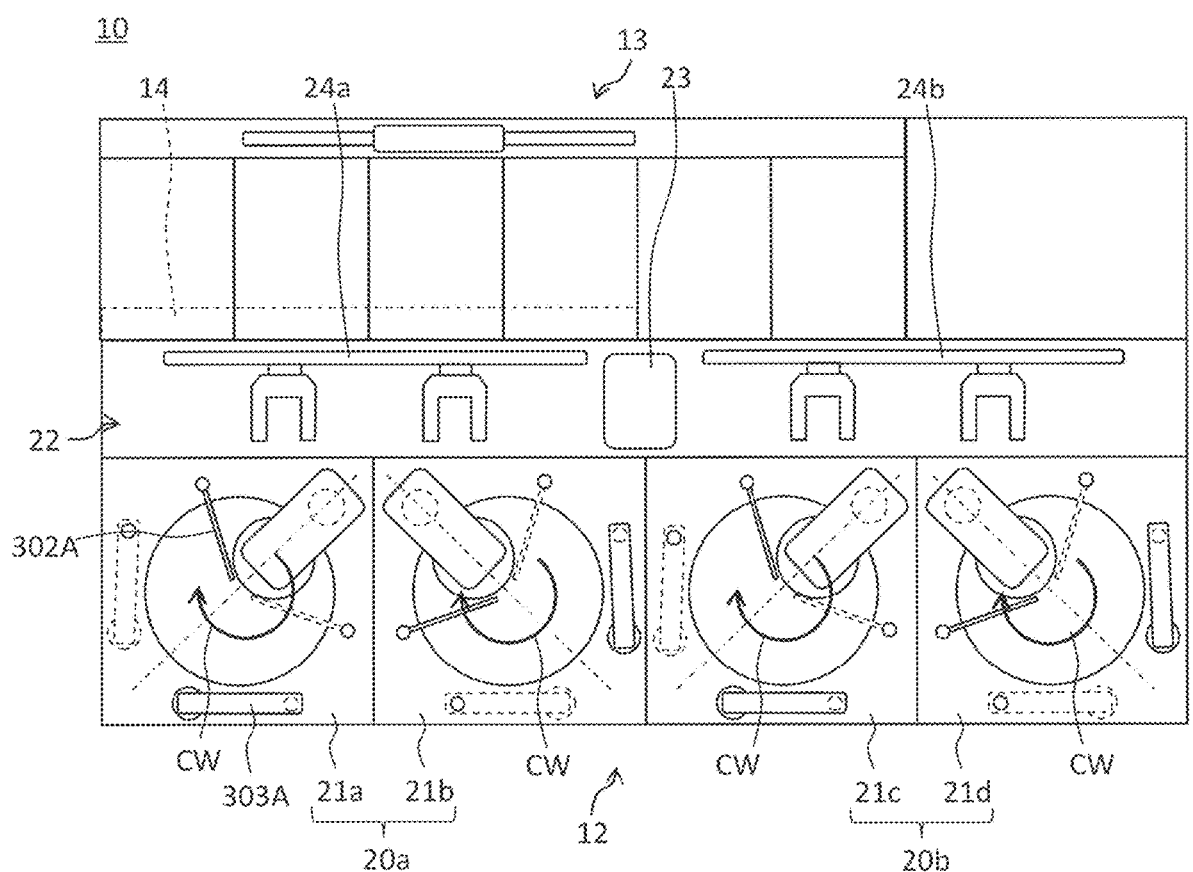
FIG. 36 is a diagram for explaining the configuration of the polishing section according to the present embodiment.

As another example, as shown in FIG. 36, the rotation directions of the polishing tables of the first to fourth polishing apparatuses 21a to 21d may be aligned in the same direction (clockwise CW in the illustrated example). Also in this case, after the wafers transported from the transport section 14 are distributed to the first polishing unit 20a and the second polishing unit 20b by the transport robot 23 in the center of the apparatus to polish the wafers sequentially (successively) with the two polishing apparatuses of each polishing unit, in the substrate processing step in which the wafers are transported to the cleaning section 13 via the transport robot 23 in the center of the device, since the wafers distributed to the first polishing unit 20a are polished by the first polishing apparatus 21a and the second polishing apparatus 21b in this order, and the wafers distributed to the second polishing unit 20b are polished by the fourth polishing apparatus 21d and the third polishing apparatus 21c in this order, the wafer distributed to the first polishing unit 20a and the wafer distributed to the second polishing unit 20b can be polished under the same conditions. Further, since the wafer polished by the first polishing unit 20a is transported to the cleaning section 13 from the second polishing apparatus 21b at the center of the apparatus by the transport robot 23, and the wafer polished by the second polishing unit 20b is transported to the cleaning section 13 from the third polishing apparatus 21c at the center of the device by the transport robot 23, it is possible to make uniform the time until the transport robot 23 loads the wafer into the cleaning section 13 since polishing by each polishing unit 20a and 20b is finished. Since the polishing liquid tends to dry and harden in a short time, by making uniform the time until the transport robot 23 loads the wafer into the cleaning section 13 since polishing by each polishing unit 20a and 20b is finished, it is possible to suppress variations in cleaning efficiency in the cleaning section 13.

In the example shown in FIG. 36, when wafers distributed to the first polishing unit 20a and the second polishing unit 20b by the transport robot 23 in the center of the apparatus are sequentially polished by the two polishing apparatuses of each polishing unit (continuously), the wafer distributed to the first polishing unit 20a may be polished by the second polishing apparatus 21b and the first polishing apparatus 21a in this order, and the wafer distributed to the second polishing unit 20b may be polished by the third polishing apparatus 21c and the fourth polishing apparatus 21d in this order. Also in this case, the wafer distributed to the first polishing unit 20a and the wafer distributed to the second polishing unit 20b can be polished under the same conditions. Further, since it is possible to make uniform the time until the transport robot 23 loads the wafer into the cleaning section 13 since polishing by each polishing unit 20a and 20b is finished, it is possible to suppress variations in cleaning efficiency in the cleaning section 13.

In the example shown in FIG. 36, when wafers distributed to the first polishing unit 20a and the second polishing unit 20b by the transport robot 23 in the center of the apparatus are sequentially polished by the two polishing apparatuses of each polishing unit (continuously), (A) the wafer distributed to the first polishing unit 20a may be polished by the first polishing apparatus 21a and the second polishing apparatus 21b in this order, and the wafer sorted to the second polishing unit 20b may be polished by the third polishing apparatus 21c and the fourth polishing apparatus 21d in this order, and (B) The wafer sorted to the first polishing unit 20a may be polished by the second polishing apparatus 21b and the first polishing apparatus 21a in this order, and the wafer distributed to the second polishing unit 20b may be polished by the fourth polishing apparatus 21d and the third polishing apparatus 21c in this order. In the case of (A) or (B), the wafer distributed to the first polishing unit 20a and the wafer distributed to the second polishing unit 20b can be polished under the same conditions.

As can be seen from the consideration of using a slurry during polishing, the polishing section 12 is the most dirty (dirty) region. Therefore, in this embodiment, the exhaust is performed from around each polishing table of the first polishing apparatus 21a, the second polishing apparatus 21b, the third polishing apparatus 21c, and the fourth polishing apparatus 21d so as to prevent the particles in the polishing section 12 from scattering outside, and particles are prevented from scattering by setting the pressure inside the polishing section 12 to be lower than the pressure at the outside of the device, the surrounding cleaning section 13, the load/unload unit 11, and the transport section 14. Further, usually, an exhaust duct (not shown) is provided below the polishing table, and a filter (not shown) is provided above the polishing table, and purified air is ejected through these exhaust duct and filter to form the downflow.

As shown in FIG. 1, a top ring 25a of the first polishing apparatus 21a moves between the polishing position and the first substrate transport position TP1 by the swing motion of the top ring head, and the wafer is transferred to the first polishing apparatus 21a at the first substrate transport position TP1. Similarly, a top ring 25b of the second polishing apparatus 21b moves between the polishing position and a second substrate transport position TP2 by the swing motion of the top ring head, and the wafer is transferred to the second polishing apparatus 21b at the second substrate transport position TP2. A top ring 25c of the third polishing apparatus 21c moves between the polishing position and the third substrate transport position TP3 by the swing motion of the top ring head, and the wafer is transferred to the third polishing apparatus 21c at the third substrate transport position TP3. A top ring 25d of the fourth polishing apparatus 21d moves between the polishing position and the fourth substrate transport position TP4 by the swing motion of the top ring head, and the wafer is transferred to the fourth polishing apparatus 21d at the fourth substrate transport position TP4.

The polishing section transport mechanism 22 has a first transport unit 24a that transports the wafer W to the first polishing unit 20a, a second transport unit 24b that transports the wafer W to the second polishing unit 20b, and a transport robot 23 that is disposed between the first transport unit 24a and the second transport unit 24b, and that performs a transfer of the wafer between the transport section 14 and each of the first transport unit 24a and the second transport unit 24b. In the illustrated example, the transport robot 23 is disposed substantially in the center of the housing of the substrate processing apparatus 10.

Figure 5:
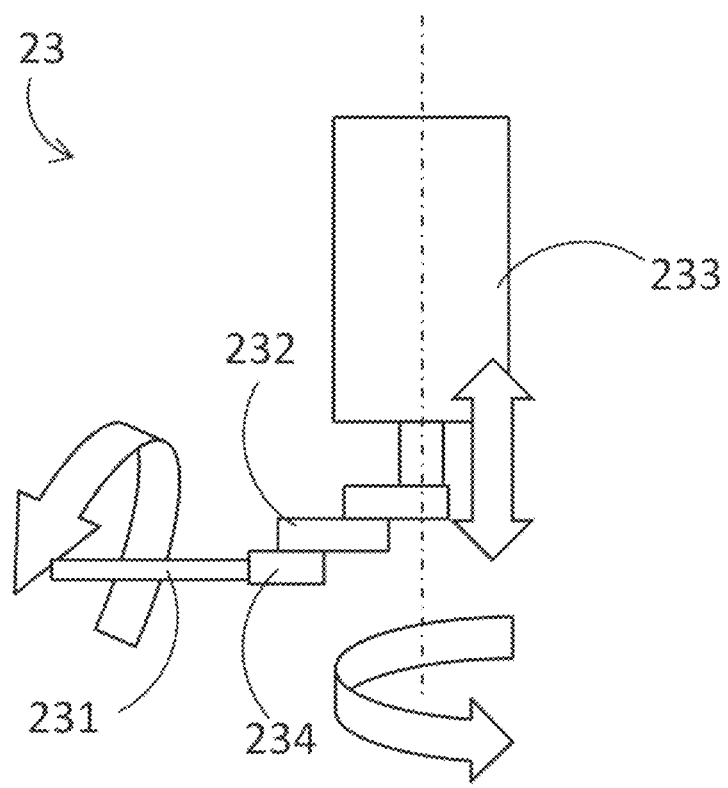
FIG. 5 is a side view of a transport robot of the substrate processing apparatus shown in FIG. 1.

FIG. 5 is a side view of the transport robot 23. As shown in FIG. 5, the transport robot 23 has a hand 231 that holds the wafer W, a reversing mechanism 234 that reverses the hand 231 upside down, an extendable arm 232 that supports the hand W, a robot body 233 including an arm vertical movement mechanism that vertically moves the arm 232 and an arm rotating mechanism that rotates the arm 232 around a vertical axis. The robot body 233 is mounted so as to be suspended from the frame of the ceiling of the polishing section 14.

In the present embodiment, the hand 231 is accessible to the slide stage 42 from the carry-out port 41b of the transport section 14 shown in FIG. 3. The hand 231 is accessible to the first transport unit 24a and the second transport unit 24b of the polishing section 12. Therefore, the wafers W continuously transported from the transport section 14 to the polishing section 12 are distributed by the transport robot 23 to the first transport unit 24a and the second transport unit 24b.

Figure 6:
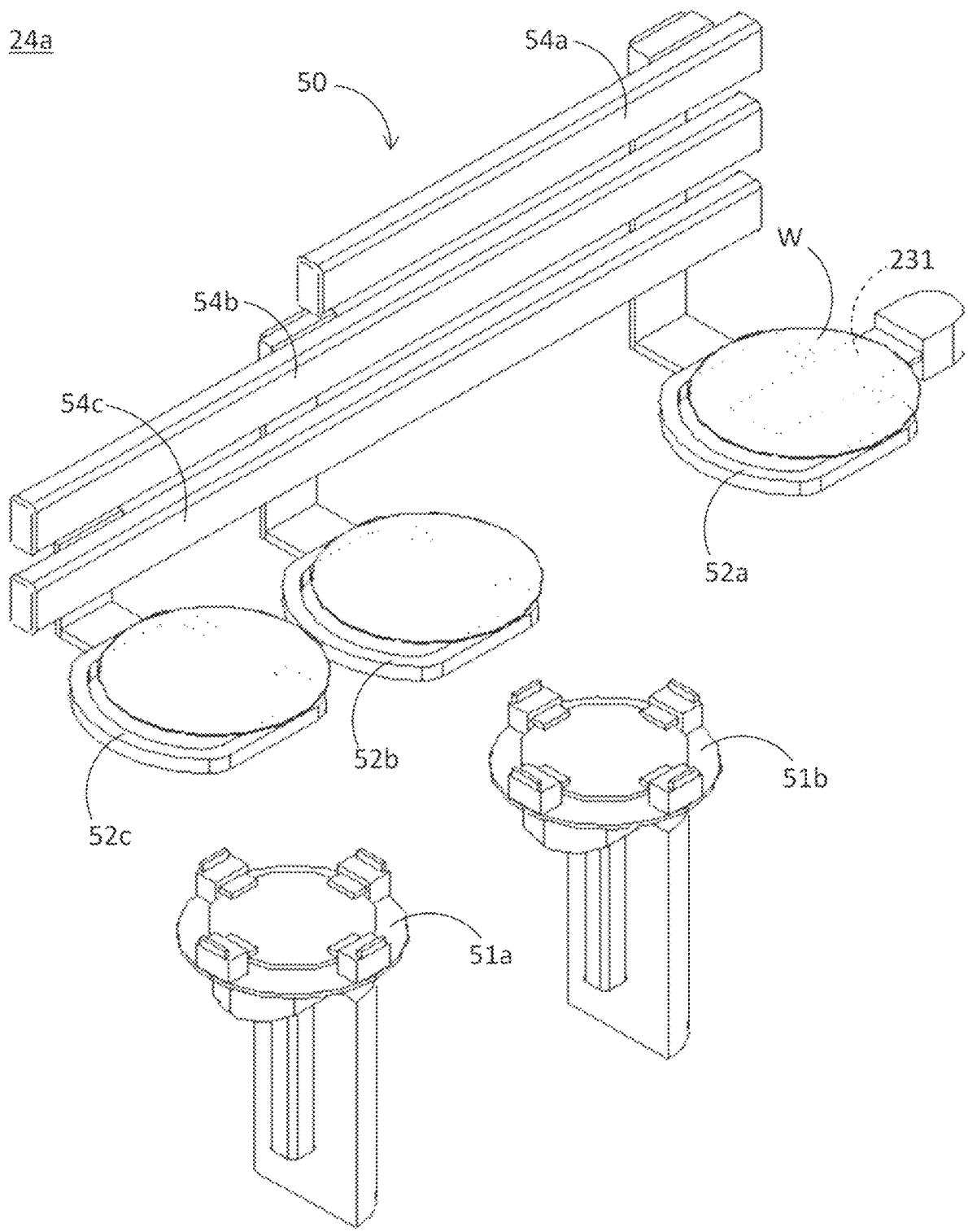
FIG. 6 is a perspective view showing a first transport mechanism of the substrate processing apparatus shown in FIG. 1.

Since the second transport unit 24b has the same configuration as the first transport unit 24a, the first transport unit 24a will be described below. FIG. 6 is a perspective view of the first transport unit 24a.

As shown in FIG. 6, the first transport unit 24a has a first pusher 51a that is disposed at the first substrate transport position TP1 with respect to the first polishing apparatus 21a, and that vertically moves, a second pusher 51b that is disposed at the second substrate transport position TP2 with respect to the second polishing apparatus 21b, and that vertically moves, and an exchanger 50 having a first stage 52a, a second stage 52b and a third stage 52c that horizontally move independently of each other between the first substrate transport position TP1 and the second substrate transport position TP2.

Of these, the first pusher 51a transfers the wafer W held on any of the first to third stages 52a to 52c to the top ring 25a of the first polishing apparatus 21a, and transfers the wafer W after polished by the first polishing apparatus 21a to any of the first to third stages 52a to 52c. The second pusher 51b transfers the wafer W held on any of the first to third stages 52a to 52c to the top ring 25b of the second polishing apparatus 21b, and transfers the wafer W after polished by the second polishing apparatus 21b to any of the first to third stages 52a to 52c. In this way, the first pusher 51a and the second pusher 51b function as a transfer mechanism that performs a transfer of the wafer W between the exchanger 50 and each top ring. Since the second pusher 51b has the same structure as the first pusher 51a, only the first pusher 51a will be described below.

Figure 7:
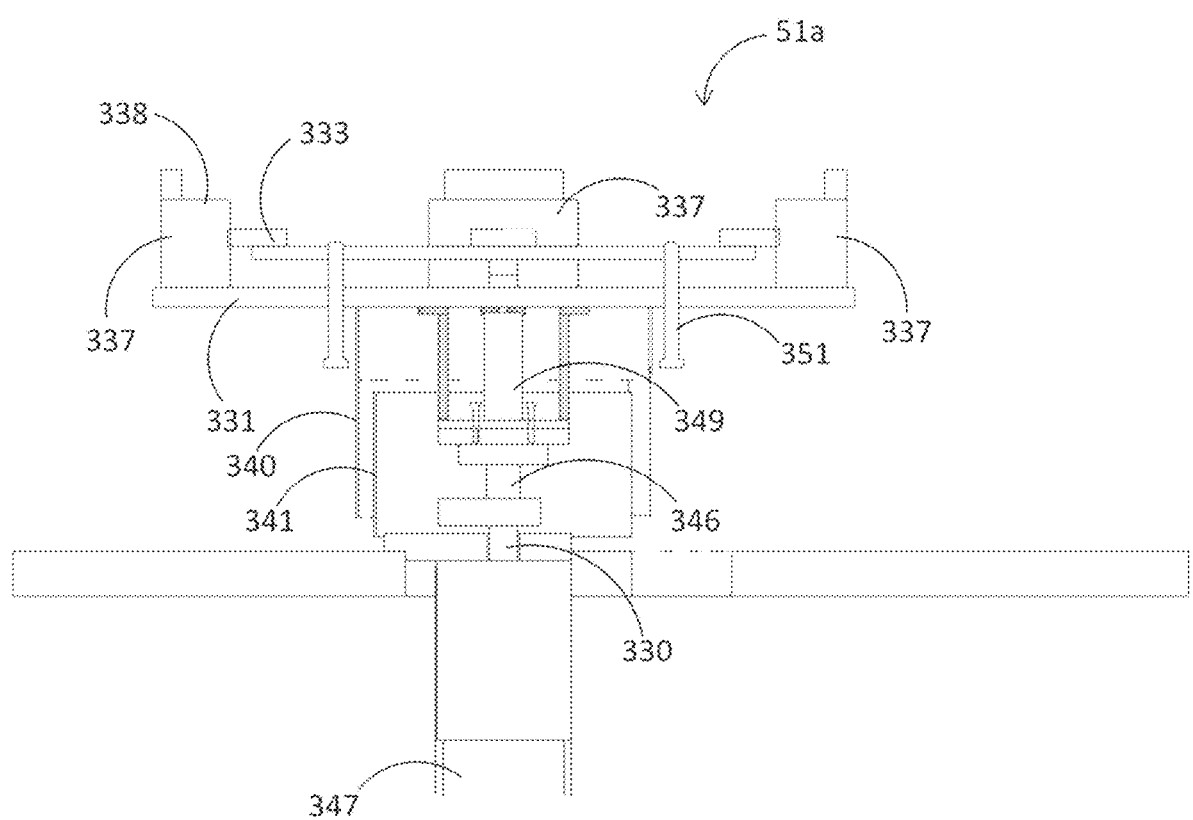
FIG. 7 is a vertical cross-sectional view showing a first pusher of the first transport mechanism shown in FIG. 6.

FIG. 7 is a longitudinal sectional view of the first pusher 51a. As shown in FIG. 7, the first pusher 51a includes a guide stage 331 that holds the top ring of the first polishing apparatus 21a and a push stage 333 that holds the wafer W. Four top ring guides 337 are installed on the outermost periphery of the guide stage 331. An upper stage part 338 of the top ring guide 337 is an access part with the lower face of the guide ring (not shown, surrounding the outer periphery of the wafer W) of the top ring. The upper stage part 338 has a taper (preferably about 25° to 35°) for introducing the top ring. At the time of wafer loading/unloading, the top ring guide 337 directly receives the wafer edge.

A guide sleeve 340 having a waterproof function is installed on the back face of the guide stage 331. A center sleeve 341 for waterproofing the pusher is installed inside the guide sleeve 340.

In order to provide the top ring guide 337 with a positioning mechanism, a linear way 346 that moves in the horizontal X-axis and Y-axis directions to center the guide stage 331 is disposed. The guide stage 331 is fixed to the linear way 346. The linear way 346 has a structure capable of returning to the center position by applying pressure. With this structure, centering of the guide stage 331 is realized. Alternatively, with the spring inside the linear way 346, the linear way 346 can return to the center position without applying pressure.

The linear way 346 is fixed to a shaft 330, and the shaft 330 is connected to an electric actuator 347. By driving the electric actuator 347, the guide stage 331 vertically moves via the shaft 330. As a result, when receiving the wafer W from the stages 52a to 52c of the exchanger, which will be described later, the guide stage 331 can be made to stand by at a height at which an optimal clearance for each stage is kept as a preliminary operation, thus shortening the time required for the receiving operation.

The push stage 333 is disposed above the guide stage 331, and a cylinder 349 that vertically moves the push stage 333 with respect to the guide stage 331 is provided at the center of the push stage 333. The push stage 333 vertically moves by the cylinder 349 to load the wafer W onto the top ring. In the present embodiment, the push stage 333 is driven by the cylinder 349, so that the push stage 333 can be positioned at a desired height position. A compression spring 351 for positioning is disposed at the end of the push stage 333.

In addition, a cleaning nozzle that cleans dirt is separately installed in order to prevent reverse contamination of the wafer from the slurry attached to the pusher. A wafer presence/absence sensor that checks the presence/absence of a wafer on the pusher may be separately installed.

As shown in FIG. 6, the exchanger 52a has the first stage 52a, the second stage 52b, and the third stage 52c that are vertically disposed in a plurality of stages. In the illustrated example, the first stage 52a is disposed in the lower step, the second stage 52b is disposed in the middle step, and the third stage 52c is disposed in the upper step. While the first stage 52a, the second stage 52b and the third stage 52c move on the same axis passing through the first substrate transport position TP1 and the second substrate transport position TP2 in plan view, it is possible to move freely without interfering with each other because the installed heights are different.

As shown in FIG. 6, the first stage 52a has a first stage drive mechanism 54a that linearly moves the first stage 52a in one axis direction, the second stage 52b has a second stage drive mechanism 54b that linearly moves the second stage 52b in the one axis direction, and the third stage 52c has a third stage drive mechanism 54c that linearly moves the third stage 52c in the one axis direction. As the first to third stage drive mechanisms 54a to 54c, for example, a motor drive mechanism including an electric actuator or a ball screw is used. The first to third stages 52a to 52c can move in different directions at different timing by receiving power from different first to third stage drive mechanisms 54a to 54c.

Since the second stage 52b and the third stage 52c have the same configuration as the first stage 52a, the first stage 52a will be described below.

As shown in FIG. 6, the first stage 52a has a "U" shape in plan view in which one side (the right rear side in FIG. 6) in the linear movement direction of the first stage drive mechanism 54a is open. Therefore, when the first stage 52a is disposed at the first substrate transport position TP1, the first pusher 51a can vertically move so as to pass inside the first stage 52a. Further, the first stage 52a is movable to the other side in the linear movement direction (left front side in FIG. 6) even when the first pusher 51a has passed inside the first stage 52a.

Although illustration is omitted, the first stage 52a is provided with four pins protruding upward. Therefore, the wafer W placed on the first stage 52a is supported on the first stage 52a in a state where its outer peripheral edge is guided and positioned by the four pins. These pins are made of resin such as polypropylene (PP), polychlorotrifluoroethylene (PCTFE) or polyetheretherketone (PEEK).

Next, an example of operations of the first pusher 51a and the exchanger 50 configured as described above will be described.

First, at the time of wafer loading, the wafer W is transported by the first stage 52*a* of the exchanger 50 above the first pusher 51*a*. When the top ring 25*a* of the first polishing apparatus 21*a* is located at the wafer load position (first substrate transport position TP1) above the first pusher 51*a* and does not hold the wafer W, a set of components around the guide stage 331 are raised by the electric actuator 347. During rising, the guide stage 331 passes inside the first stage 52*a*. At this time, the guide stage 331 causes the wafer W to be centered by the taper of the top ring guide 337 upon passing, and the push stage 333 holds the pattern face (other than the edge) of the wafer W.

While the push stage 333 holds the wafer W, the top ring guide 337 ascends without stopping, and the taper (not shown) of the top ring guide 337 attracts the guide ring. The centering of the top ring is performed by the alignment by the linear way 346 that is freely movable in the X and Y directions, and the upper stage part 338 of the top ring guide 337 comes into contact with the lower face of the guide ring to complete the ascent of the guide stage 331.

The upper stage part 338 of the top ring guide 337 contacts and is fixed to the lower face of the guide ring, so that the guide stage 331 does not ascend further. At this time, the push stage 333 is further raised by the cylinder 349. At this time, the push stage 333 holds the pattern face (other than the edge) of the wafer W and transports the wafer W to the top ring. When the top ring completes the suction of the wafer W, the first pusher 51*a* starts descending, and the operation is completed at the end of descending.

In the present embodiment, since the first stage 52*a* has a "U" shape in plan view in which one side in the linear movement direction (the right rear side in FIG. 6) is open, it can be moved to the other side (left front side in FIG. 6) in the linear movement direction even before the first pusher 51*a* starts descending. Therefore, it is not necessary to wait for the first pusher 51*a* to descend when moving the first stage 52*a*, and the throughput of the process is improved.

Next, at the time of wafer unloading, the wafer W is transported by the top ring to the wafer unloading position above the first pusher 51*a*. When the first stage 52*a* of the exchanger 50 is above the first pusher 51*a* and no wafer is mounted, a set of components around the guide stage 331 are raised by the electric actuator 347, and the taper (not shown) of the top ring guide 337 attracts the guide ring. The guide stage 331 is centered on the top ring by the alignment by the linear way 346, and the upper stage part 338 of the top ring guide 337 comes into contact with the lower face of the guide ring to complete the ascent of the guide stage 331.

Then, the wafer W is released from the top ring. At this time, the wafer W is centered by the lower taper of the top ring guide 337, and the edge part is held by the top ring guide 337. When the wafer W is held by the first pusher 51*a*, the first pusher 51*a* starts descending. At the time of descending, the guide stage 331, which has moved its center position for the centering of the top ring, is centered by the guide sleeve 340 and the center sleeve 341. During the descent, the wafer is transferred from the first pusher 51*a* to the first stage 52*a* with the edge part of the wafer W received, and the operation is completed when the descent is completed.

<Cleaning Section>

As shown in FIGS. 1 and 2, the cleaning section 13 is a region where the wafer after polishing is cleaned, and has a first cleaning unit 30*a* and a second cleaning unit 30*b* disposed in upper and lower two stages. The above-described transport section 14 is disposed between the first cleaning unit 30*a* and the second cleaning unit 30*b*. Since the first cleaning unit 30*a*, the transport section 14 and the second cleaning unit 30*b* are disposed so as to overlap to each other in the vertical direction, an advantage that the footprint is small is obtained.

As shown in FIGS. 1 and 2, the first cleaning unit 30*a* has a plurality of (four in the illustrated example) cleaning modules 311*a*, 312*a*, 313*a*, and 314*a*, a wafer station 33*a*, and a cleaning section transport mechanism 32*a* that transports the wafer W between each of the cleaning modules 311*a* to 314*a* and the wafer station 33*a*. The plurality of cleaning modules 311*a* to 314*a* and the wafer station 33*a* are disposed in series along the longitudinal direction of the substrate processing apparatus 10. A filter fan unit (not shown) having a clean air filter is provided on the upper part of each of the cleaning modules 311*a* to 314*a*, and this filter fan unit constantly blows downward clean air from which particles have been removed. The inside of the first cleaning unit 30*a* is maintained at any time at a pressure higher than the pressure of the polishing section 12 in order to prevent particles from flowing in from the polishing section 12.

Similarly, the second cleaning unit 30*b* includes a plurality of (four in the illustrated example) cleaning modules 311*b*, 312*b*, 313*b*, and 314*b*, a wafer station 33*b*, and a cleaning section transport mechanism 32*b* that transfers the wafer W between each of the cleaning modules 311*b* to 314*b* and the wafer station 33*b*. The plurality of cleaning modules 311*b* to 314*b* and the wafer station 33*b* are disposed in series along the longitudinal direction of the substrate processing apparatus 10. A filter fan unit (not shown) having a clean air filter is provided on the upper part of each of the cleaning modules 311*b* to 314*b*, and this filter fan unit constantly blows downward clean air from which particles have been removed. The inside of the second cleaning unit 30*b* is maintained at any time at a pressure higher than the pressure of the polishing section 12 in order to prevent particles from flowing in from the polishing section 12.

As will be described later (FIG. 27, FIGS. 28A to 28E and related explanations), the preliminary cleaning modules 39*a* and 39*b* may be added to the cleaning modules 311*a* to 314*a* and 311*b* to 314*b*, respectively.

Figure 8:
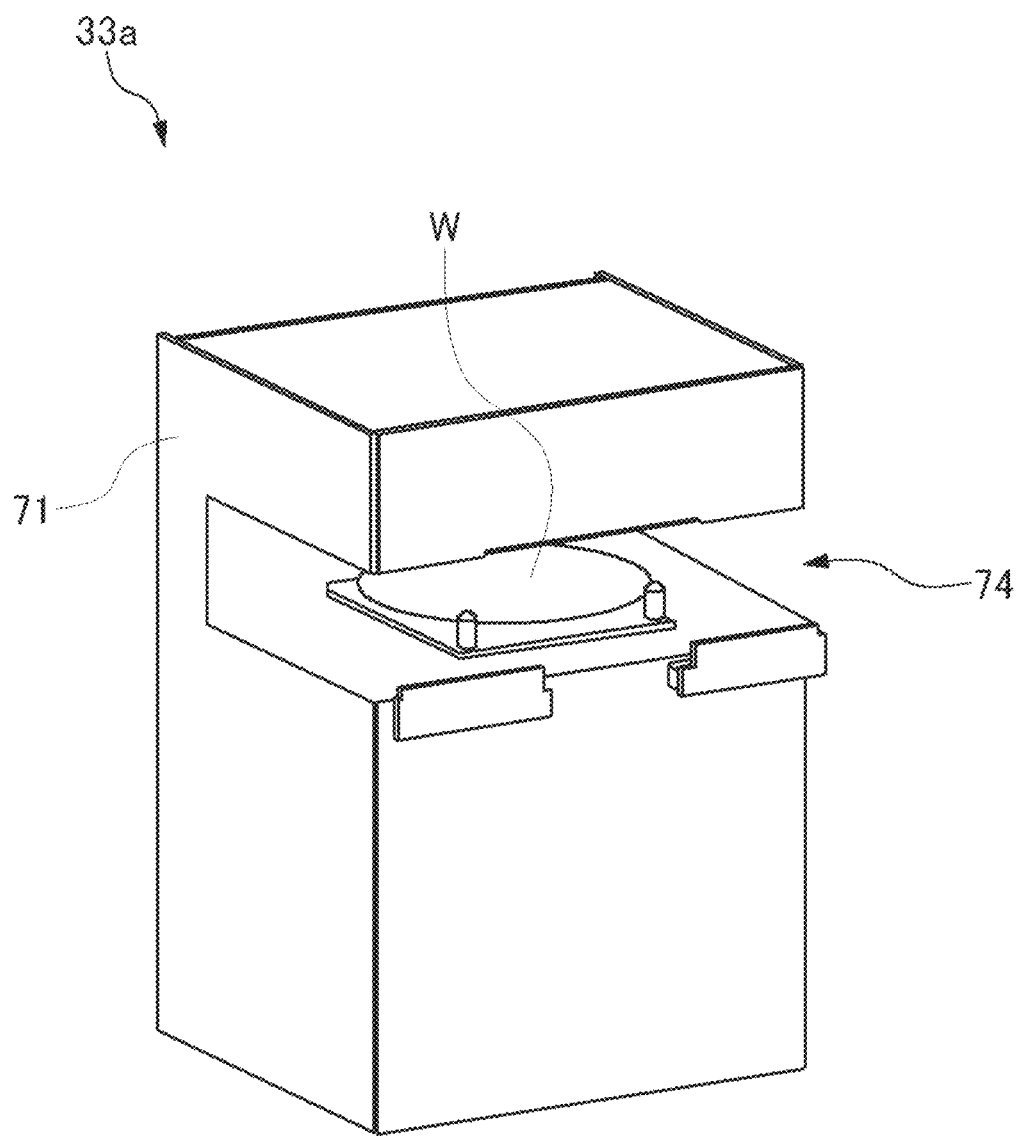
FIG. 8 is an exploded perspective view showing a first wafer station of a cleaning section shown in FIG. 2.
Figure 9:
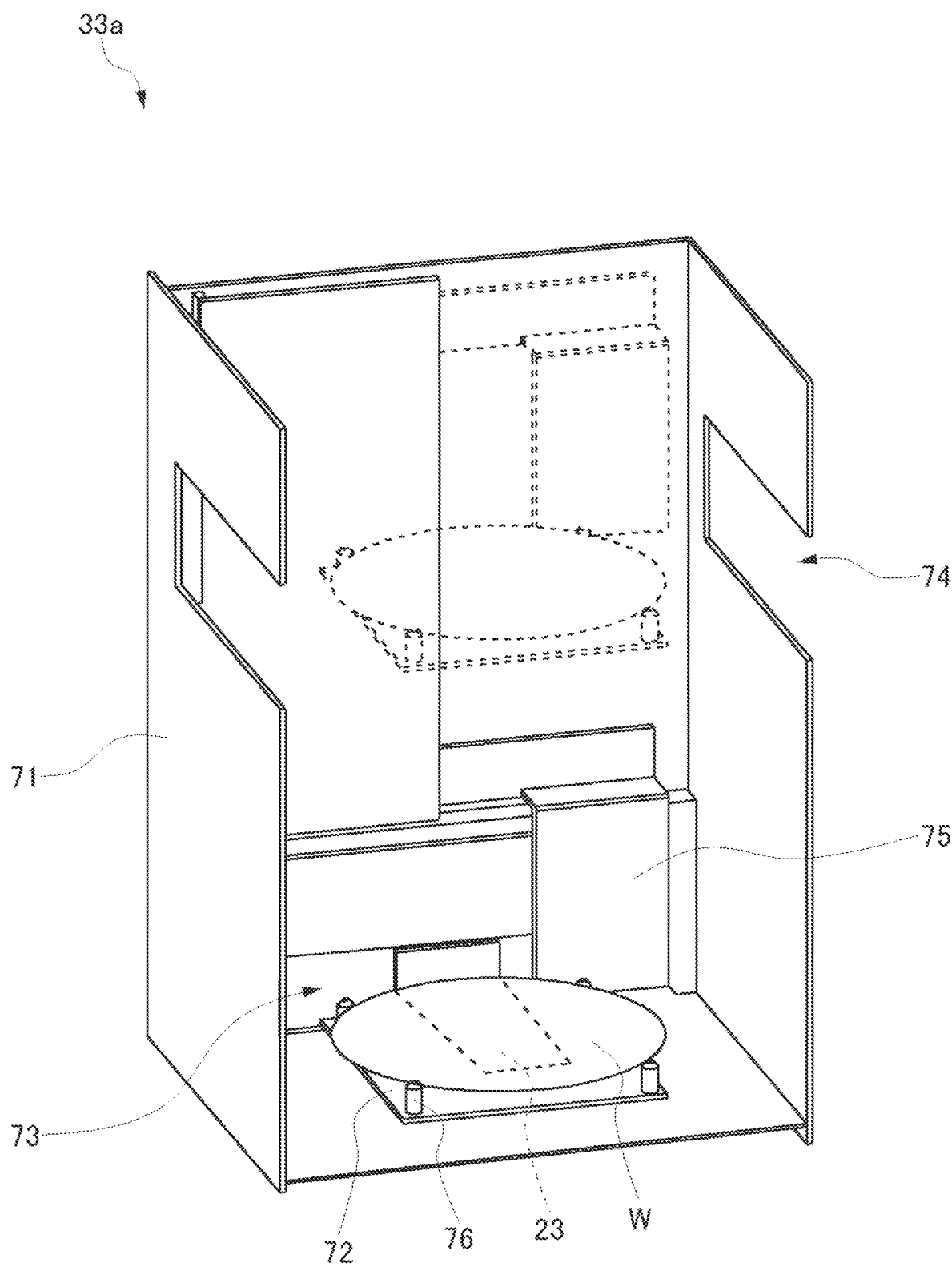
FIG. 9 is an exploded perspective view showing an internal configuration of the first wafer station shown in FIG. 8.

FIG. 8 is a perspective view of the wafer station 33*a* of the first cleaning unit 30*a*. FIG. 9 is an exploded perspective view showing the internal configuration of the wafer station 33*a*. As shown in FIGS. 8 and 9, the wafer station 33*a* includes a housing 71 having a substantially rectangular parallelepiped shape, a stage 72 that is disposed inside of the housing 71 and that holds the wafer W, and a drive mechanism 75 that vertically moves the stage 72.

Among them, the housing 71 has a bottom plate, four side plates, and a top plate. As shown in FIG. 9, a carry-in port 73 communicating with the polishing section 12 is formed at the lower end part of the side plate facing the polishing section 12 among the four side plates. The carry-in port 73 is openable and closable by a shutter (not shown). As shown in FIG. 9, the transport robot 23 of the polishing section 12 can access the inside of the housing 71 through the carry-in port 73.

Figure 12:
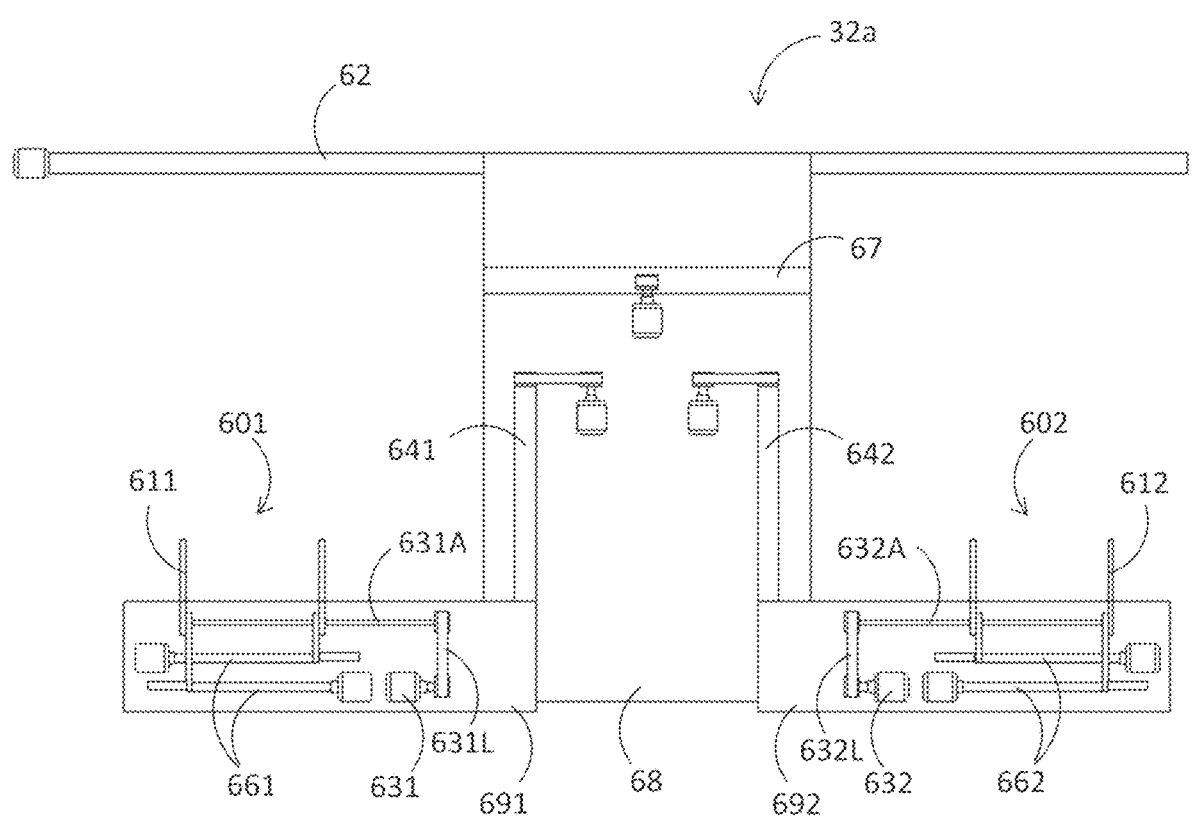
FIG. 12 is a view showing a cleaning section transport mechanism of the first cleaning unit of the cleaning section shown in FIG. 2.

In addition, as shown in FIG. 8, in the remaining three side plates (that is, the side plate facing a first cleaning section transport mechanism 32*a*, which is later described, and the left and right side plates) among the four side plates, an arm passage opening 74 through which the arm of the cleaning section transport mechanism 32*a* passes is formed at a height position higher than the position of the carry-in port 73. The wafer transport opening 74 is openable and closable by a shutter (not shown). As shown in FIGS. 12 and 13, the cleaning section transport mechanism 32*a* of the first cleaning unit 30a is accessible to the inside of the housing 71 through the arm passage opening 74.

For example, a motor drive mechanism including a ball screw or an air cylinder is used as the drive mechanism 75. The stage 72 is fixed to the movable part of the drive mechanism 75, and vertically moves between a height position facing the carry-in port 73 and a height position facing the wafer transport opening 74 by the power provided from the drive mechanism 75 (see FIG. 9).

Four pins 76 are provided so as to protrude upward on the outer peripheral part of the stage 72. Therefore, the wafer W placed on the stage 72 is supported on the stage 72 in a state where its outer peripheral edge is guided and positioned by the four pins 76. These pins 76 are made of resin such as polypropylene (PP), polychlorotrifluoroethylene (PCTFE) or polyetheretherketone (PEEK).

Figure 10:
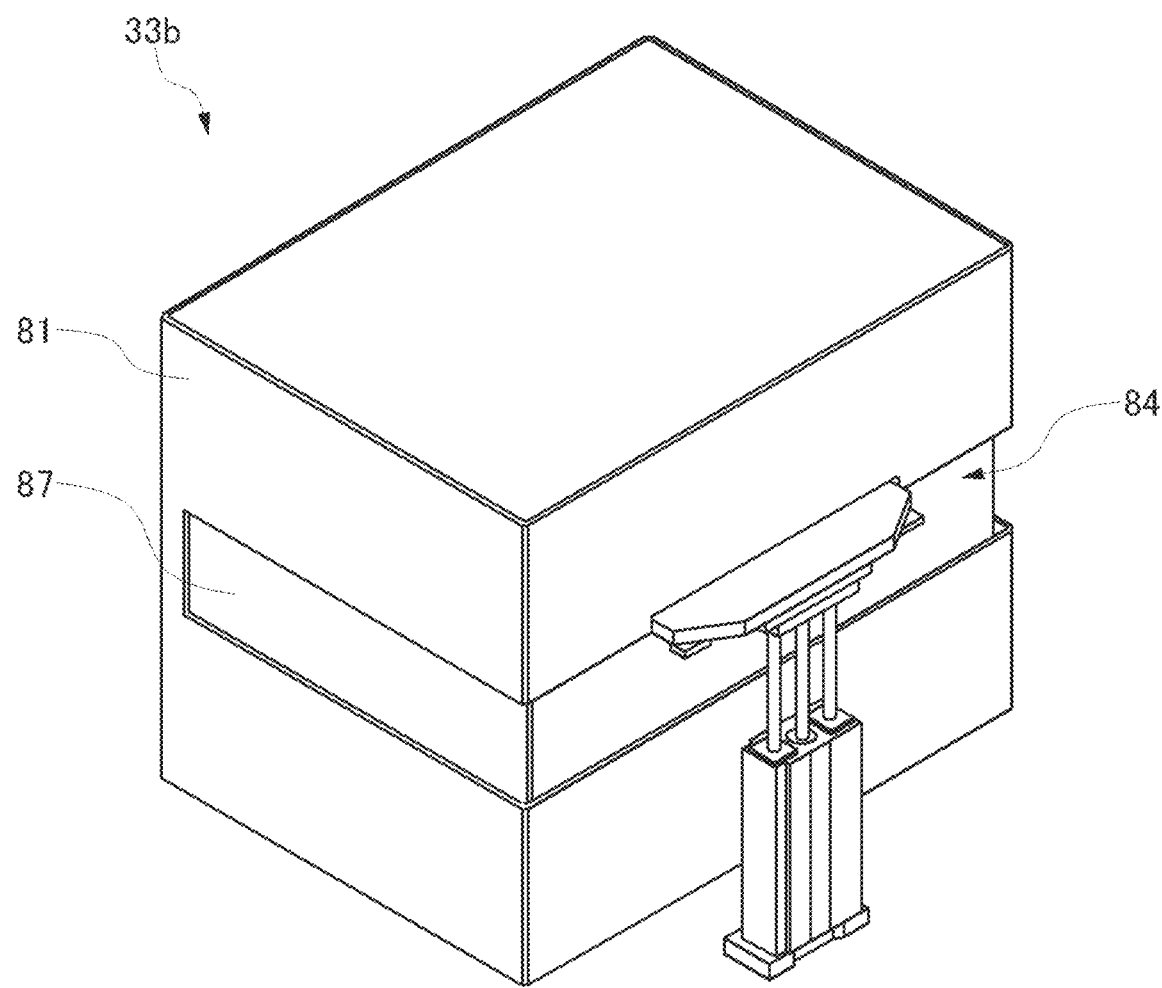
FIG. 10 is an exploded perspective view showing a second wafer station of the cleaning section shown in FIG. 2.
Figure 11:
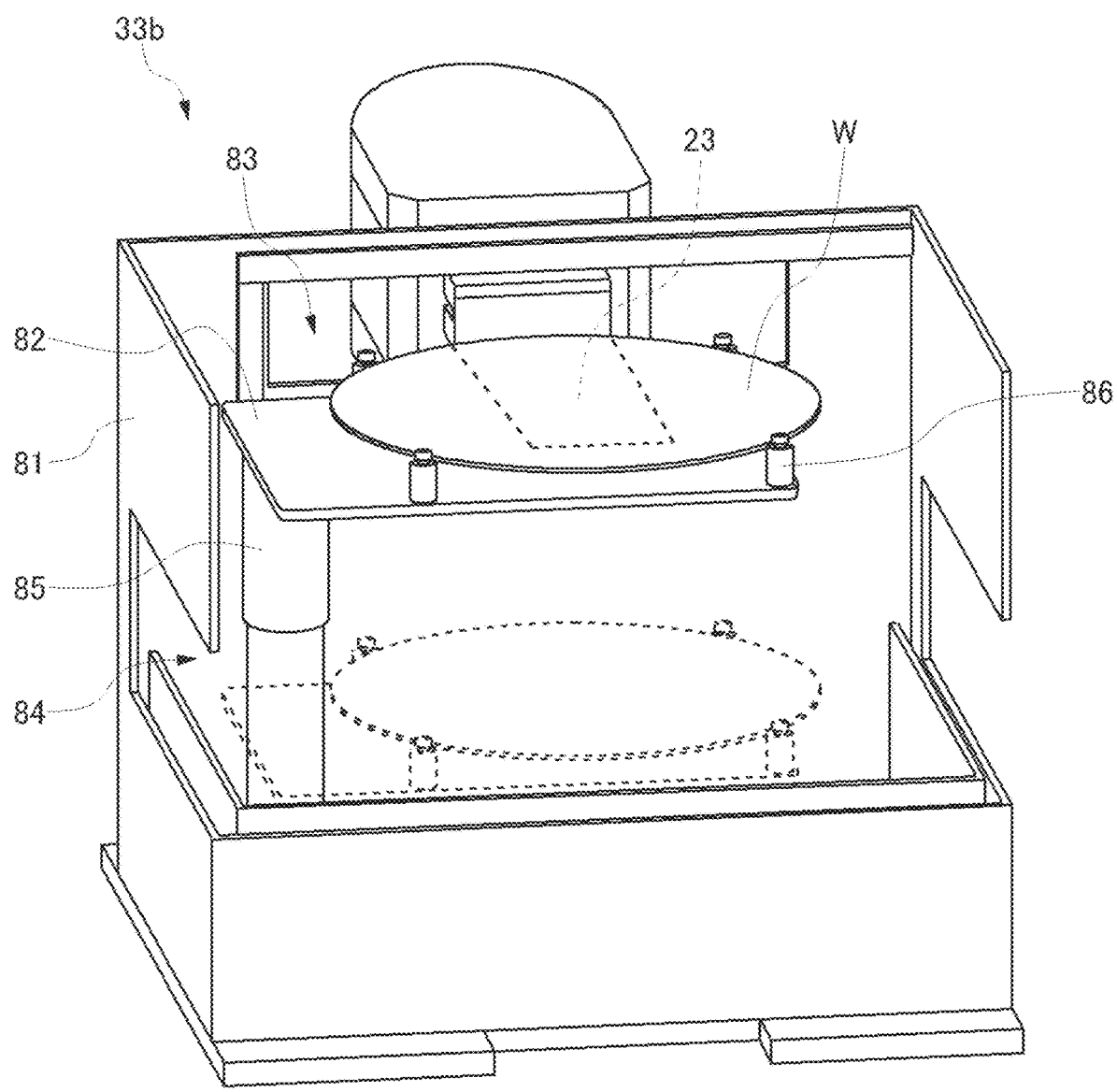
FIG. 11 is an exploded perspective view showing an internal configuration of the second wafer station shown in FIG. 10.

FIG. 10 is a perspective view of the wafer station 33b of the second cleaning unit 30b. FIG. 11 is an exploded perspective view showing the internal configuration of the wafer station 33b. As shown in FIGS. 10 and 11, the wafer station 33b includes a housing 81 having a substantially rectangular parallelepiped shape, a stage 82 that is disposed inside the housing 81, and that holds the wafer W, and a drive mechanism 85 that vertically moves the stage 82.

Among them, the housing 81 has a bottom plate, four side plates, and a top plate. As shown in FIG. 11, a carry-in port 83 communicating with the polishing section 12 is formed at the upper end part of the side plate facing the polishing section 12 among the four side plates. The carry-in port 83 is openable and closable by a shutter (not shown). As shown in FIG. 11, the transport robot 23 of the polishing section 12 can access the inside of the housing 81 through the carry-in port 83.

In addition, as shown in FIG. 10, in the remaining three side plates (that is, the side plate opposite to the polishing section 12, and the left and right side plates) among the four side plates, an arm passage opening 84 through which the arm of the cleaning section transport mechanism 32b passes is formed at a height position lower than the position of the carry-in port 83. The arm passage opening 84 is openable and closable by a shutter 87. As shown in FIG. 11, the cleaning section transport mechanism 32b of the second cleaning unit 30b is accessible to the inside of the housing 81 through the arm passage opening 84.

For example, a motor drive mechanism including a ball screw or an air cylinder is used as the drive mechanism 85. The stage 82 is fixed to the movable part of the drive mechanism 85, and vertically moves between the height position facing the carry-in port 83 and the height position facing the wafer transport opening 84 by the power provided from the drive mechanism 85 (see FIG. 11).

Four pins 86 are provided so as to protrude upward on the outer peripheral part of the stage 82. Therefore, the wafer W placed on the stage 82 is supported on the stage 82 in a state where its outer peripheral edge is guided and positioned by the four pins 86. These pins 86 are made of resin such as polypropylene (PP), polychlorotrifluoroethylene (PCTFE) or polyetheretherketone (PEEK).

Since the cleaning modules 311b to 314b of the second cleaning unit 30b have the same configuration as the cleaning modules 311a to 314a of the first cleaning unit 30a, the cleaning modules 311a to 314a of the first cleaning unit 30a will be described.

As shown in FIGS. 1 and 2, four cleaning modules 311a to 314a (hereinafter possibly referred to as first to fourth cleaning modules) are disposed in series in this order from the wafer station 33a. Each of the cleaning modules 311a to 314a has a cleaning machine (not shown) and a housing 91, as shown in FIG. 13, that covers the cleaning machine.

A roll type cleaning machine can be used as a cleaning machine of the first cleaning module 311a and the second cleaning module 312a in which for example, roll-shaped sponges disposed vertically are rotated and pressed against the front and rear surfaces of the wafer to clean the front and rear surfaces of the wafer. A pencil type cleaning machine can be used as a cleaning machine of the third cleaning module 313a in which for example, while rotating a hemispherical sponge, the sponge is pressed against a wafer for cleaning. A pencil type cleaning machine can be used as a cleaning machine of the fourth cleaning module 314a, in which for example, the rear surface of the wafer is cleaned by rinsing and while rotating a hemispherical sponge, the sponge is pressed against the wafer to clean the front surface of the wafer. The cleaning machine of the fourth cleaning module 314a has a stage that rotates the chucked wafer at a high speed, and has a function (spin dry function) of drying, by rotating the wafer at high speed, the wafer after cleaning. In addition to the roll type cleaning machine and the pencil type cleaning machine as described above, a cleaning machine of each of the cleaning modules 311a to 314a may be additionally provided with a megasonic type cleaning machine that performs washing by applying ultrasonic waves to the washing liquid.

The housing of each of the cleaning modules 311a to 314a has a bottom plate, four side plates, and a top plate as in the housing 71 of the wafer station 33a. The arm passage opening 94 through which the arm of the cleaning section transport mechanism 32a passes is formed in the side plate facing the cleaning section transport mechanism 32a and the left and right side plates among the four side plates (see FIGS. 13A to 13E). The arm passage opening 94 is openable and closable by a shutter 97. The height position of the arm passage opening 94 is the same as the height position of the arm passage opening 74 of the wafer station 33a. The cleaning section transport mechanism 32a is accessible to the inside of the housing 91 through the arm passage opening 94.

Since the cleaning section transport mechanism 32b of the second cleaning unit 30b has the same configuration as the cleaning section transport mechanism 32a of the first cleaning unit 30a, the cleaning section transport mechanism 32a of the first cleaning unit 30a will be described below.

FIG. 12 is a perspective view showing the cleaning section transport mechanism 32a of the first cleaning unit 30a. As shown in FIG. 12, the cleaning section transport mechanism 32a has a first wafer holding mechanism 601 and a second wafer holding mechanism 602 each of which holds the wafer W, an arm transport mechanism 62 that linearly moves the first wafer holding mechanism 601 and the second wafer holding mechanism 602 along the arrangement direction of the plurality of cleaning modules 311a to 314a. That is, in the present embodiment, the number of the wafer holding mechanisms 601 and 602 is smaller than the number of the cleaning modules 311a to 314a.

In the present embodiment, the first wafer holding mechanism 601 and the second wafer holding mechanism 602 can be selectively used according to the cleanliness of the wafer W, for example. For example, among the first to fourth cleaning modules 311a to 314a, the first cleaning module 311a and the second cleaning module 312a in the first half of the cleaning process use the first wafer holding mechanism 601, and the third cleaning module 313a and the fourth cleaning module 314a in the latter half of the cleaning process use the second wafer holding mechanism 602, whereby it is possible to prevent the wafer W in the latter half of the cleaning process from being contaminated by coming into contact with the first wafer holding mechanism 601.

Similarly, the first wafer holding mechanism 601 has a pair of first arms 611 that openable and closable to hold a wafer, a first vertical movement mechanism 641 that vertically moves the pair of first arms 611, a first rotating mechanism 631 that rotates the pair of first arms 611 about a rotation shaft 631A parallel to the opening and closing direction, and an first opening and closing mechanism 661 that opens and closes the pair of first arms 611 in a direction of approaching each other or in a direction of separating from each other.

Similarly, the second wafer holding mechanism 602 has a pair of second arms 612 that is openable and closable to hold a wafer, a second vertical movement mechanism 642 that vertically moves the pair of second arms 612, a second rotating mechanism 632 that rotates the pair of second arms 612 about a rotation shaft 632A parallel to the opening and closing direction, and a second opening and closing mechanism 662 that opens and closes the pair of second arms 612 in a direction of approaching each other or in a direction of separating from each other.

For example, a motor drive mechanism including a ball screw is used as the arm transport mechanism 62. As shown in FIG. 12, the ball screw of the arm transport mechanism 62 is provided above the cleaning modules 311a to 314a so as to extend in the arrangement direction of the cleaning modules 311a to 314a.

A main frame 68 is mounted to the ball screw of the arm transport mechanism 62. The main frame 68 is mounted so as to hang downward from the ball screw of the arm transport mechanism 62, and faces the side faces of the cleaning modules 311a to 314a. By driving the motor connected to the ball screw of the arm transport mechanism 62, the main frame 68 is linearly moved along the arrangement direction of the cleaning modules 311a to 314a while the main frame 68 faces the side faces of the cleaning modules 311a to 314a.

In the illustrated example, the main frame 68 has a depth direction movement mechanism 67 that adjusts the position in the depth direction (direction perpendicular to both the arrangement direction of the cleaning modules 311a to 314a and the vertical direction). For example, a motor drive mechanism including a rack and pinion is used as the depth direction movement mechanism 67. The position of the main frame 68 in the depth direction is adjusted by driving the depth direction movement mechanism 67.

The first vertical movement mechanism 641 and the second vertical movement mechanism 642 are provided on the main frame 68. For example, a motor drive mechanism including a ball screw is used as the first vertical movement mechanism 641 and the second vertical movement mechanism 642. As shown in FIG. 16, the ball screw of the first vertical movement mechanism 641 is mounted so as to extend in the vertical direction at the left end part of the main frame 68, and the ball screw of the second vertical movement mechanism 642 is mounted so as to extend in the vertical direction at the right end part of the main frame 68.

A first sub-frame 691 supporting the pair of first arms 611 is mounted to the ball screw of the first vertical movement mechanism 641. The first sub-frame 691 is provided on the left side of the main frame 68 so as to be adjacent to the main frame 68, and faces the side faces of the cleaning modules 311a to 314a. The first sub-frame 691 is linearly moved in the vertical direction by driving the motor connected to the ball screw of the first vertical movement mechanism 641.

Similarly, a second sub-frame 692 that supports the pair of second arms 612 is mounted to the ball screw of the second vertical movement mechanism 642. The second sub-frame 692 is provided on the right side of the main frame 68 so as to be adjacent to the main frame 68, and can face the side face of the cleaning modules 311a to 314a. The second sub-frame 692 is linearly moved in the vertical direction by driving the motor connected to the ball screw of the second vertical movement mechanism 642.

The first sub-frame 691 and the second sub-frame 692 have substantially the same structure except that they are symmetrical with respect to the main frame 68, and therefore the second sub-frame 692 will be described below.

As shown in FIG. 12, the pair of second arms 612 is disposed in parallel with each other, and the proximal end of the second arm 612 is mounted to the rotation shaft 632A rotatably provided on the second sub-frame 692. The second rotating mechanism 632 that rotates the pair of second arms 612 around the rotation shaft 632A is provided on the second sub-frame 692. For example, a motor drive mechanism is used as the second rotating mechanism 632. The rotation shaft of the second rotating mechanism 632 is connected to the rotation shaft 632A via a link member 632L. The rotating force of the second rotating mechanism 632 is transmitted to the rotation shaft 632A via the link member 632L, and the pair of second arms 612 is rotated about the rotation shaft 632A.

Further, on the second sub-frame 692, the second opening and closing mechanism 662 that opens and closes the pair of second arms 612 in a direction of approaching each other or in a direction of separating from each other is provided. For example, an air cylinder is used as the second opening and closing mechanism 662. When the pair of second arms 612 is closed by the second opening and closing mechanism 662, the pair of second arms 612 sandwiches and holds the peripheral edge of the wafer W.

Figure 14:
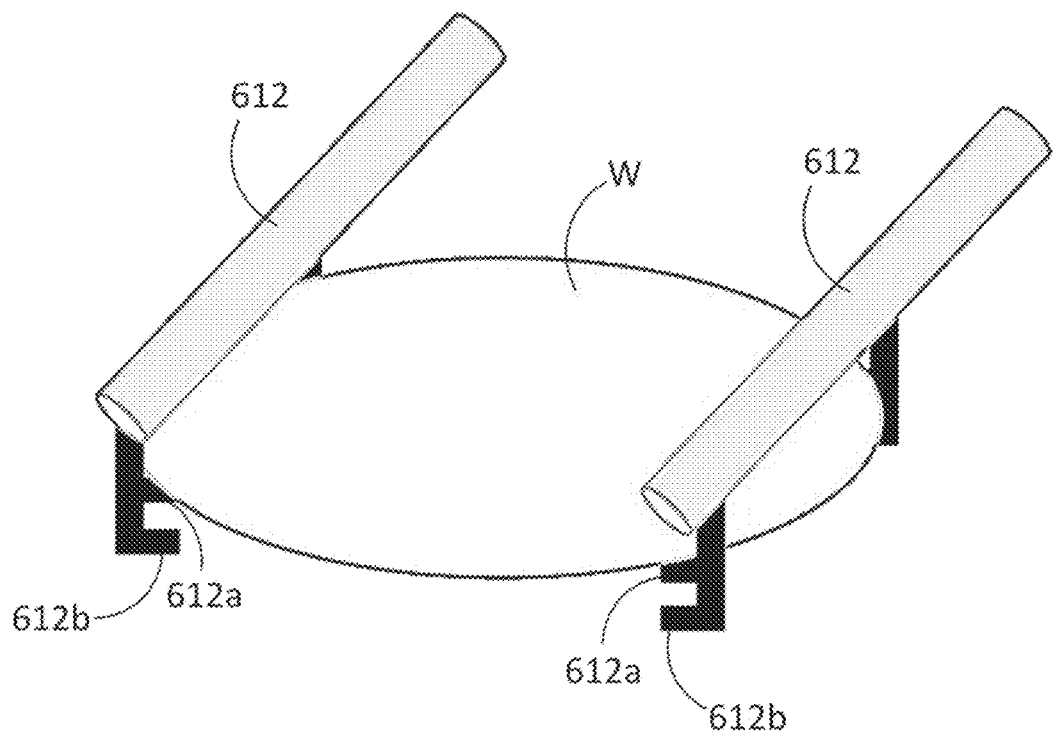
FIG. 14 is a perspective view showing a state in which the second wafer holding mechanism of the cleaning section transport mechanism shown in FIG. 12 holds the substrate by the upper stage chuck top.
Figure 15:
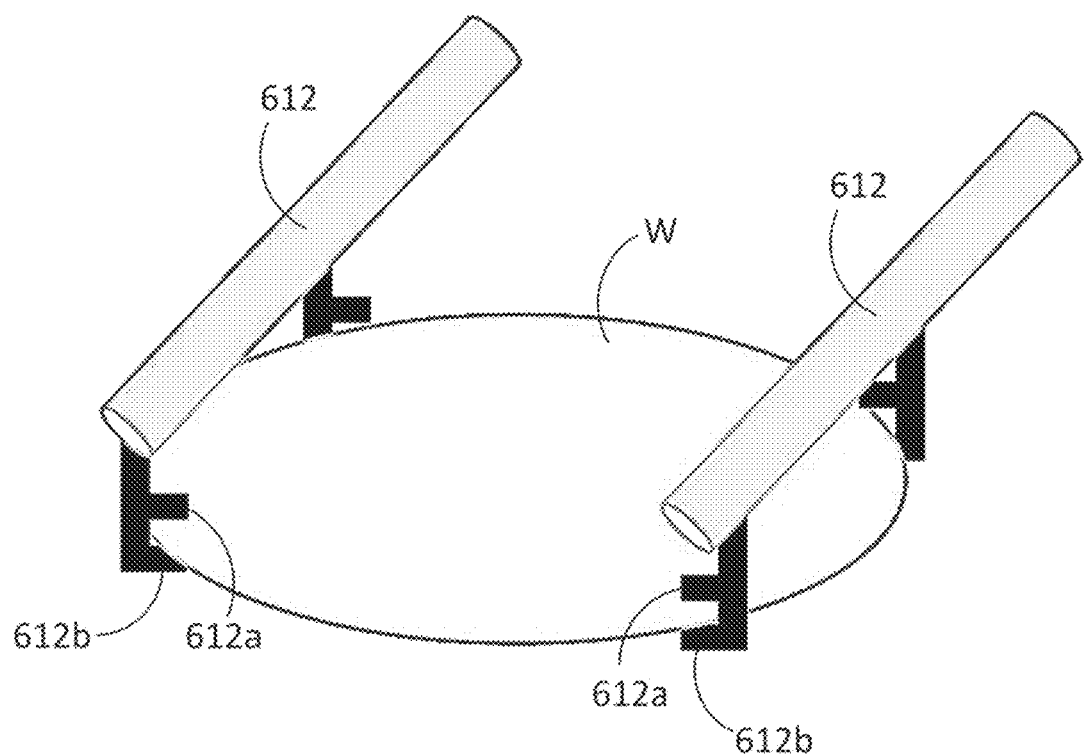
FIG. 15 is a perspective view showing a state where the second wafer holding mechanism of the cleaning section transport mechanism shown in FIG. 12 holds the substrate by the lower stage chuck top.

FIG. 14 is a perspective view showing a state where the pair of second arms 612 of the second wafer holding mechanism 602 holds the wafer W by the upper stage chuck tops 612a and 612. FIG. 15 is a perspective view showing a state where the pair of second arms 612 of the second wafer holding mechanism 602 holds the wafer W by the lower stage chuck top. As shown in FIGS. 14 and 15, in the pair of second arms 612, the chuck tops 612a and 612b capable of contacting the outer peripheral part of the wafer W are provided in upper and lower two stages. For example, the wafer W having a relatively high cleanliness is held by the upper stage chuck top 612a, and the wafer having a relatively low cleanliness is held by the lower stage chuck top 612b, so that the lower stage chuck top 612b comes into contact with the wafer W with high cleanliness, and it is possible to prevent the wafer W from being contaminated.

Next, an example of the operation of the pair of second arms 612 will be described with reference to FIGS. 13A to 13E. As described above, each cleaning module is partitioned by the housing 91 so that the used fluid does not scatter outside during the cleaning of the wafer W, and the arm passage opening 94 is formed on the side surface of the housing 91. The arm passage opening 94 is provided with the shutter 97 that can be opened and closed.

Figure 13A:
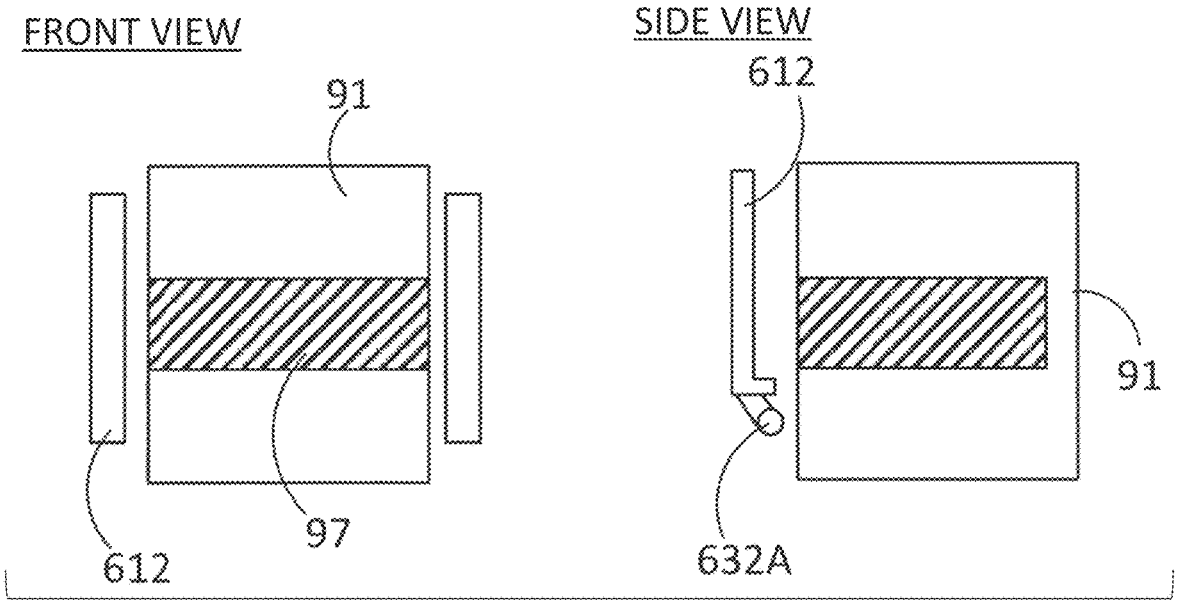
FIG. 13A is a schematic diagram for explaining the operation of the second wafer holding mechanism of the cleaning section transport mechanism shown in FIG. 12.

When taking out the cleaned wafer W from the housing 91, as shown in FIG. 13A, the pair of second arms 612 with their tips facing upward is moved to the waiting position adjacent to the housing 91 by driving the arm transport mechanism 62. In the present embodiment, even when the shutter 97 of the housing 91 is closed, the pair of second arms 612 can be moved to the waiting position adjacent to the housing 91 by placing the tips of the pair of second arms 612 upward. Therefore, it is possible to make the start timing of the wafer take-out operation faster to improve the throughput of the whole process.

Figure 13B:
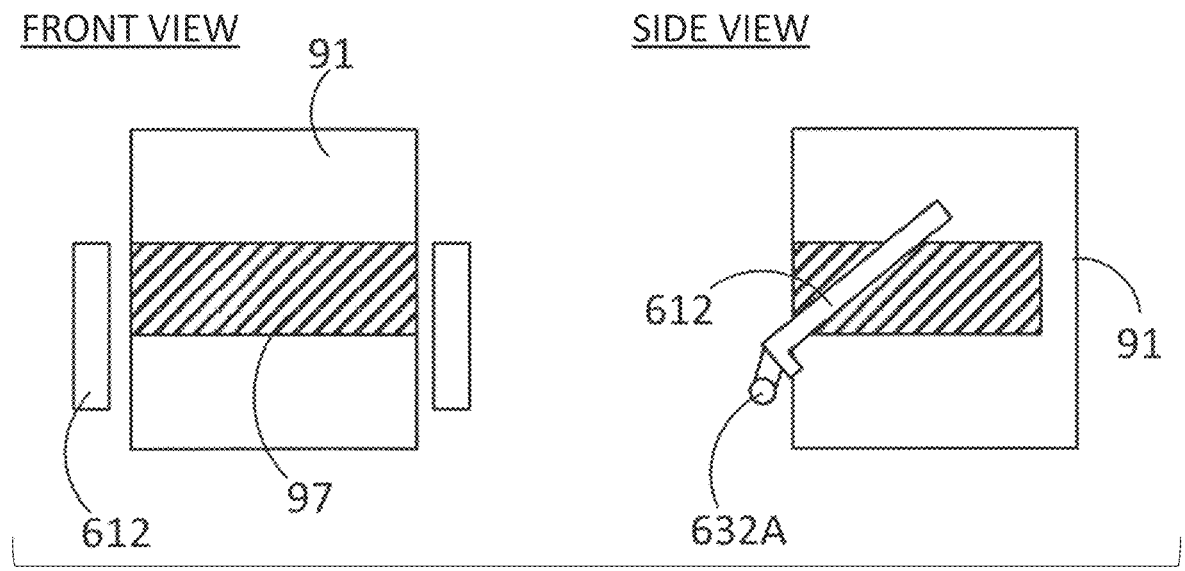
FIG. 13B is a schematic diagram for explaining the operation of the second wafer holding mechanism of the cleaning section transport mechanism shown in FIG. 12.
Figure 13C:
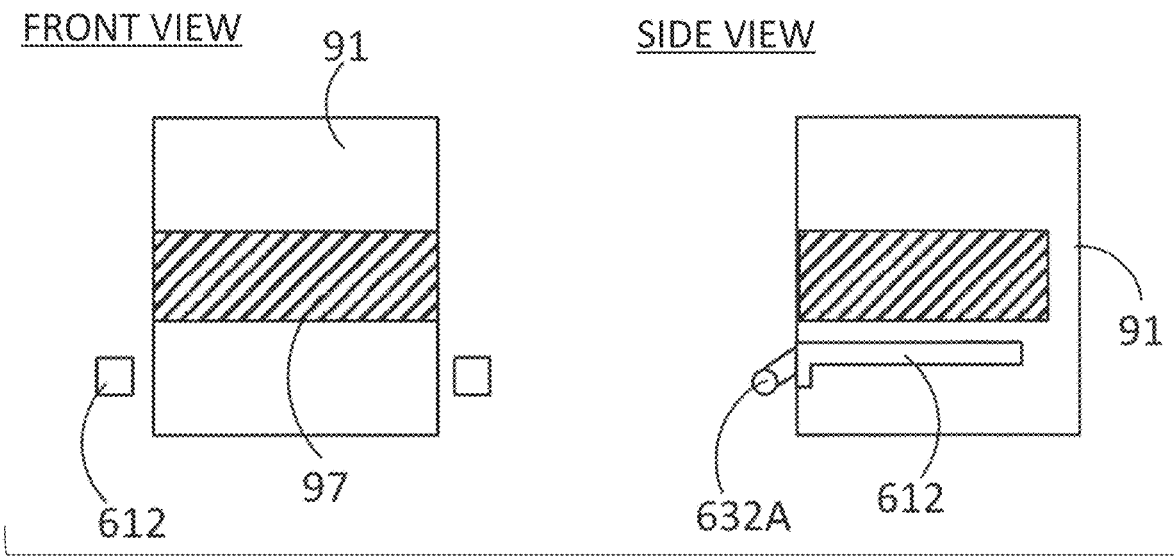
FIG. 13C is a schematic diagram for explaining the operation of the second wafer holding mechanism of the cleaning section transport mechanism shown in FIG. 12.

Next, as shown in FIGS. 13B and 13C, the pair of second arms 612 is rotated about the rotation shaft 632A by driving the second rotating mechanism 632. In the illustrated example, the pair of second arms 612 is rotated clockwise by 90° about the rotation shaft 632A in side view, and the tips of the pair of second arms 612 are directed sideways.

Figure 13D:
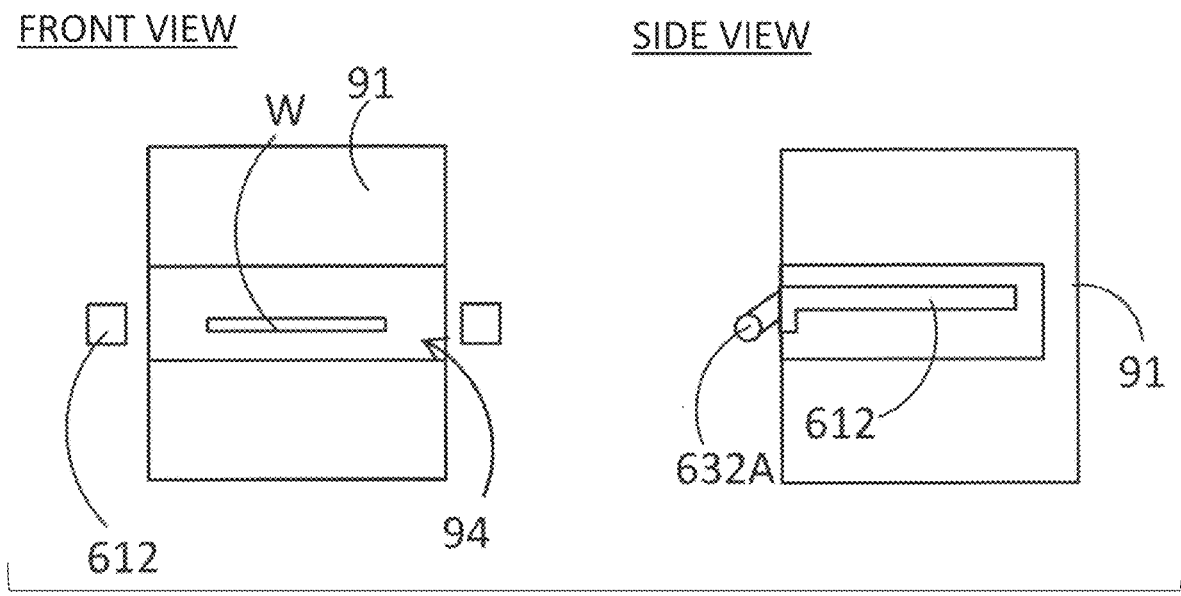
FIG. 13D is a schematic diagram for explaining the operation of the second wafer holding mechanism of the cleaning section transport mechanism shown in FIG. 12.

Next, as shown in FIG. 13D, the pair of second arms 612 is raised to the height position same as that of the arm passage opening 94 by driving the second vertical drive mechanism 642. At this time, the shutter 97 is retracted and the arm passage opening 94 is opened.

Figure 13E:
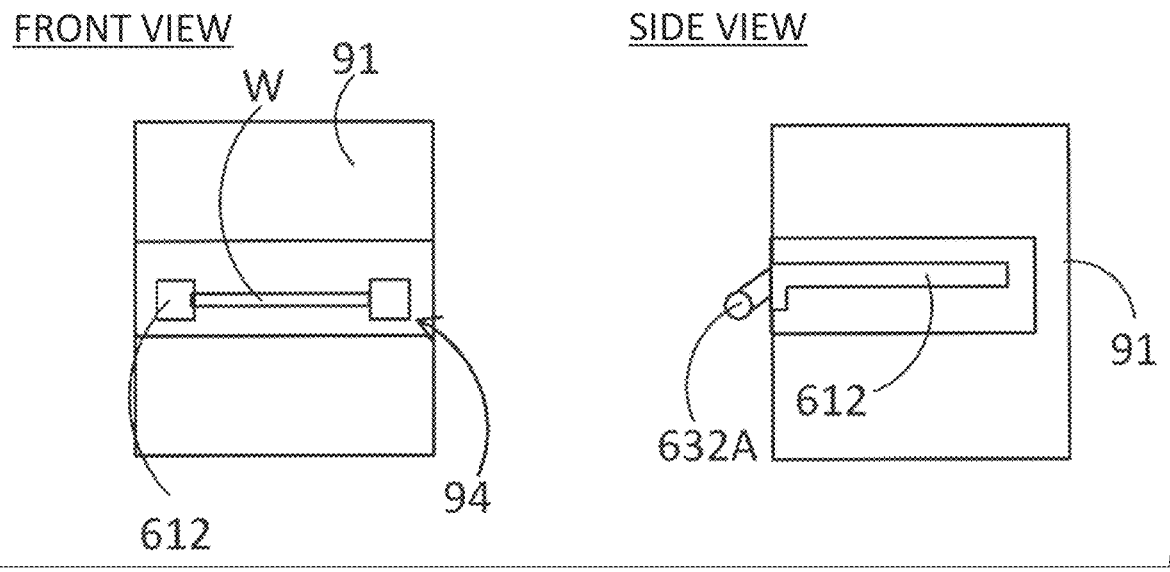
FIG. 13E is a schematic diagram for explaining the operation of the second wafer holding mechanism of the cleaning section transport mechanism shown in FIG. 12.

Next, as shown in FIG. 13E, by driving the second opening and closing mechanism 662, the pair of second arms 612 is closed in the direction in which they approach each other, and are inserted into the housing 91 through the arm passage opening 94, and hold the wafer W in the housing 91. Then, as shown in FIG. 13F, the pair of second arms 612 holding the wafer W slightly ascend to avoid interference with the pins (not shown) of the stage, and then is moved to the cleaning module by driving the arm transport mechanism 62.

Figure 13F:
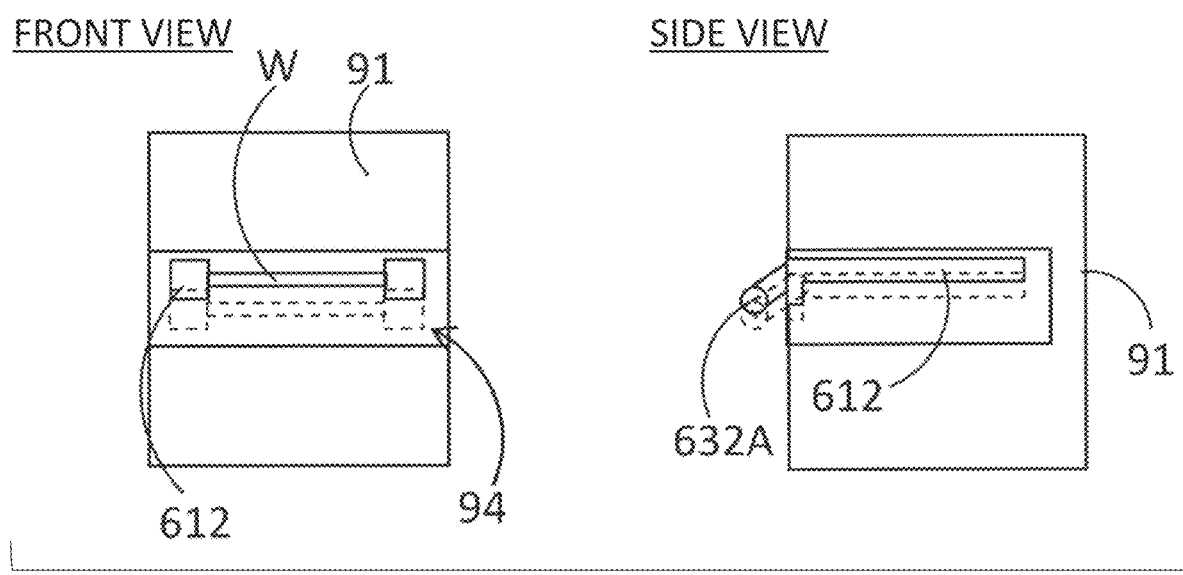
FIG. 13F is a schematic diagram for explaining the operation of the second wafer holding mechanism of the cleaning section transport mechanism shown in FIG. 12.

When the wafer W before cleaning is loaded inside of the housing 91, the above-described operations shown in FIGS. 13A to 13F are performed in the reverse order. That is, as shown in FIG. 13F, the pair of second arms 612 holding the wafer W is moved to the inside of the housing 91 through the arm passage opening 94 by driving the arm transport mechanism 62, and then, as shown in FIG. 13E, is lowered to the height of the pin (not shown) of the stage.

Next, as shown in FIG. 13D, the pair of second arms 612 are opened in a direction in which they are separated from each other by driving the second opening and closing mechanism 662, and is exposed to the outside of the housing 91 through the arm passage openings 94.

Next, as shown in FIG. 13C, the pair of second arms 612 is lowered to a height position lower than that of the arm passage opening 94 by driving the second vertical drive mechanism 642. At this time, the arm passage opening 94 is performed by the shutter 97, and the cleaning process of the wafer W is started inside of the housing 91.

Next, as shown in FIGS. 13B and 13A, the pair of second arms 612 is rotated about the rotation shaft 632A by driving the second rotating mechanism 632. In the illustrated example, the pair of second arms 612 is rotated 90° counterclockwise about the rotation shaft 632A in side view, and the tips of the pair of second arms 612 are directed upward. Then, the pair of second arms 612 whose tips are directed upward is moved to the next cleaning module by driving the arm transport mechanism 62. In the present embodiment, when the second rotating mechanism 632 rotates the pair of second arms 612 so that their tips are directed upward, the second vertical movement mechanism 642 lowers the pair of second arms 612, so that it is possible to reduce the space required above the pair of second arms 612.

In each of the cleaning modules 311a to 314a and 311b to 314b, a plurality of wafers W can be cleaned in parallel. With reference to FIGS. 29A to 29I, as an example, the operation of the cleaning section transport mechanism 32a when cleaning a plurality of wafers W in parallel by the first to third cleaning modules 311a to 313a of the first cleaning unit 30a will be described.

Figure 29A:
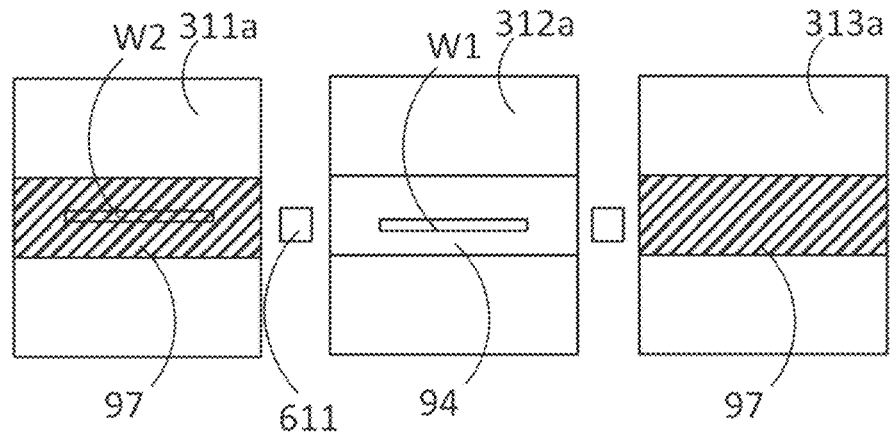
FIG. 29A is a schematic diagram for explaining an example of the operation of the cleaning section transport mechanism when cleaning a plurality of wafers in parallel in each cleaning module.

First, as shown in FIG. 29A, it is assumed that in the first cleaning module 311a, the shutter 97 is closed and the first stage cleaning is being performed on a second wafer W2, and in the second cleaning module 312a, the arm passage opening 94 is opened after the second stage cleaning of a first wafer W1 is completed. In this case, the pair of first arms 611 is moved to the waiting position for the second cleaning module 312a, and the tips of the pair of first arms 611 are directed sideways.

Figure 29B:
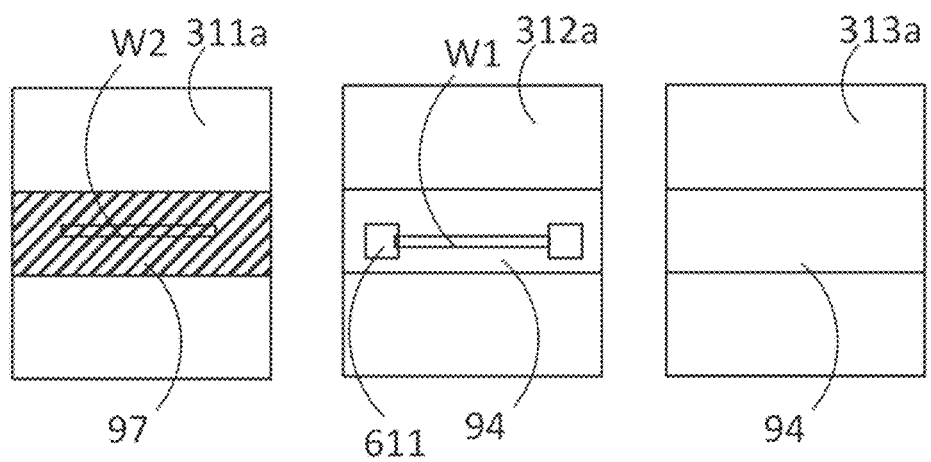
FIG. 29B is a schematic diagram for explaining an example of the operation of the cleaning section transport mechanism when cleaning a plurality of wafers in parallel in each cleaning module.

Then, as shown in FIG. 29B, the pair of first arms 611 are closed so as to be close to each other, and the first wafer W1 in the second cleaning module 312a is held by the pair of first arms 611. Further, the shutter 97 of the third cleaning module 313a is retracted and the arm passage opening 94 is opened.

Figure 29C:
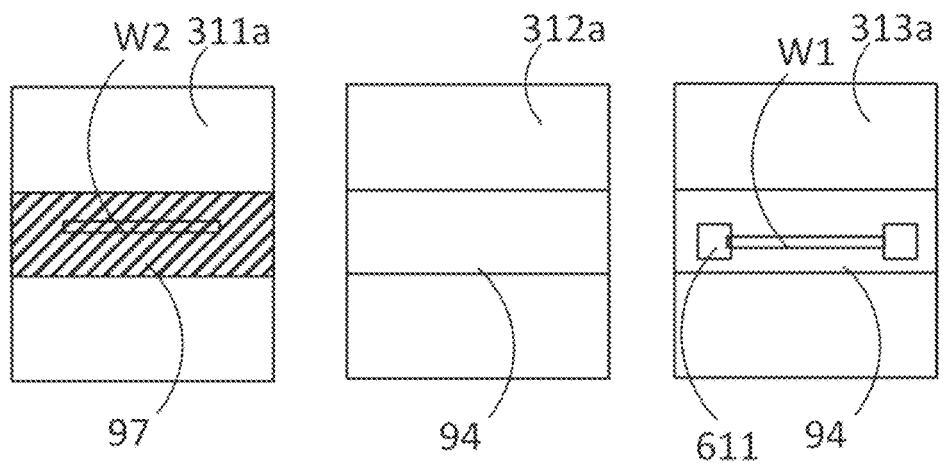
FIG. 29C is a schematic diagram for explaining an example of the operation of the cleaning section transport mechanism when cleaning a plurality of wafers in parallel in each cleaning module.

Next, as shown in FIG. 29C, the first wafer W1 held by the pair of first arms 611 is moved from the second cleaning module 312a to the third cleaning module 313a through the arm passage opening 94.

Figure 29D:
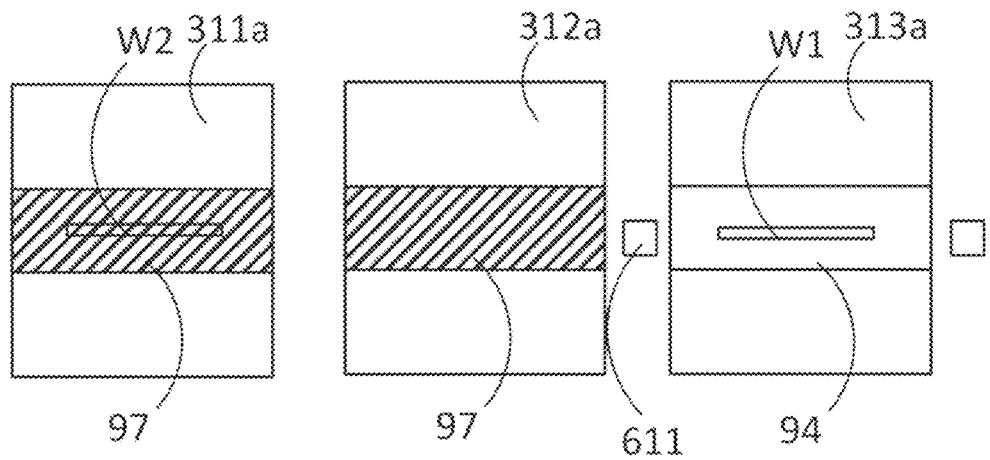
FIG. 29D is a schematic diagram for explaining an example of the operation of the cleaning section transport mechanism when cleaning a plurality of wafers in parallel in each cleaning module.

Then, as shown in FIG. 29D, the pair of first arms 611 are opened so as to be separated from each other, and are brought out to the left and right outside of the third cleaning module 313a. In the second cleaning module 312a, the shutter 97 is closed to prevent drying.

Figure 29E:
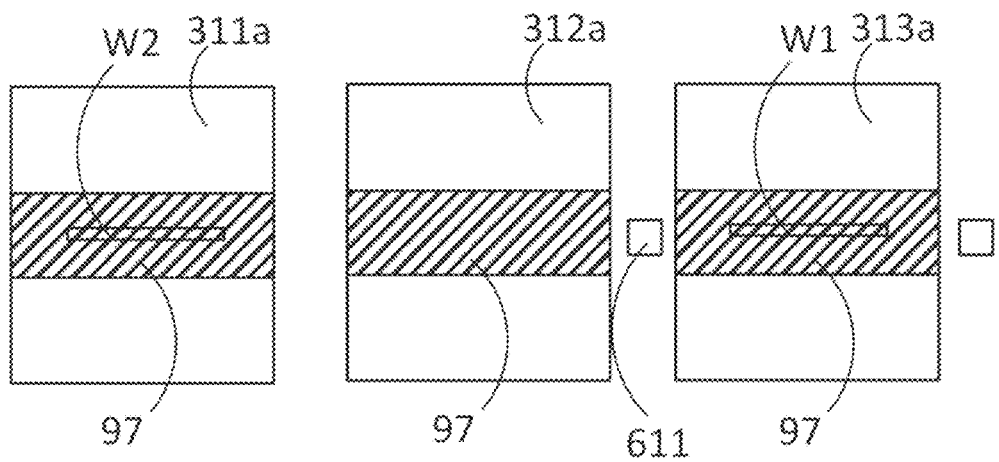
FIG. 29E is a schematic diagram for explaining an example of the operation of the cleaning section transport mechanism when cleaning a plurality of wafers in parallel in each cleaning module.

Next, as shown in FIG. 29E, the shutter 97 of the third cleaning module 313a is closed, and the third cleaning module 313a performs the third stage cleaning on the first wafer W1.

Figure 29F:
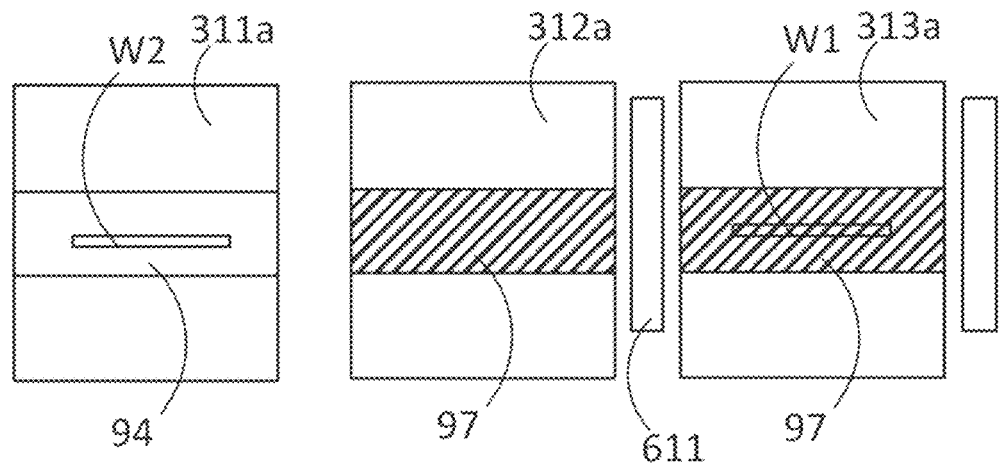
FIG. 29F is a schematic diagram for explaining an example of the operation of the cleaning section transport mechanism when cleaning a plurality of wafers in parallel in each cleaning module.

Next, as shown in FIG. 29F, when the first stage cleaning of the second wafer W2 in the first cleaning module 311a is completed, the shutter 97 of the first cleaning module 311a is retracted and the arm passage opening 94 is opened. At this time, the pair of first arms 611 is rotated by the rotating mechanism, and the tips of the pair of first arms 611 are directed upward.

Figure 29G:
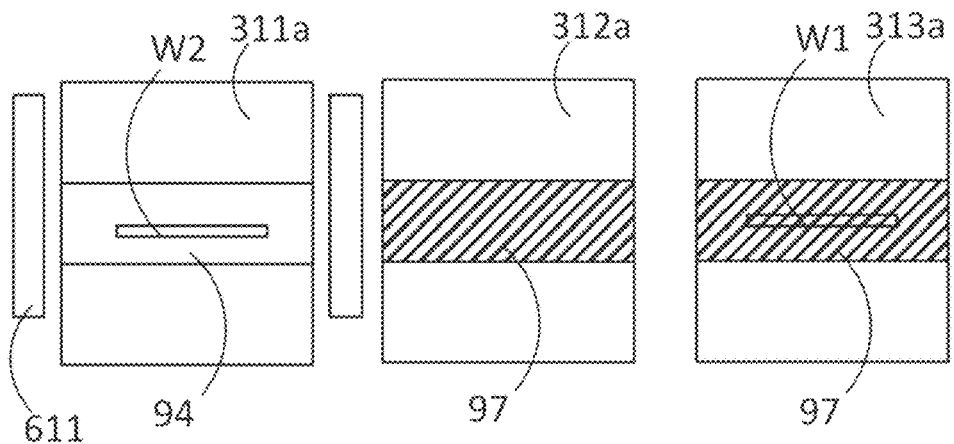
FIG. 29G is a schematic diagram for explaining an example of the operation of the cleaning section transport mechanism when cleaning a plurality of wafers in parallel in each cleaning module.

As shown in FIG. 29G, the pair of first arms 611 is moved so as to avoid (skip) the third cleaning module 313a and the second cleaning module 312a whose the shutters 97 are closed, and is disposed at the waiting position of the first cleaning module 311a.

Figure 29H:
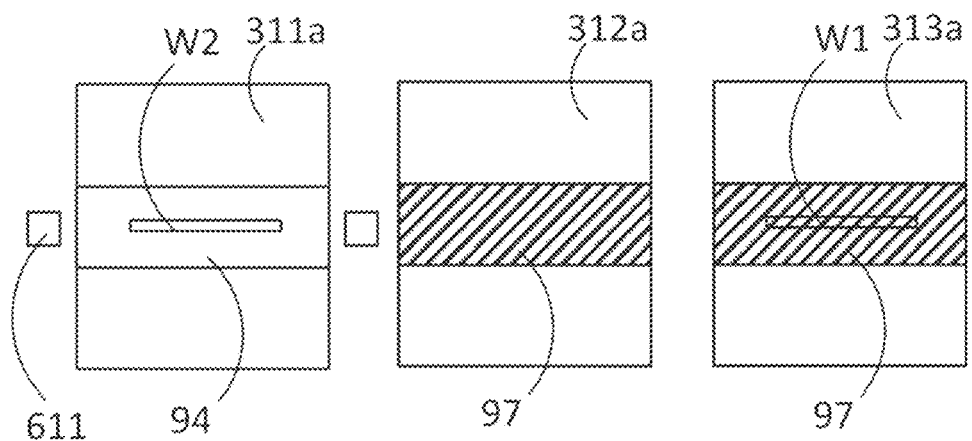
FIG. 29H is a schematic diagram for explaining an example of the operation of the cleaning section transport mechanism when cleaning a plurality of wafers in parallel in each cleaning module.
Figure 29I:
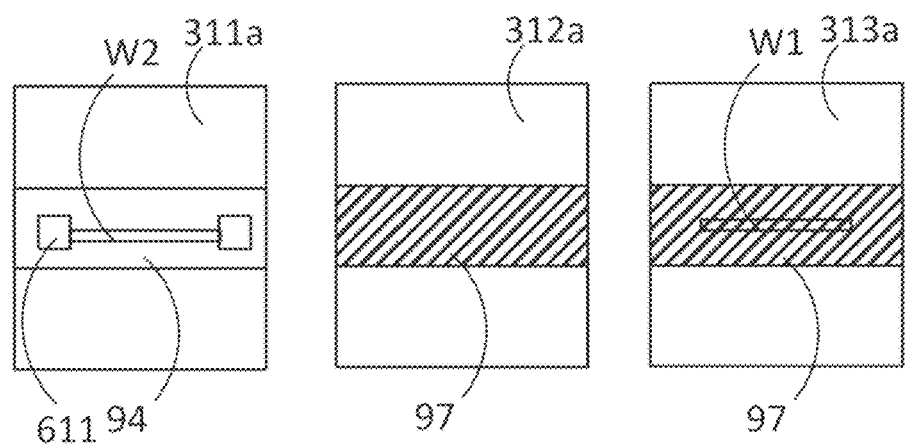
FIG. 29I is a schematic diagram for explaining an example of the operation of the cleaning section transport mechanism when cleaning a plurality of wafers in parallel in each cleaning module.

Next, as shown in FIG. 29H, the pair of first arms 611 is rotated by the rotating mechanism, and the tips of the pair of first arms 611 are directed sideways. Then, as shown in FIG. 29I, the pair of first arms 611 are closed so as to be close to each other, and the second wafer W2 in the first cleaning module 311a is held by the pair of first arms 611. After that, the second wafer W2 held by the pair of first arms 611 is transported to the second cleaning module 312a, and the second stage cleaning is performed.

As described above, in the present embodiment, since a plurality of wafers W can be cleaned in parallel in each of the cleaning modules 311a to 314a and 311b to 314b, the throughput of the entire process can be improved.

Next, referring to FIGS. 30A to 30I, a modification of the operation of the cleaning section transport mechanism 32a when cleaning a plurality of wafers W in parallel by the first to third cleaning modules 311a to 313a of the first cleaning unit 30a will be described.

Figure 30A:
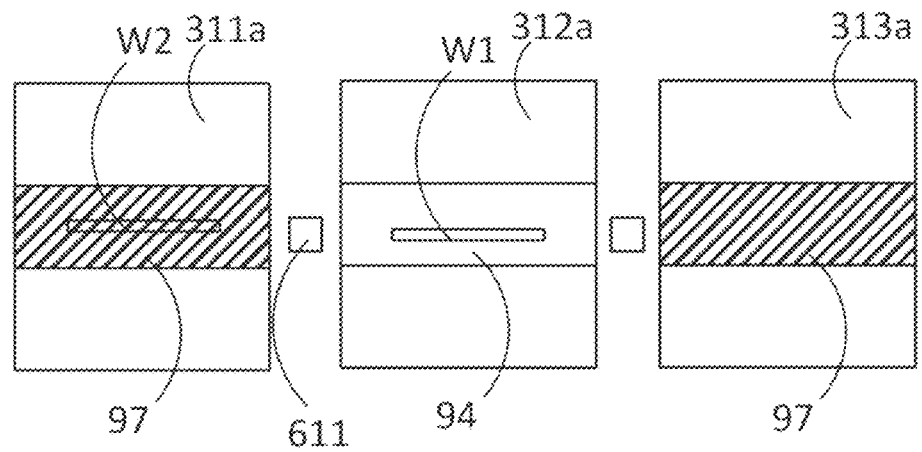
FIG. 30A is a schematic diagram for explaining a modification of the operation of the cleaning section transport mechanism when cleaning a plurality of wafers in parallel in each cleaning module.

First, as shown in FIG. 30A, it is assumed that in the first cleaning module 311a, the shutter 97 is closed and the first stage cleaning is being performed on a second wafer W2, and in the second cleaning module 312a, the arm passage opening 94 is opened after the second stage cleaning of a first wafer W1 is completed. In this case, the pair of first arms 611 is moved to the waiting position for the second cleaning module 312a, and the tips of the pair of first arms 611 are directed sideways.

Figure 30B:
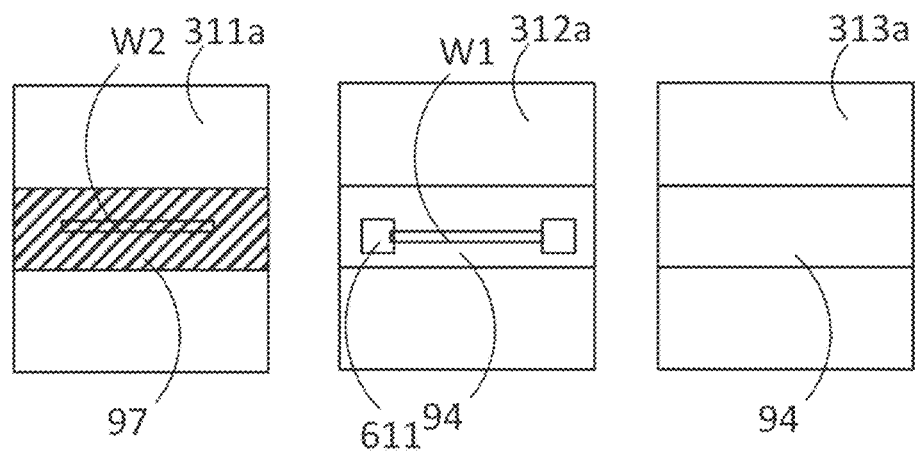
FIG. 30B is a schematic diagram for explaining a modification of the operation of the cleaning section transport mechanism when cleaning a plurality of wafers in parallel in each cleaning module.

Then, as shown in FIG. 30B, the pair of first arms 611 are closed so as to be close to each other, and the first wafer W1 in the second cleaning module 312a is held by the pair of first arms 611. Further, the shutter 97 of the third cleaning module 313a is retracted and the arm passage opening 94 is opened.

Figure 30C:
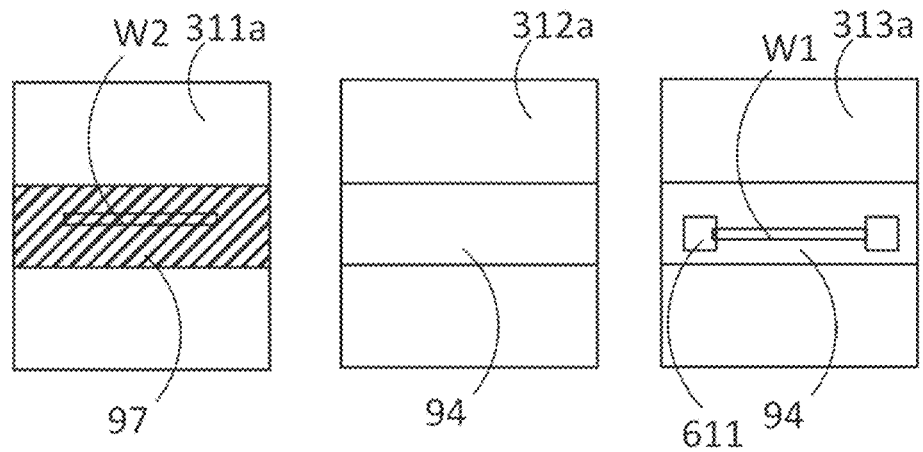
FIG. 30C is a schematic diagram for explaining a modification of the operation of the cleaning section transport mechanism when cleaning a plurality of wafers in parallel in each cleaning module.

Next, as shown in FIG. 30C, the first wafer W1 held by the pair of first arms 611 is moved from the second cleaning module 312a to the third cleaning module 313a through the arm passage opening 94.

Figure 30D:
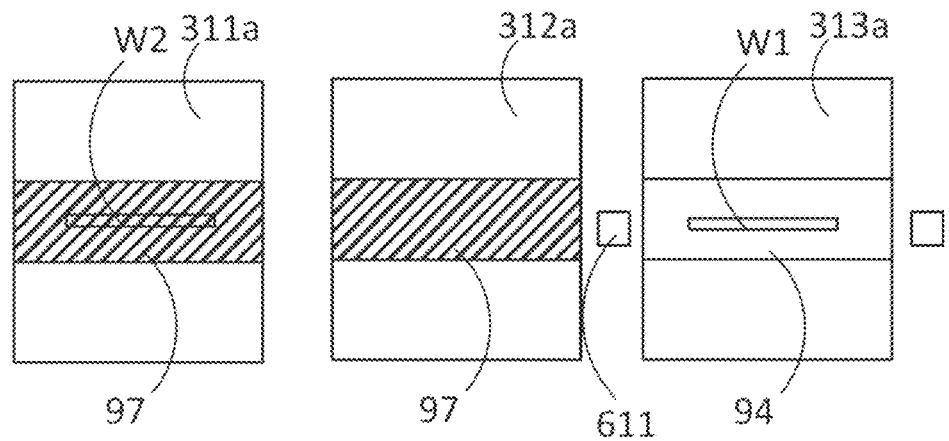
FIG. 30D is a schematic diagram for explaining a modification of the operation of the cleaning section transport mechanism when cleaning a plurality of wafers in parallel in each cleaning module.

Then, as shown in FIG. 30D, the pair of first arms 611 are opened so as to be separated from each other, and are brought out to the left and right outside of the third cleaning module 313a. The shutter 97 of the second cleaning module 312 is closed.

Figure 30E:
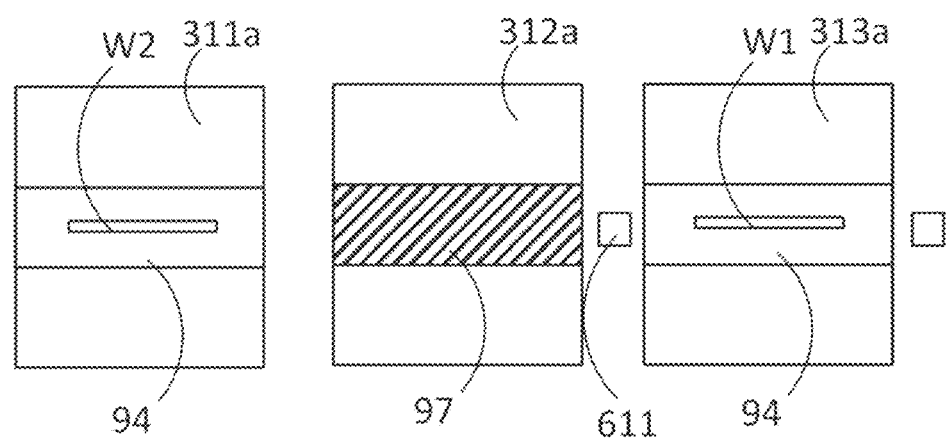
FIG. 30E is a schematic diagram for explaining a modification of the operation of the cleaning section transport mechanism when cleaning a plurality of wafers in parallel in each cleaning module.

Then, as shown in FIG. 30E, when the first stage cleaning of the second wafer W2 in the first cleaning module 311a is completed before the third stage cleaning of the first wafer W1 in the third cleaning module 313a is started, the shutter 97 of the first cleaning module 311a is retracted and the arm passage opening 94 is opened.

Figure 30F:
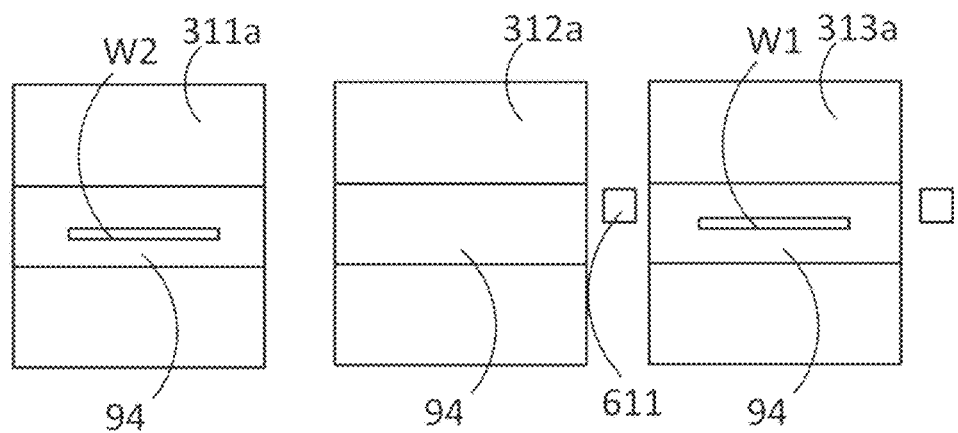
FIG. 30F is a schematic diagram for explaining a modification of the operation of the cleaning section transport mechanism when cleaning a plurality of wafers in parallel in each cleaning module.

At this time, as shown in FIG. 30F, the pair of first arms 611 is raised to a position higher than that of the first wafer W1. Further, the shutter 97 of the second cleaning module 312a is retracted and the arm passage opening 94 is opened.

Figure 30G:
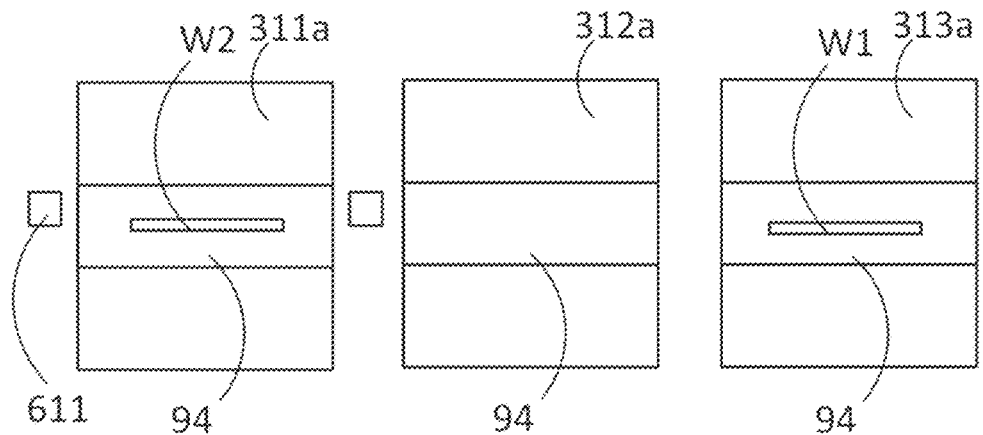
FIG. 30G is a schematic diagram for explaining a modification of the operation of the cleaning section transport mechanism when cleaning a plurality of wafers in parallel in each cleaning module.

As shown in FIG. 30G, the pair of first arms 611 is moved so as to pass through the arm passage openings 94 of the third cleaning module 313a and the second cleaning module 312a while the tips thereof are directed sideways, and is disposed at the waiting position of the first cleaning module 311a.

Figure 30H:
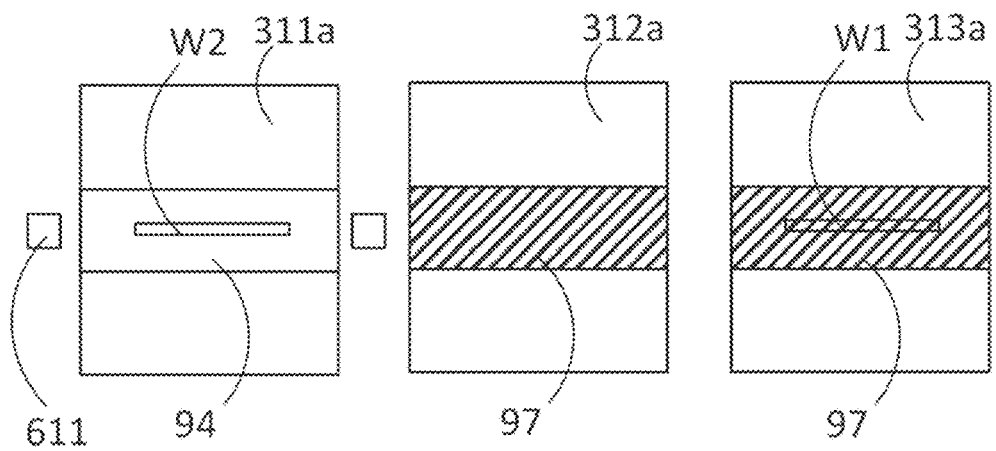
FIG. 30H is a schematic diagram for explaining a modification of the operation of the cleaning section transport mechanism when cleaning a plurality of wafers in parallel in each cleaning module.

Next, as shown in FIG. 30H, the pair of first arms 611 is lowered to the height position same as that of the second wafer W2. On the other hand, in the third cleaning module 313a, the shutter 97 is closed and the third stage cleaning of the first wafer W1 is started. In the second cleaning module 312a, the shutter 97 is closed to prevent drying.

Figure 30I:
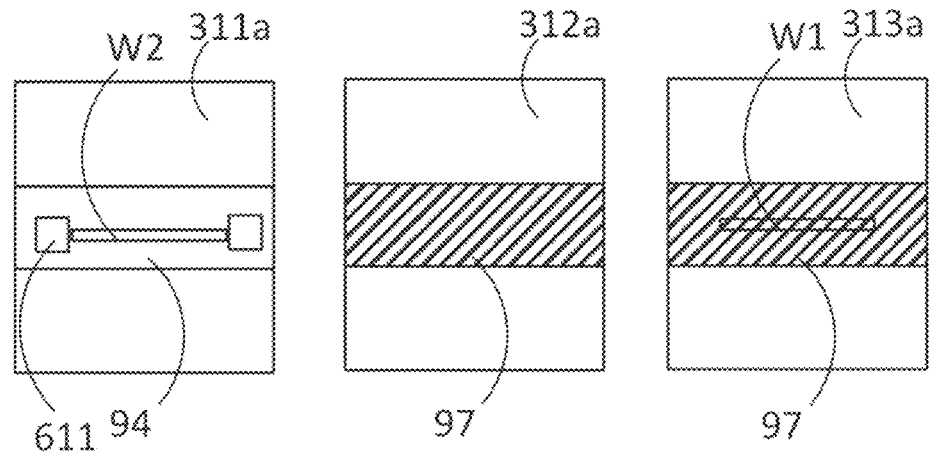
FIG. 30I is a schematic diagram for explaining a modification of the operation of the cleaning section transport mechanism when cleaning a plurality of wafers in parallel in each cleaning module.

Then, as shown in FIG. 30I, the pair of first arms 611 is closed so as to be close to each other, and the second wafer W2 in the first cleaning module 311a is held by the pair of first arms 611. After that, the second wafer W2 held by the pair of first arms 611 is transported to the second cleaning module 312a, and the second stage cleaning is performed.

According to the modification as described above, the operation of rotating the pair of first arms 611 can be omitted when moving the pair of first arms 611 from the third cleaning module 313a to the first cleaning module 311a. Therefore, the throughput of the whole process can be improved.

On the other hand, as in the example shown in FIGS. 29A to 29I, when the pair of first arms 611 is moved so as to avoid (skip) the third cleaning module 313a and the second cleaning module 312a with the shutter 97 closed by rotating the pair of first arms 611, since the pair of first arms 611 does not pass above the first wafer W1 in the third cleaning module 313a, the cleaning liquid falling from the pair of first arms 611 can be prevented from adhering to the surface of the first wafer W1. In addition, the third stage cleaning of the first wafer W1 in the third cleaning module 313a can be started earlier.

Each the cleaning modules 311a to 314a and 311b to 314b has a detector (not shown) that detects a failure. When a failure occurs in any of the cleaning modules 311a to 314a and 311b to 314b, the detector detects the failure and sends a signal to the control unit 15 in FIG. 1. The control unit 15 selects a cleaning line that allows the failed cleaning module to be avoided, and switches the current cleaning line to the newly selected cleaning line.

Figure 22A:
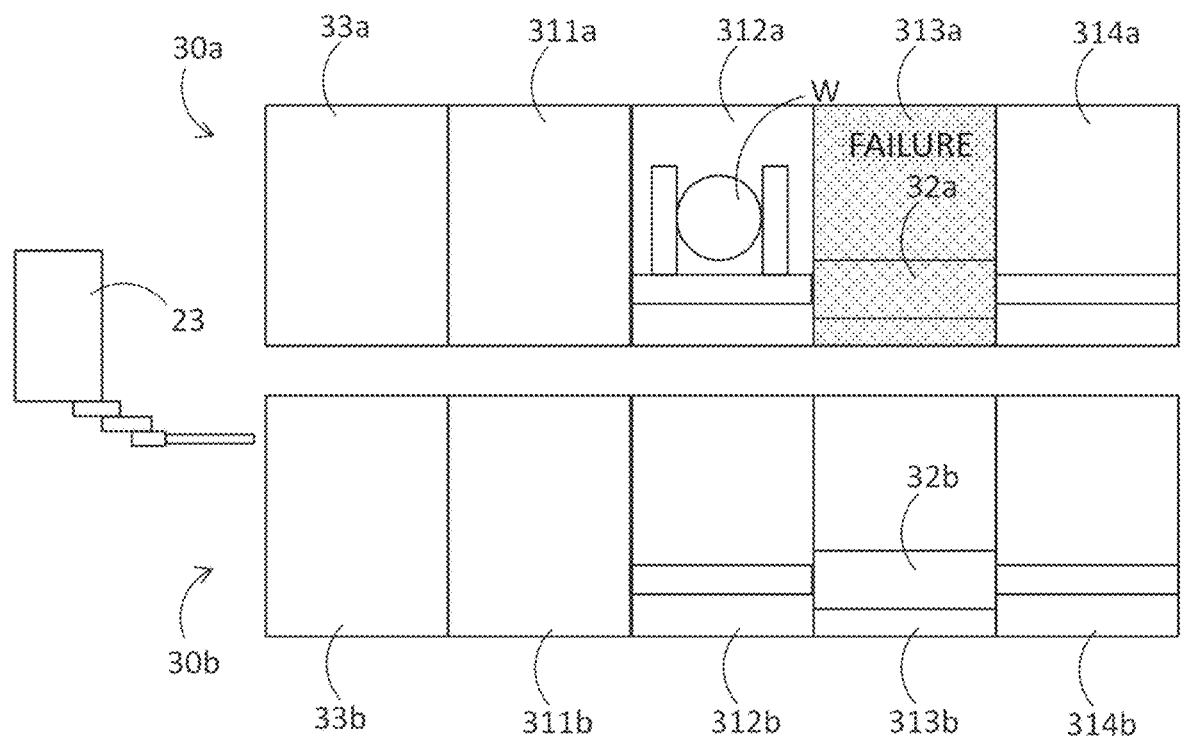
FIG. 22A is a schematic diagram for explaining an operation when an abnormality occurs in the first cleaning unit.
Figure 22B:
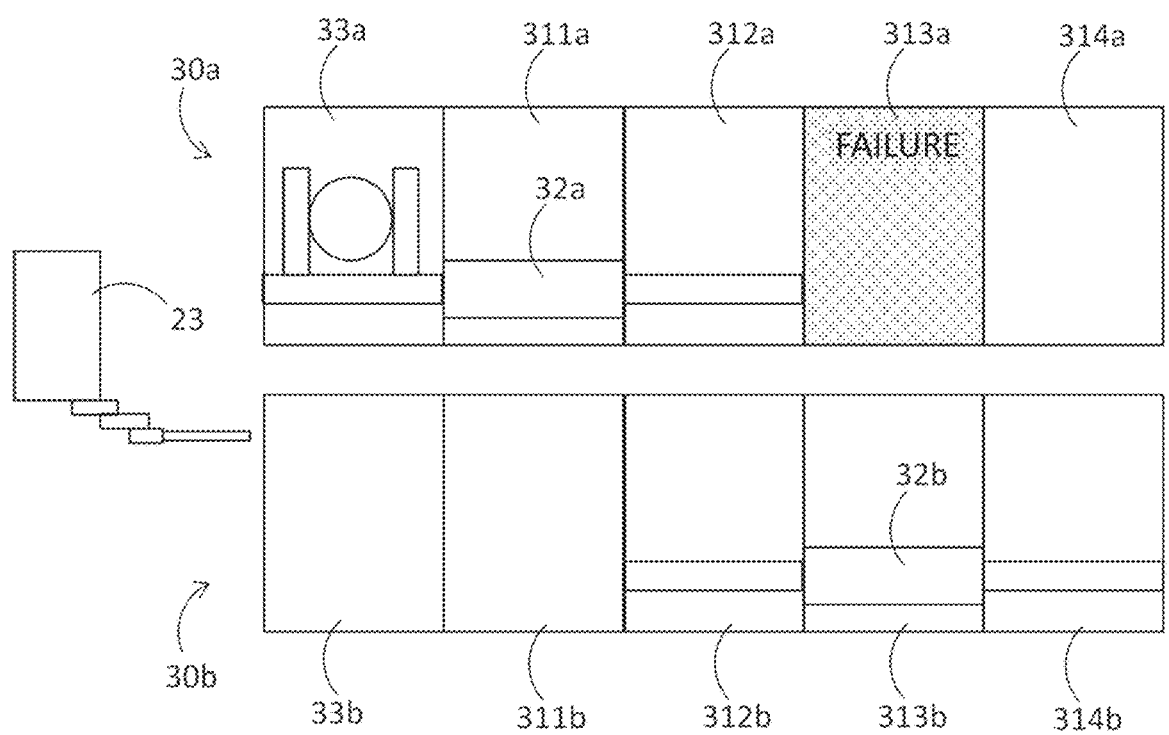
FIG. 22B is a schematic diagram for explaining an operation when an abnormality occurs in the first cleaning unit.

More specifically, for example, as shown in FIG. 22A, when an abnormality occurs in the third cleaning module 313a of the first cleaning unit 30a, the wafer W located in the second cleaning module 312a is held by the first arms 611 of the cleaning section transport mechanism 32a. Then, as shown in FIG. 22B, with the second arms 612 of the cleaning section transport mechanism 32a having its tip directed upward, the wafer held by the first arms 611 is transported to the first wafer station 33a by driving the arm transport mechanism 62. At this time, even when the shutter 97 of the third cleaning module 313a fails and remains closed, since the tip of the second arms 612 is directed upward, it is possible to move the second arm 612 to avoid (skip) the third cleaning module 313a without interfering with the shutter 97.

Figure 22C:
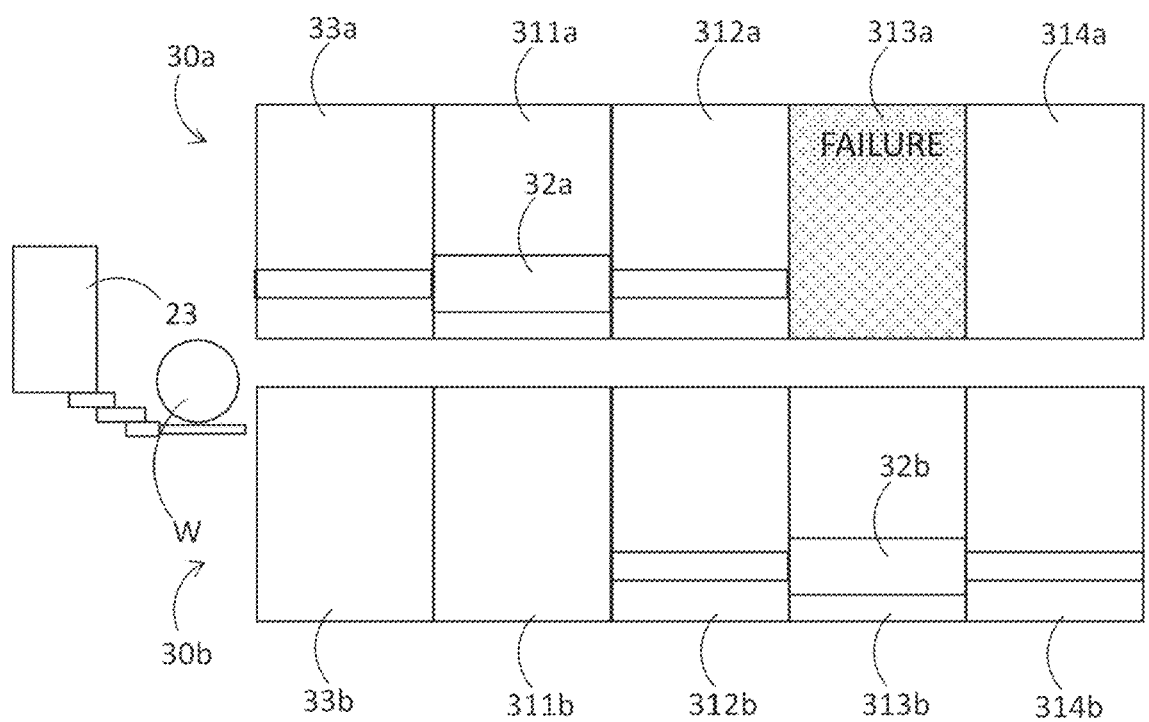
FIG. 22C is a schematic diagram for explaining an operation when an abnormality occurs in the first cleaning unit.
Figure 22D:
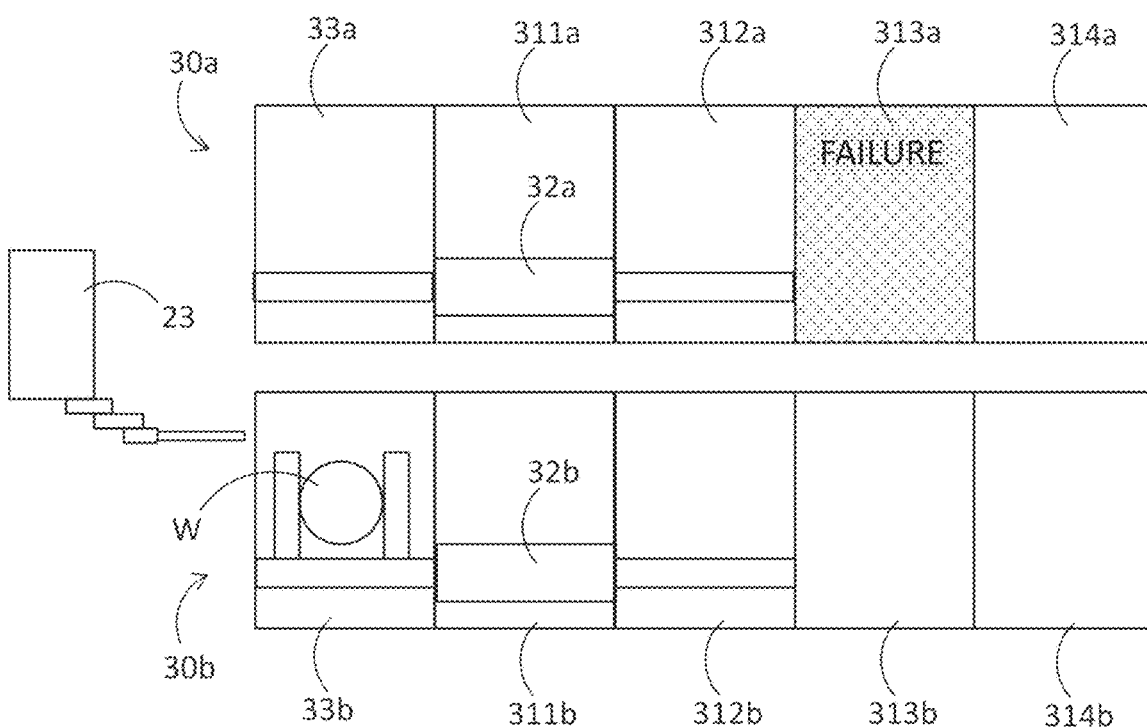
FIG. 22D is a schematic diagram for explaining an operation when an abnormality occurs in the first cleaning unit.
Figure 22E:
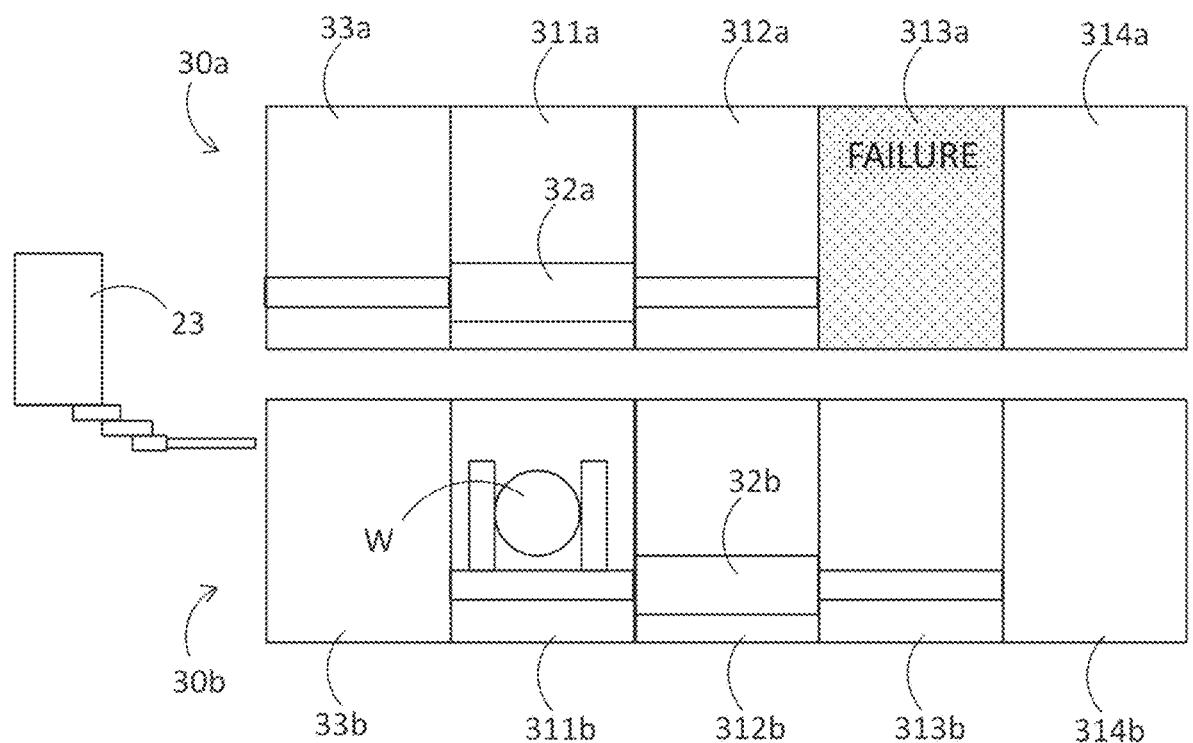
FIG. 22E is a schematic diagram for explaining an operation when an abnormality occurs in the first cleaning unit.

Next, as shown in FIGS. 22C and 22D, the transport robot 23 of the polishing section 12 takes out the wafer W from the first wafer station 33a and transfers it to the second wafer station 33b. The wafer W transferred to the second wafer station 33b is held by the first arms 611 of the cleaning section transport mechanism 32b. Then, as shown in FIG. 22E, the wafer W held by the first arms 611 is transported to the first cleaning module 311b by driving the arm transport mechanism 62, and cleaned.

In this way, in this embodiment, even when an abnormality occurs in any of the plurality of first cleaning modules 311a to 314a, since the wafer W located in the first cleaning modules 311a to 314a is transported to the second cleaning modules 311b to 314b and cleaned, the wafer W located in the first cleaning modules 311a to 314a can be rescued. Similarly, even when an abnormality occurs in any of the plurality of second cleaning modules 311b to 314b, since the wafer W located in the second cleaning modules 311b to 314b is transported to the first cleaning modules 311a to 314a and cleaned, the wafer W located in the second cleaning modules 311b to 314b can be rescued.

As shown in FIG. 12, in the present embodiment, the first wafer holding mechanism 601 and the second wafer holding mechanism 602 are disposed in a suspended manner below the arm transport mechanism 62. As a result, the maintenance space for the first wafer holding mechanism 601 and the second wafer holding mechanism 602 can be expanded. Therefore, the time required for maintenance can be shortened.

<Preliminary Cleaning Module>

Figure 27:
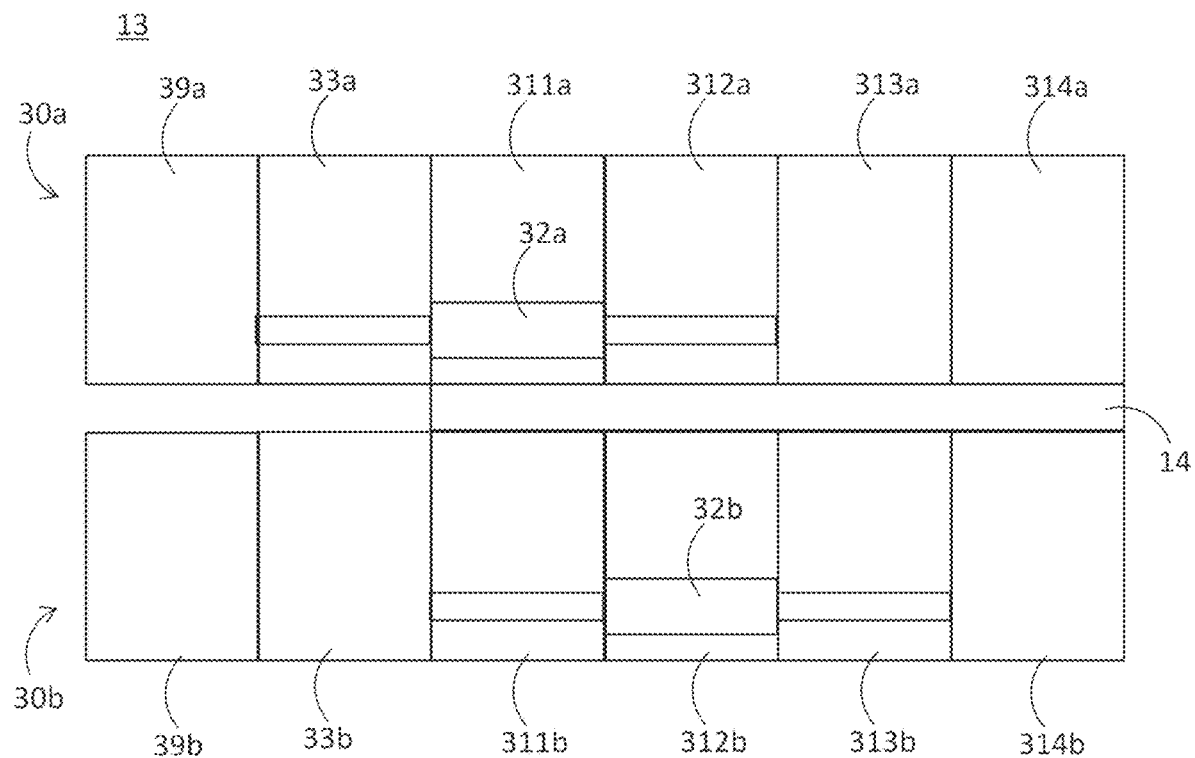
FIG. 27 is a side view showing a cleaning section having a preliminary cleaning module.

As shown in FIG. 27, the first cleaning unit 30a of the cleaning section 13 is disposed in the same row as the plurality of cleaning modules 311a to 314a and further has a preliminary cleaning module 39a that cleans the wafer W before polishing, and the cleaning section transport mechanism 32a may transport the wafer W between the preliminary cleaning module 39a and the cleaning modules 311a to 314a. In the illustrated example, the preliminary cleaning module 39a is disposed opposite to the cleaning modules 311a to 314a with respect to the first wafer station 33a and adjacent to the first wafer station 33a.

Similarly, the second cleaning unit 30b is disposed in the same row as the plurality of cleaning modules 311b to 314b, further has a preliminary cleaning module 39a that cleans the wafer W before polishing, and the cleaning section transport mechanism 32a may transport the wafer W between the preliminary cleaning module 39a and the cleaning modules 311a to 314a. In the illustrated example, the preliminary cleaning module 39b is disposed opposite to the cleaning modules 311*b* to 314*b* with respect to the second wafer station 33*b* and adjacent to the second wafer station 33*b*.

The preliminary cleaning modules 39*a* and 39*b* each include a cleaning machine (not shown) and the housing 91 that covers the cleaning machine. As a cleaning machine for the preliminary cleaning modules 39*a* and 39*b*, for example, a wet etching apparatus that removes a natural oxide film from the surface of the wafer W before polishing or a buff polishing apparatus that removes coarse particles that cause scratches from the surface of the wafer W before polishing can be used.

Since the wafer transport operation of the second cleaning unit 30*b* to the preliminary cleaning module 39*b* is similar to the wafer transport operation of the first cleaning unit 30*a* to the preliminary cleaning module 39*a*, the wafer transport operation of the first cleaning unit 30*a* to the preliminary cleaning module 39*a* will be described below.

Figure 28A:
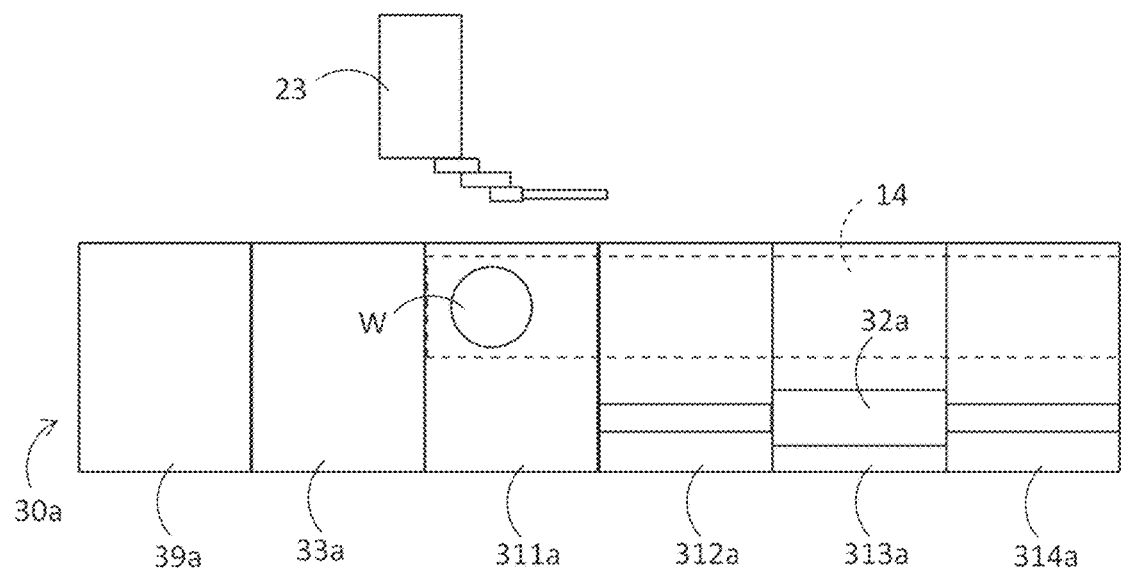
FIG. 28A is a schematic diagram for explaining a wafer transport operation to the cleaning module of the cleaning section in FIG. 27.

First, as shown in FIG. 28A, the wafer W before polishing is transported along the longitudinal direction by the slide stage 42 of the transport section 14, and is stopped at a position accessible by the transport robot 23 of the polishing section 12.

Figure 28B:
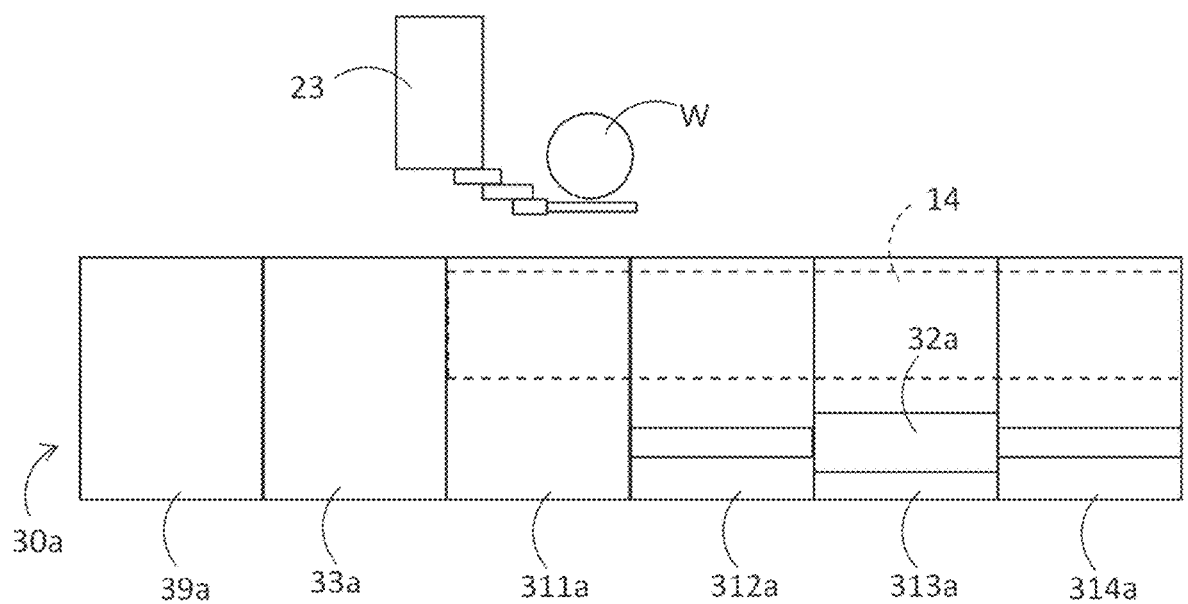
FIG. 28B is a schematic diagram for explaining a wafer transport operation to the cleaning module of the cleaning section in FIG. 27.
Figure 28C:
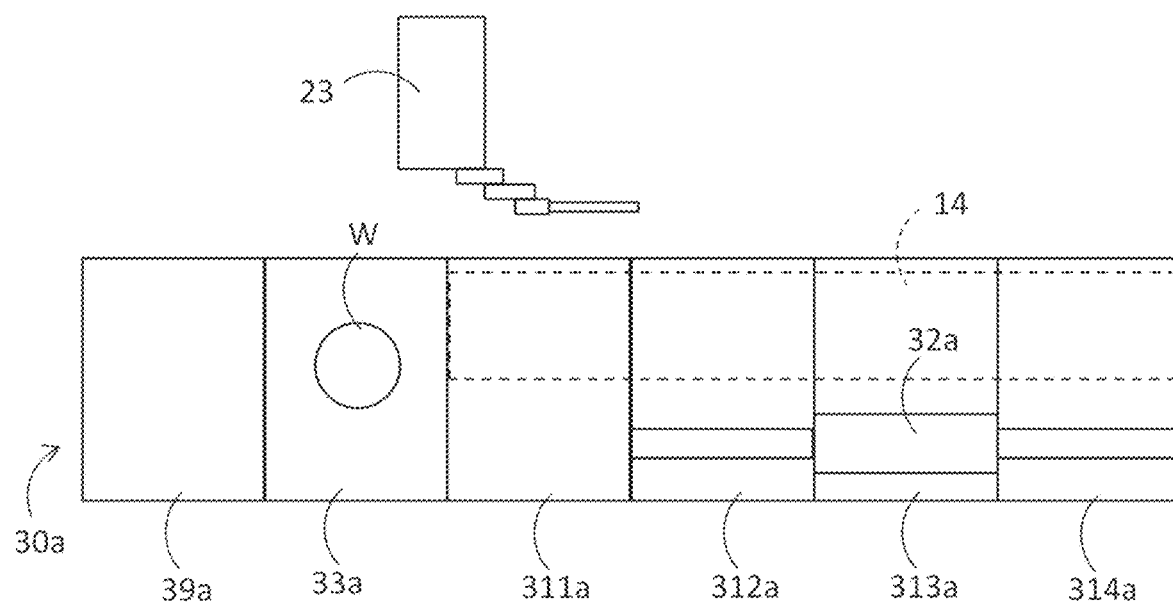
FIG. 28C is a schematic diagram for explaining a wafer transport operation to the cleaning module of the cleaning section in FIG. 27.

Next, as shown in FIG. 28B, the wafer W is taken out of the transport section 14 by the transport robot 23 of the polishing section 12. Then, as shown in FIG. 28C, the wafer W held by the transport robot 23 is transferred to the wafer station 33*a*.

Figure 28D:
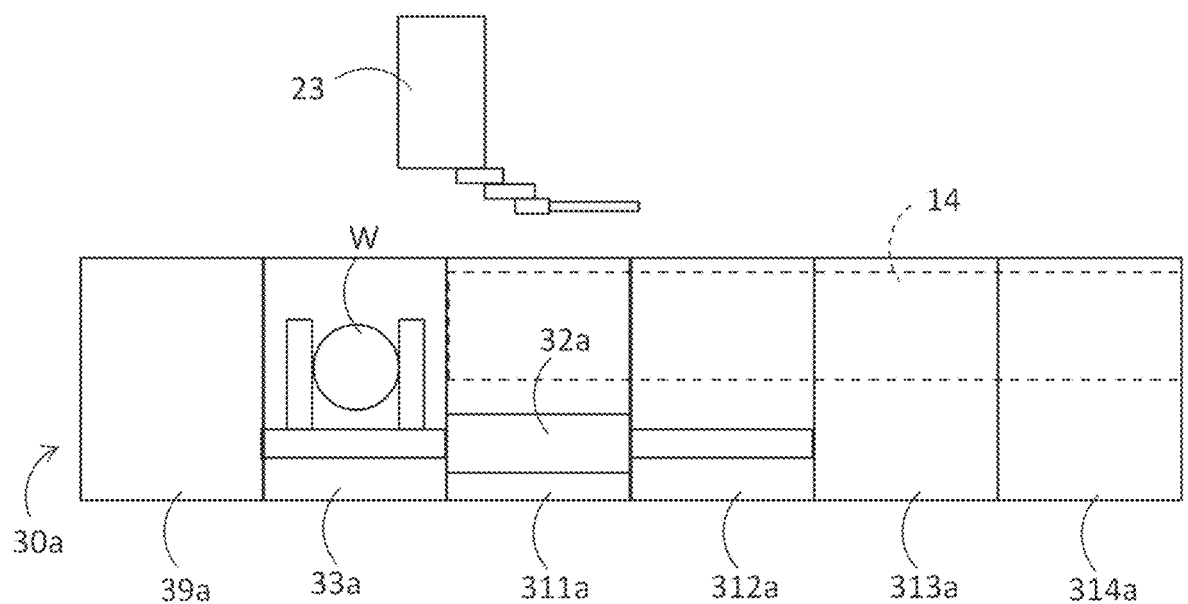
FIG. 28D is a schematic diagram for explaining a wafer transport operation to the cleaning module of the cleaning section in FIG. 27.
Figure 28E:
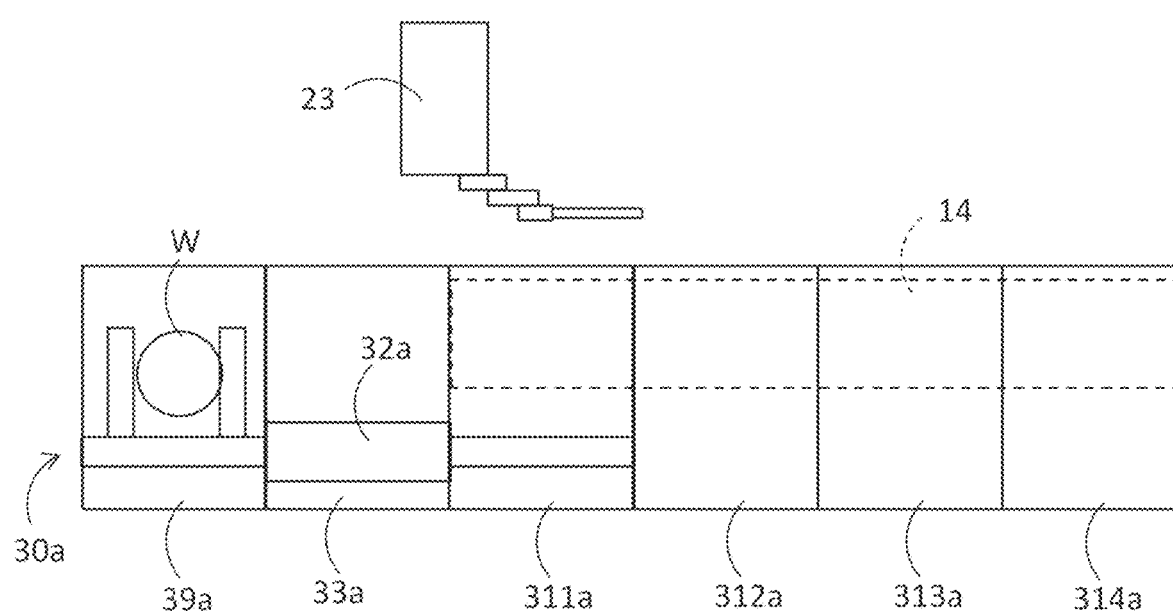
FIG. 28E is a schematic diagram for explaining a wafer transport operation to the cleaning module of the cleaning section in FIG. 27.

Next, as shown in FIG. 28D, the wafer W located in the wafer station 33*a* is held by the first arms 611 of the cleaning section transport mechanism 32*a*. As shown in FIG. 28E, with the second arms 612 of the cleaning section transport mechanism 32*a* having its tip directed upward, the wafer W held by the first arms 611 is transported from the first wafer station 33*a* to the preliminary cleaning module 39*a* by driving the arm transport mechanism 62, and cleaned.

The wafer W cleaned by the preliminary cleaning module 39*a* is held again by the first arms 611 of the cleaning section transport mechanism 32*a*. Then, as shown in FIG. 28C, the wafer W held by the first arms 611 is transported from the preliminary cleaning module 39*a* to the wafer station 33*a* by driving the arm transport mechanism 62. As shown in FIG. 28B, the wafer W is taken out from the wafer station 33*a* by the transport robot 23 of the polishing section 12, and is transported to the first polishing unit 20*a* or the second polishing unit 20*b* via the first transport unit 24*a* or the second transport unit 24*b*, and polished.

More specifically, when each of the preliminary cleaning module 39*a* and the first cleaning module 311*a* has a buffing device (for example, the device disclosed in FIG. 1 etc. of JP 2016-43471 A) in which while the buff pad contacts the wafer W, the wafer W and the buff pad are relatively moved, and the surface of the wafer W is polished and/or scrubbed by interposing a slurry between the wafer W and the buff pad, the second cleaning module 312*a* has a roll-type cleaning machine (for example, the device disclosed in FIG. 32 etc. of JP 2010-50436 A) that cleans the front and back faces of the wafer W by rotating the roll-shaped sponges disposed above and below, and pressing them against the front and back faces of the wafer W, the third cleaning module 313*a* has a pencil-type cleaning machine (for example, the device disclosed in FIG. 10 etc. of JP 2000-173966 A) that presses against the wafer W while rotating a hemispherical sponge to clean it, and the fourth cleaning module 314*a* has an IPA dryer (for example, the device disclosed in FIGS. 33 to 39 etc. of JP 2010-50436 A) that sprays IPA (isopropyl alcohol) vapor onto the surface of the wafer W while rotating the wafer W to dry the wafer W, the wafer W before polishing is buffed in the preliminary cleaning module 39*a*, and then transported to the first polishing unit 20*a* or the second polishing unit 20*b* and polished, then buffed in the first cleaning module 311*a*, then washed with a roll-shaped sponge in the second cleaning module 312*a*, then cleaned with a pencil-shaped sponge in the third cleaning module 313*a*, then IPA vapor dried in the fourth cleaning module 314*a*, and afterwards, is taken out to the load/unload unit 11.

Further, when the preliminary cleaning module 39*a* has a buffing device, each of the first cleaning module 311*a* and the second cleaning module 312*a* has a roll-type cleaning machine, the third cleaning module 313*a* has a pencil-type cleaning machine, and the fourth cleaning module 314*a* has an IPA dryer, the wafer W before polishing is buffed in the preliminary cleaning module 39*a*, then transported to the first polishing unit 20*a* or the second polishing unit 20*b* and polished, then continuously cleaned with a roll-shaped sponge in the first cleaning module 311*a* and the second cleaning module 312*a*, then cleaned with a pencil-shaped sponge in the third cleaning module 313*a*, then IPA vapor dried in the fourth cleaning module 314*a*, and afterwards, is taken out to the load/unload unit 11.

Further, when each of the preliminary cleaning module 39*a*, the first cleaning module 311*a* and the second cleaning module 312*a* has a roll-type cleaning machine, the third cleaning module 313*a* has a pencil-type cleaning machine, and the fourth cleaning module 314*a* has an IPA dryer, the wafer W before polishing is cleaned with a roll-shaped sponge in the preliminary cleaning module 39*a*, then transported to the first polishing unit 20*a* or the second polishing unit 20*b* and polished, then continuously cleaned with a roll-shaped sponge in the first cleaning module 311*a* and the second cleaning module 312*a*, then cleaned with pencil sponge in the third cleaning module 313*a*, then IPA vapor dried in the fourth cleaning module 314*a*, and afterwards, is taken out to the load/unload unit 11.

Further, when each of the preliminary cleaning module 39*a* and the first cleaning module 311*a* has a roll-type cleaning machine, the second cleaning module 312*a* has a pencil-type cleaning machine, the third cleaning module 313*a* is a two-fluid jet type cleaning machine (for example, the device disclosed in FIG. 4 etc. of JP 2010-238850 A) that ejects the cleaning liquid and gas toward the wafer W at high speed to generate a two-fluid jet stream to spray it at high speed to clean the wafer W, and the fourth cleaning module 314*a* has an IPA dryer, the wafer W before polishing is cleaned with a roll-shaped sponge in the preliminary cleaning module 39*a*, then transported to the first polishing unit 20*a* or the second polishing unit 20*b* and polished, then cleaned with a roll-shaped sponge in the first cleaning module 311*a*, then cleaned with a pencil-like sponge in the second cleaning module 312*a*, then two-fluid jet cleaned in the third cleaning module 313*a*, then IPA vapor dried in the fourth cleaning module 314*a*, and afterwards, is taken out to the load/unload unit 11.

The preliminary cleaning module 39*a* is not limited to being used for cleaning the wafer W before polishing, but may be used for cleaning the wafer W after polishing. In this case, first, as shown in FIG. 28A, the wafer W before polishing is transported along the longitudinal direction by the slide stage 42 of the transport section 14, and is stopped at a position accessible by the transport robot 23 of the polishing section 12.

Then, as shown in FIG. 28B, the wafer W is taken out of the transport section 14 by the transport robot 23 of the polishing section 12, then transported to the first polishing unit 20a or the second polishing unit 20b via the first transport unit 24a or the second transport unit 24b, and then is polished. As shown in FIG. 28C, the wafer W after polishing is held by the transport robot 23 and transported to the wafer station 33a.

Next, as shown in FIG. 28D, the wafer W located in the wafer station 33a is held by the first arms 611 of the cleaning section transport mechanism 32a. As shown in FIG. 28E, with the second arms 612 of the cleaning section transport mechanism 32a having its tip directed upward, the wafer W held by the first arms 611 is transported from the first wafer station 33a to the preliminary cleaning module 39a by driving the arm transport mechanism 62, and cleaned.

The wafer W cleaned by the preliminary cleaning module 39a is held again by the first arms 611 of the cleaning section transport mechanism 32a. The wafer W held by the first arms 611 is transported from the preliminary cleaning module 39a to the first cleaning module 311a by driving the arm transport mechanism 62, and is cleaned. After that, for example, the wafer W is cleaned and dried in the second to fourth cleaning modules 311b to 311d by the steps shown in FIGS. 21B to 21F described later, and then taken out to the load/unload unit 11.

<Leakage Detection Unit>

Figure 23:
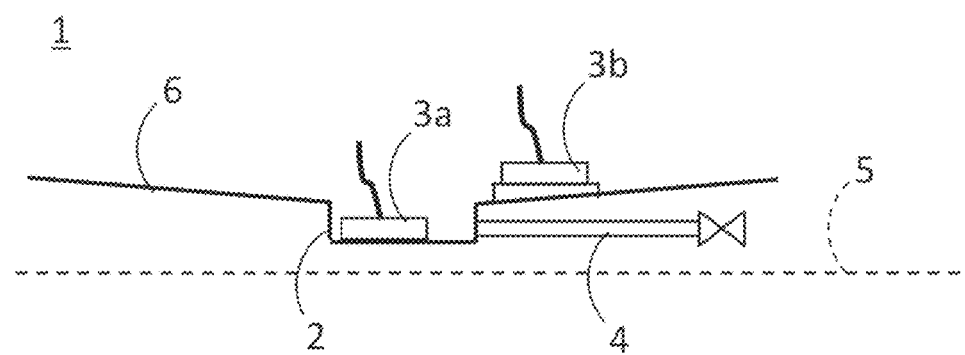
FIG. 23 is a schematic diagram showing an example of a leakage detection unit of the substrate processing apparatus shown in FIG. 1.

FIG. 23 is a schematic diagram showing a leakage detection unit 1 provided in the lower part (near the base frame) of the substrate processing apparatus 10. As shown in FIG. 23, the leakage detection unit 1 has a drain pot 2, a drain pan 6 having a slope inclined toward the drain pot 2, a first installation type leakage sensor 3a installed on the bottom face of the drain pot 2, and a second installation type leakage sensor 3b installed on the slope of the drain pan 6.

As the first installation type leakage sensor 3a and the second installation type leakage sensor 3b, for example, a photoelectric sensor is used. Each of the first installation type leakage sensor 3a and the second installation type leakage sensor 3b transmit a signal to the control unit 15 when detecting the leakage. The control unit 15 issues an alarm when receiving a signal from the first installation type leakage sensor 3a, and stops the operation of the substrate processing apparatus 10 when receiving a signal from the second installation type leakage sensor 3b.

Figure 24:
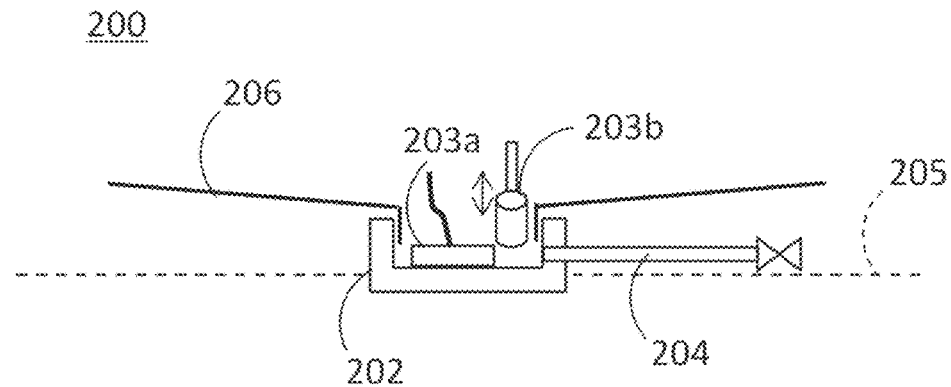
FIG. 24 is a schematic diagram showing a conventional leakage detection unit.

As shown in FIG. 24, in a conventional leakage detection unit 200, an installation type leakage sensor 203a installed on the bottom face of a drain pot 202, and a float type leakage sensor 203b disposed in the drain pot 202 are used to constitute a two-stage detection type level sensor. The float type leakage sensor 203b is required to move vertically in order to detect liquid leakage in its construction. Therefore, the drain pot 202 is required to have a certain depth, and the bottom face of the drain pot 202 projects downward of the lower face 205 of the base frame of the substrate processing apparatus. In this case, the fork of the forklift comes into contact with the bottom face of the drain pot 202 to lift it when the substrate processing apparatus is moved, so that the drain pot 202 may be damaged.

Further, as shown in FIG. 24, in the conventional leakage detection unit 200, the drain pot 202 is formed separately from a drain pan 206 so that the drain pot 202 can be easily replaced when it is damaged. Therefore, liquid leakage may occur between the drain pot 202 and the drain pan 206.

On the other hand, as shown in FIG. 23, in the present embodiment, the two-stage detection type level sensor is constituted by two installation type leakage sensors 3a and 3b. Therefore, the depth of the drain pot 2 can be reduced, and the bottom face of the drain pot 2 can be disposed above the lower face 5 of the base frame of the substrate processing apparatus 10. This prevents the drain pot 2 from being damaged by the fork of the forklift when the substrate processing apparatus 10 is moved.

Further, in the present embodiment, since the depth of the drain pot 2 can be made shallow, the drain pot 2 can be formed integrally with the drain pan 6. In this case, it is possible to prevent liquid leakage from occurring between the drain pot 2 and the drain pan 6.

Figure 25:
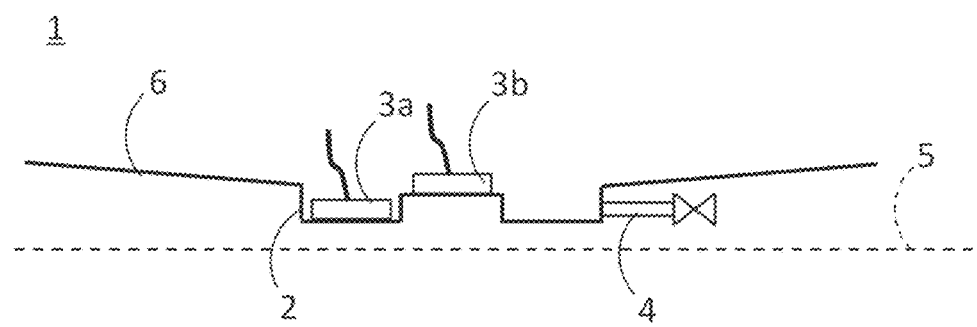
FIG. 25 is a schematic diagram showing a modification of the leakage detection unit of the substrate processing apparatus shown in FIG. 1.

FIG. 25 is a schematic diagram showing a modification of the leakage detection unit 1. In this modification, the central part of the bottom face of the drain pot 2 is raised by one step, and the second installation type leakage sensor 3b is set at this one step raised part. According to such an aspect, in addition to obtaining the same effect as the aspect shown in FIG. 23, since the drain pot 2 has a ring shaped bottom face, the volume can be increased while the depth of the drain pot 2 is reduced.

Figure 26:
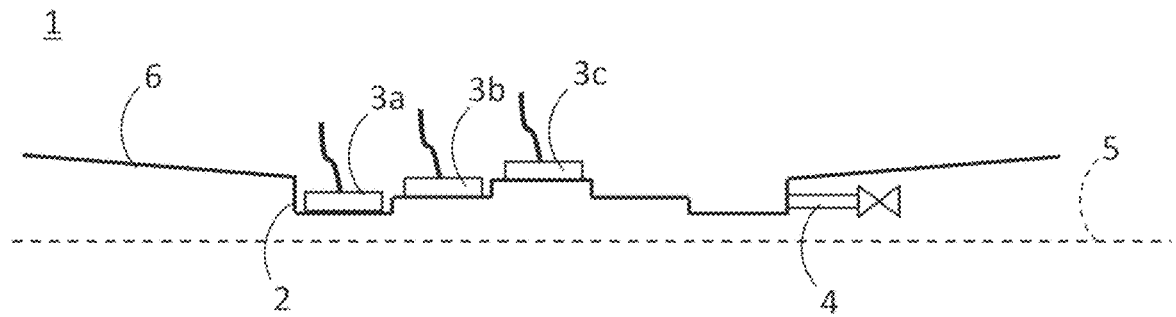
FIG. 26 is a schematic diagram showing a modification of the leakage detection unit of the substrate processing apparatus shown in FIG. 1.

Further, as in the modification shown in FIG. 26, the bottom of the drain pot 2 may be gradually raised toward the central part in two steps, the second installation type leakage sensor 3b may be installed at the part one step higher than the bottom, and a third installation type leakage sensor 3c may be installed at the part one step higher than that. According to such an aspect, it is possible to detect the liquid leakage at three step levels. Similarly, the number of steps may be increased to four or more.

<Polishing Process Using Substrate Processing Apparatus>

Next, an example of processing of polishing the wafer W using the substrate processing apparatus 10 having such a configuration will be described. The polishing process described below is performed by the control unit 15 controlling the operations of the load/unload unit 11, the polishing section 12, the cleaning section 13, and the transport section 14.

Figure 16A:
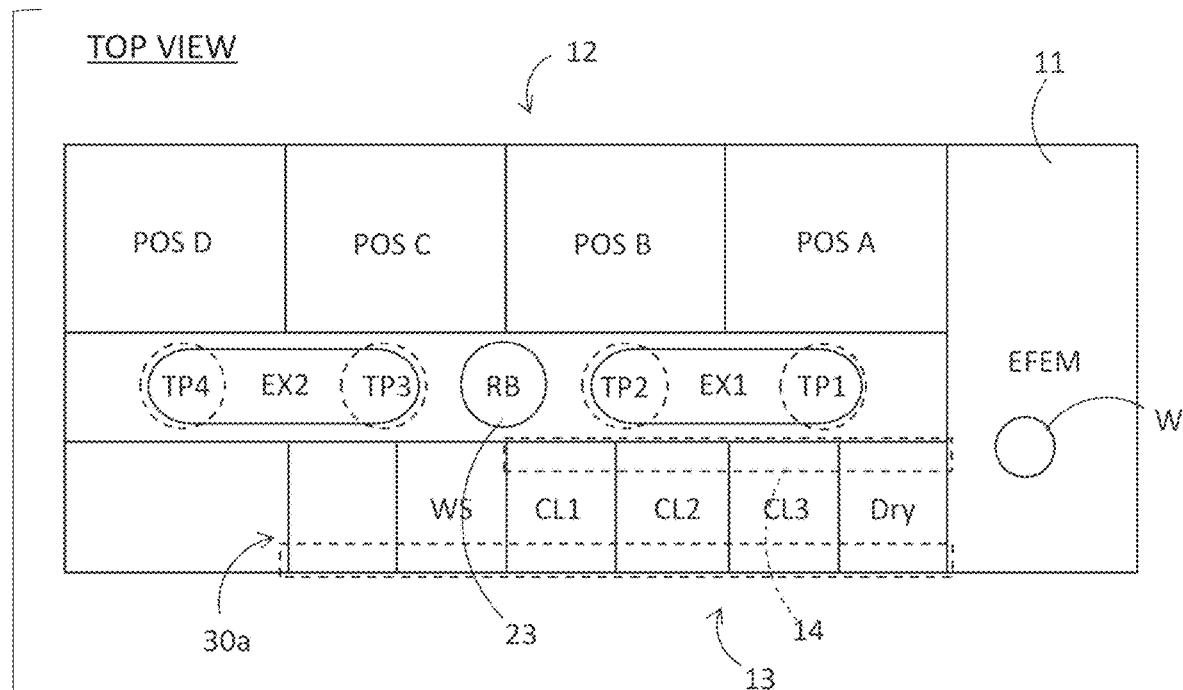
FIG. 16A is a schematic diagram for explaining the operation of the transport section.
Figure 16A:
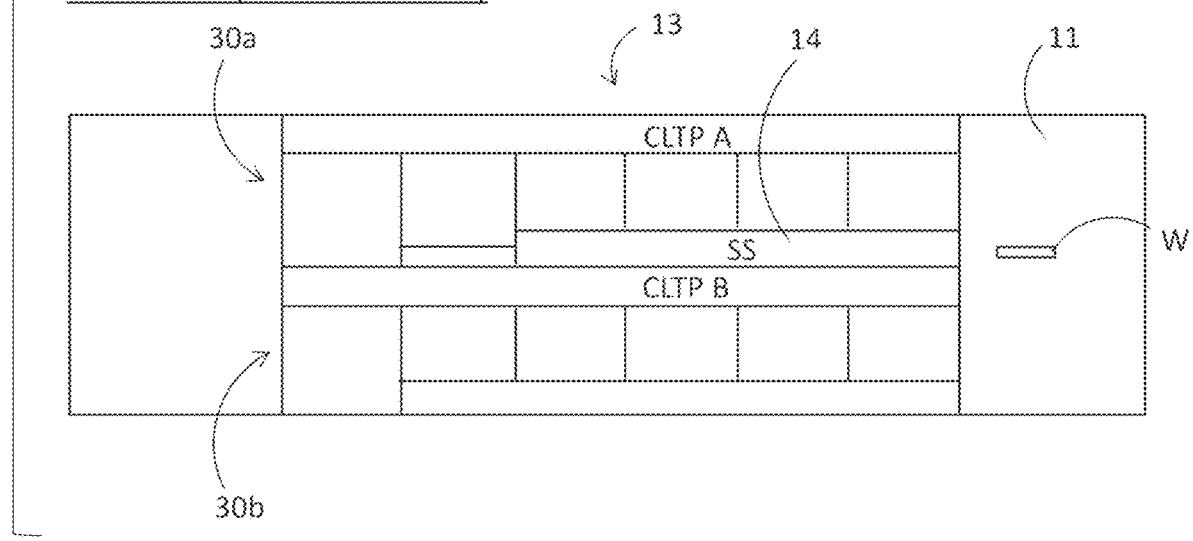
Figure 16B:
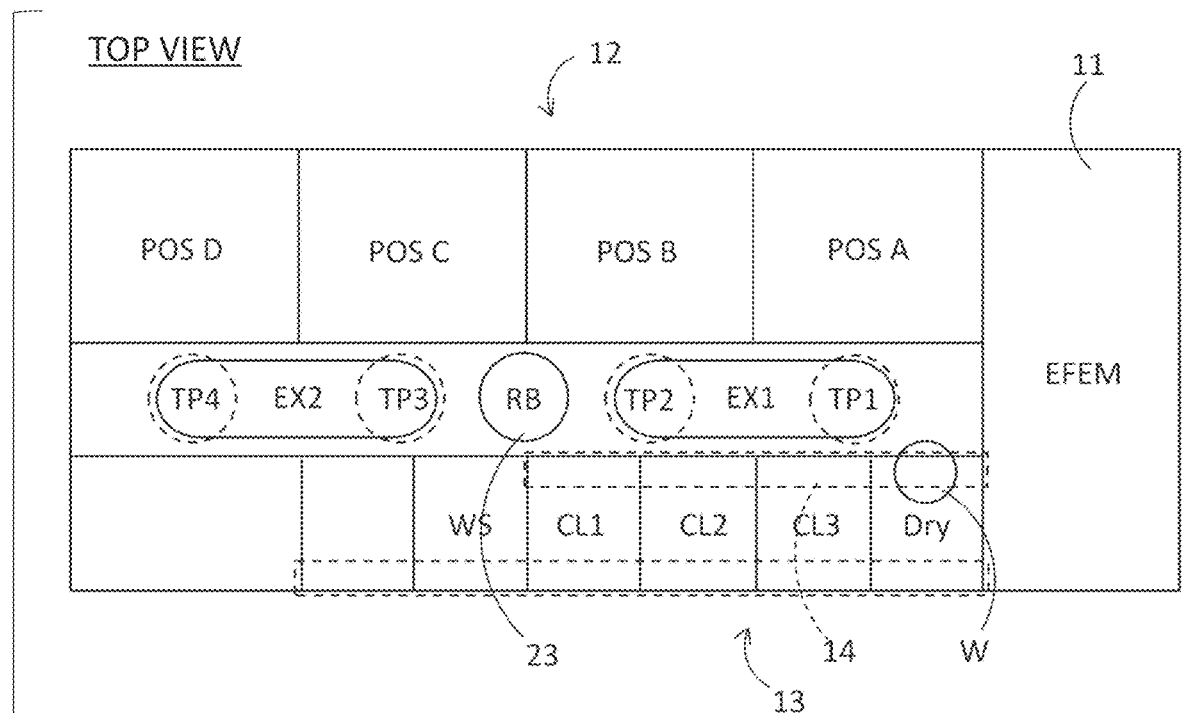
FIG. 16B is a schematic diagram for explaining the operation of the transport section.
Figure 16B:
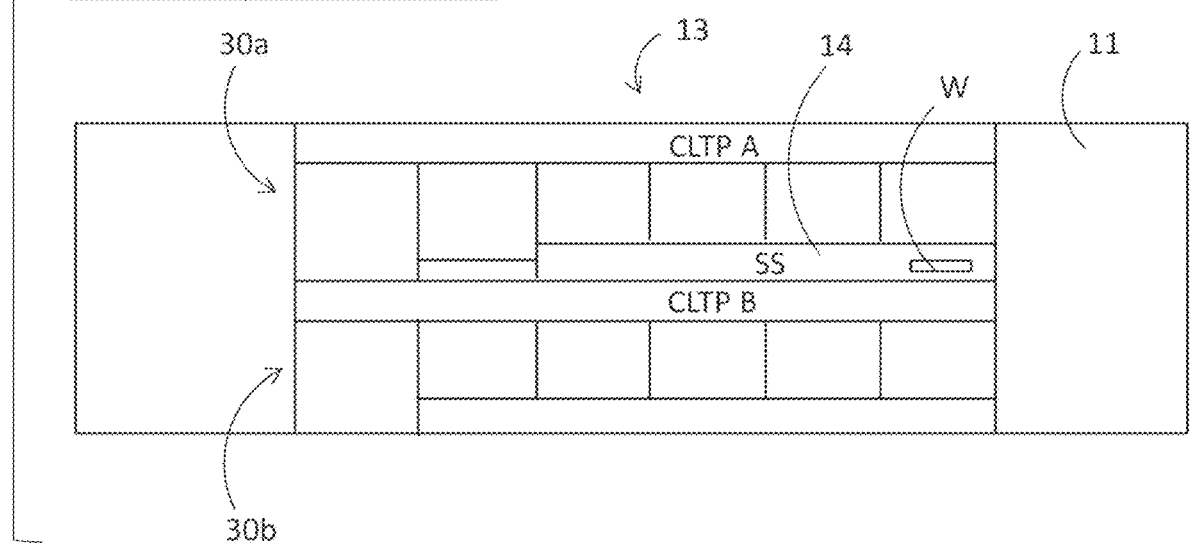

First, as shown in FIGS. 16A and 1, the wafer W before polishing is taken out from the wafer cassette of the front loading unit 113 by the transport robot 111 of the load/unload unit 11 and is moved to a position facing the carry-in port 41a of the transport section 14. Next, as shown in FIGS. 16B and 3, after the carry-in port 41a of the transport section 14 is opened, the wafer W held by the transport robot 111 is inserted from the carry-in port 41a to the inside of the cover 41 and placed and supported on the slide stage 42.

Figure 16C:
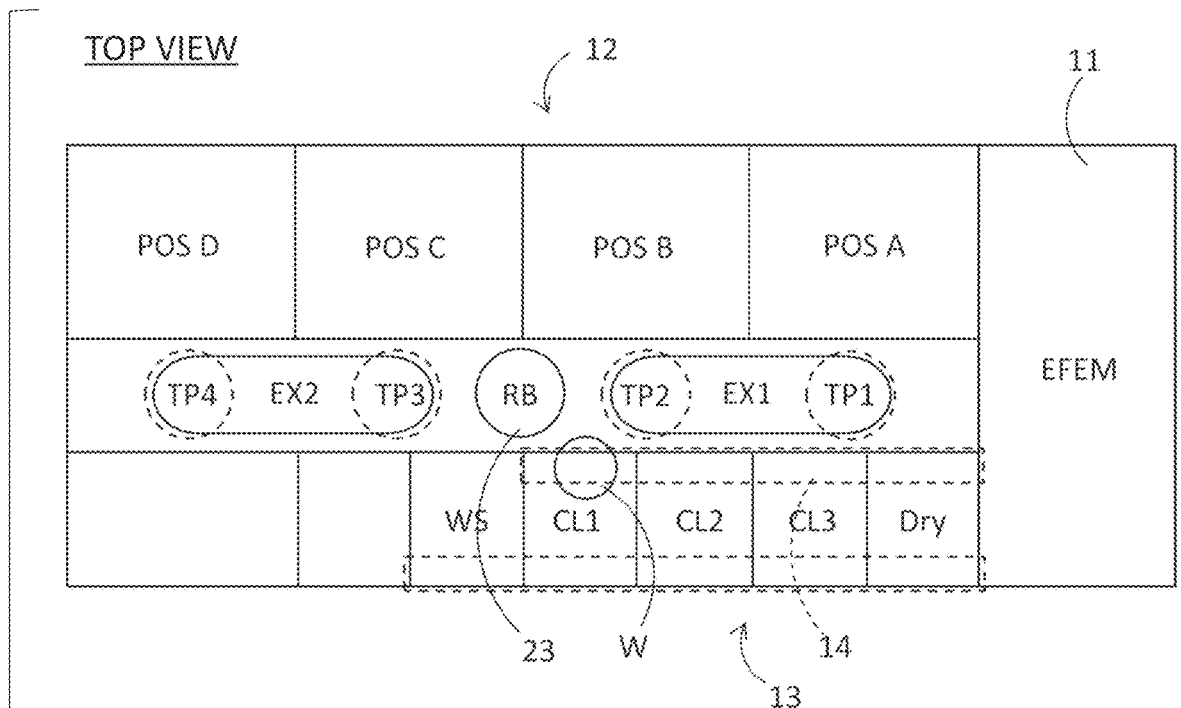
FIG. 16C is a schematic diagram for explaining the operation of the transport section.
Figure 16C:
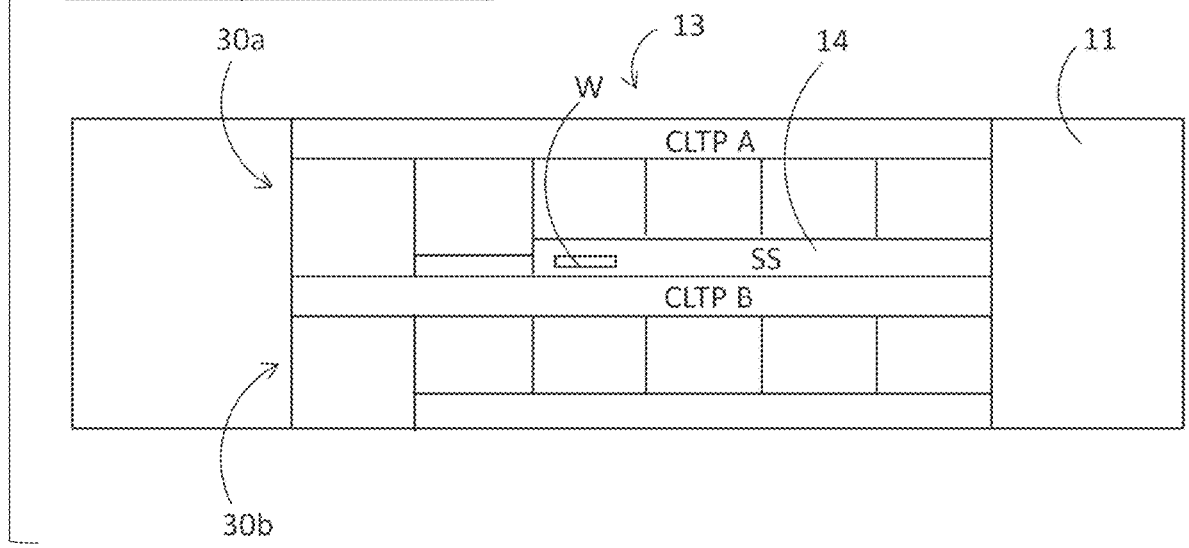

Next, as shown in FIGS. 16C and 3, the slide stage 42 holding the wafer W is moved to a position facing the carry-out port 41b along the longitudinal direction by the power given from the stage movement mechanism 43. Then, the carry-out port 41b of the transport section 14 is opened. At this time, an airflow that flows from the carry-in port 41a to the carry-out port 41b is formed inside the cover 41 of the transport section 14 by the exhaust duct 44. This prevents particles in the polishing section 12 from passing through the transport section 14 and diffusing into the load/unload unit 11.

Figure 17A:
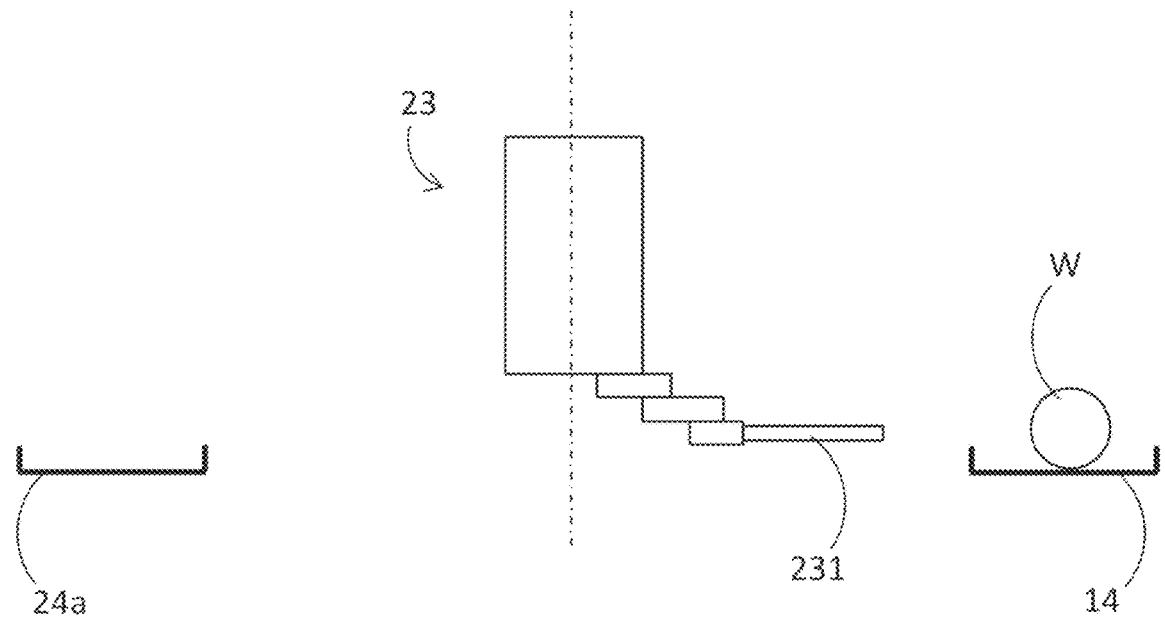
FIG. 17A is a schematic diagram for explaining the operation of the transport robot.
Figure 17B:
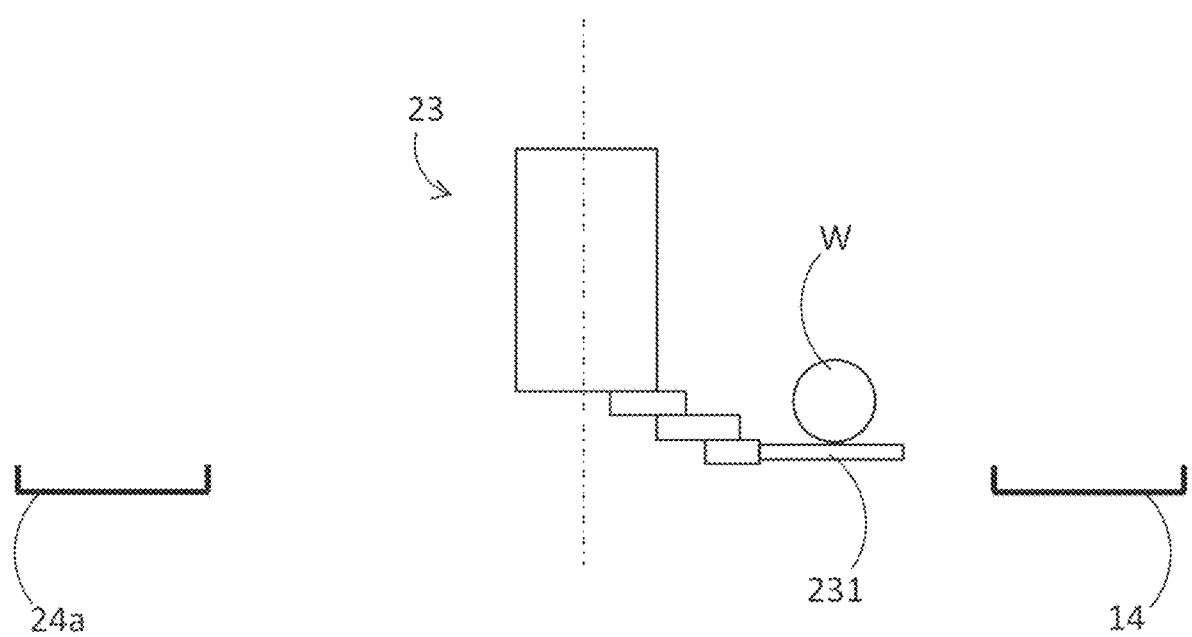
FIG. 17B is a schematic diagram for explaining the operation of the transport robot.
Figure 17C:
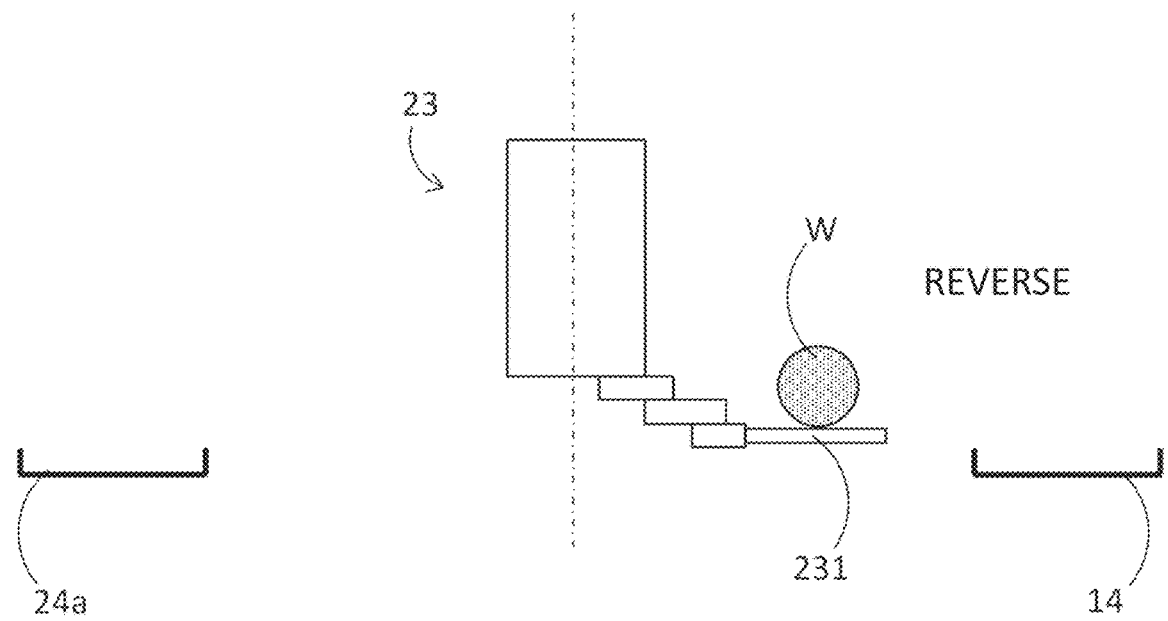
FIG. 17C is a schematic diagram for explaining the operation of the transport robot.

As shown in FIGS. 17A and 3, the arm 232 of the transport robot 23 is extended in a state where the hand 231 of the transport robot 23 of the polishing section 12 is positioned at the height position same as that of the carry-out port 41b of the transport section 14. The hand 231 supported by the tip of the arm is inserted into the inside of the cover 41 through the carry-out port 41b, and is inserted below the wafer W held on the slide stage 42. Next, the hand 231 is raised, and the wafer W is transferred from the slide stage 42 to the hand 231. Then, by contracting the arm 232, as shown in FIG. 17B, the wafer W held on the hand 231 is taken out from the transport section 14 to the polishing section 12. After that, as shown in FIG. 17C, the hand 231 together with the wafer W is turned upside down by the reversing mechanism 234 of the transport robot 23. In the drawing, the gray-colored wafer W indicates a vertically inverted wafer.

Figure 17D:
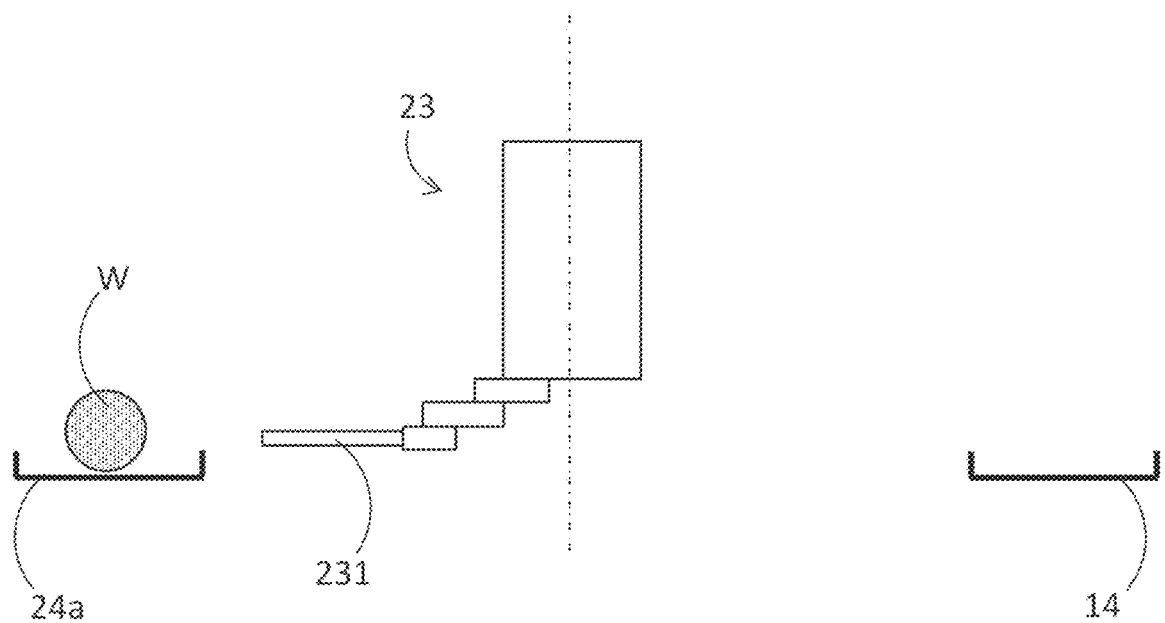
FIG. 17D is a schematic diagram for explaining the operation of the transport robot.

Next, as shown in FIG. 17D, the arm 232 is rotated around the axis of the robot body 233, and the hand 231 is directed to the first transport unit 24a side. Then, the arm 232 is extended, and the wafer W held by the hand 231 is transferred to the first transport unit 24a and transported from the first transport unit 24a to the first polishing unit 20a. When the first polishing unit 20a is congested, the wafer W held by the hand 231 is transferred to the second transport unit 24b and the wafer may be transported from the second transport unit 24b to the second polishing unit 20b. In this embodiment, the wafers W transported from the transport section 14 to the polishing section 12 are distributed by the transport robot 23 to the first transport unit 24a and the second transport unit 24b, the wafer W is transferred from the first transport unit 24a to the first polishing unit 20a, and the wafer W is transferred from the second transport unit 24b to the second polishing unit 20b. Therefore, the first polishing unit 20a and the second polishing unit 20b do not share the carry-in route, and congestion at the time of transferring the substrate into the first polishing unit 20a and the second polishing unit 20b is eliminated. Therefore, the throughput of the entire process is improved.

Since the wafer transfer operation by the second transport unit 24b is similar to the wafer transfer operation by the first transport unit 24a, the wafer transfer operation by the first transport unit 24a will be described below.

Figure 18A:
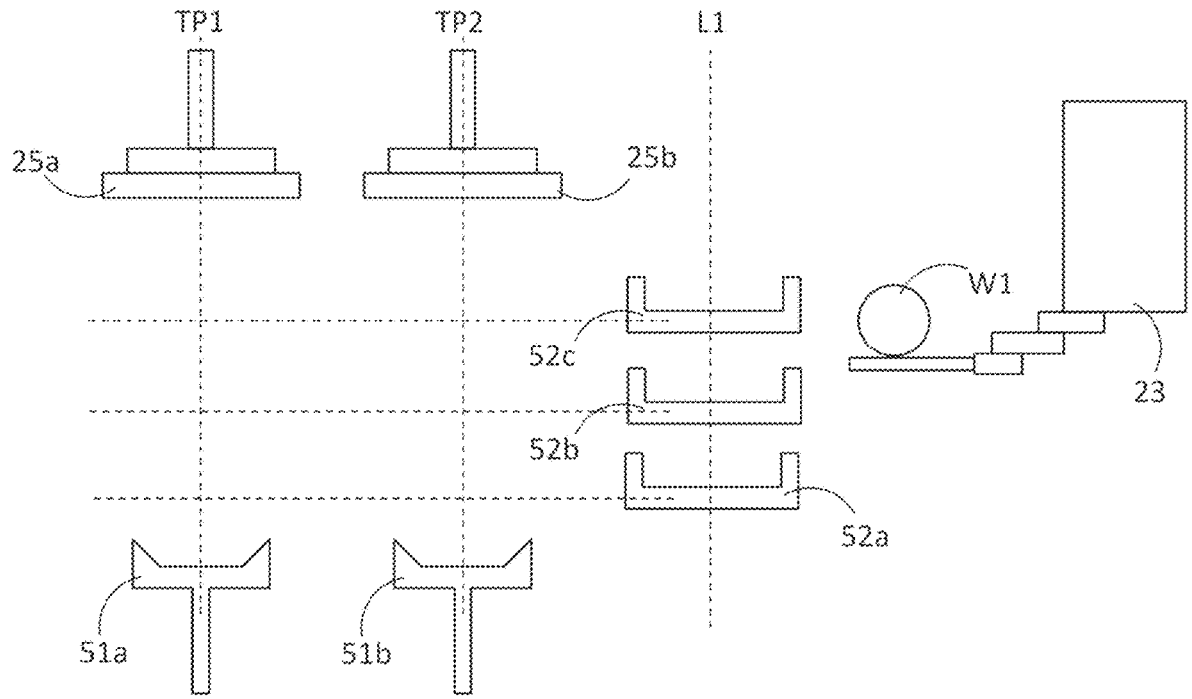
FIG. 18A is a schematic diagram for explaining the operation of the first transport mechanism.
Figure 18B:
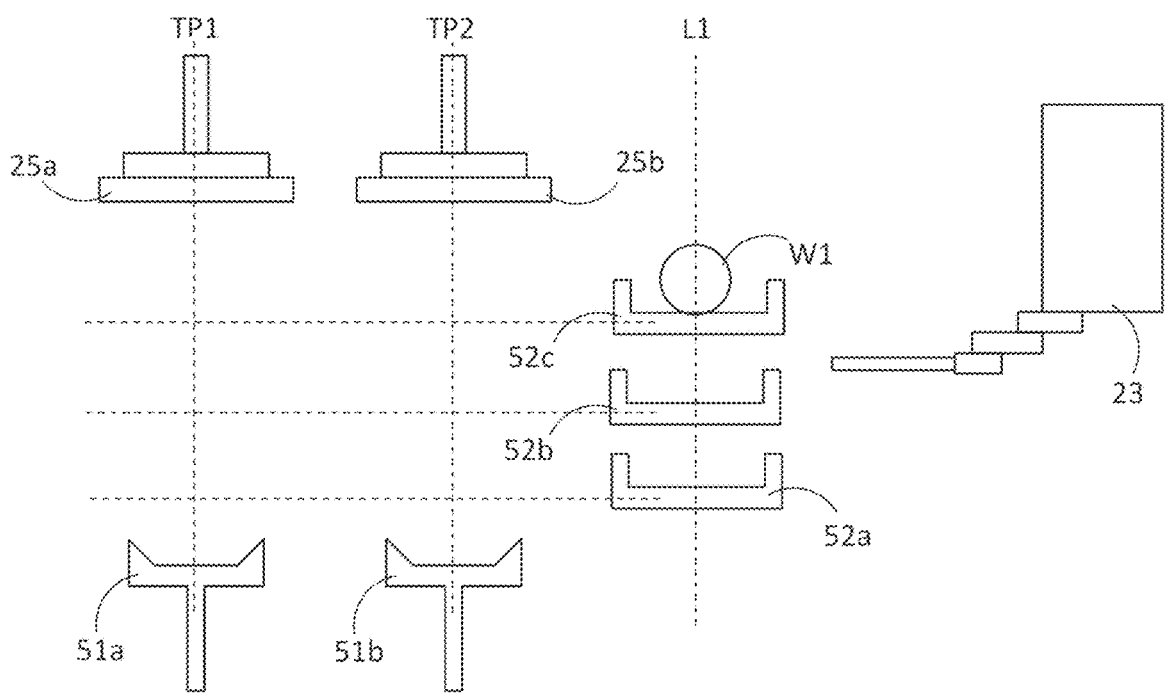
FIG. 18B is a schematic diagram for explaining the operation of the first transport mechanism.
Figure 18C:
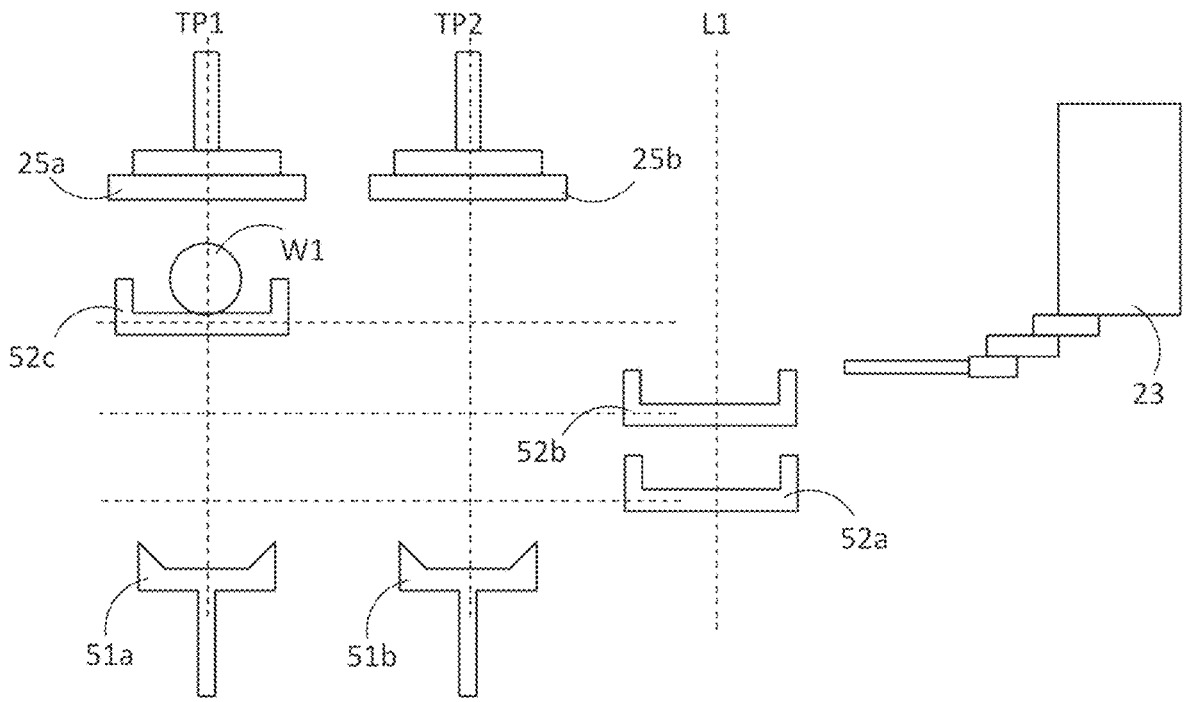
FIG. 18C is a schematic diagram for explaining the operation of the first transport mechanism.

When continuously processing one wafer in the first polishing apparatus 21a and the second polishing apparatus 21b (in series), the unpolished first wafer W1 held by the transport robot 23 is transferred to the third stage 52c of the exchanger 50 disposed at a waiting position L1 as shown in FIGS. 18A and 18B. Then, as shown in FIG. 18C, the third stage 52c holding the first wafer W1 is moved from the waiting position L1 to the first substrate transport position TP1.

Figure 18D:
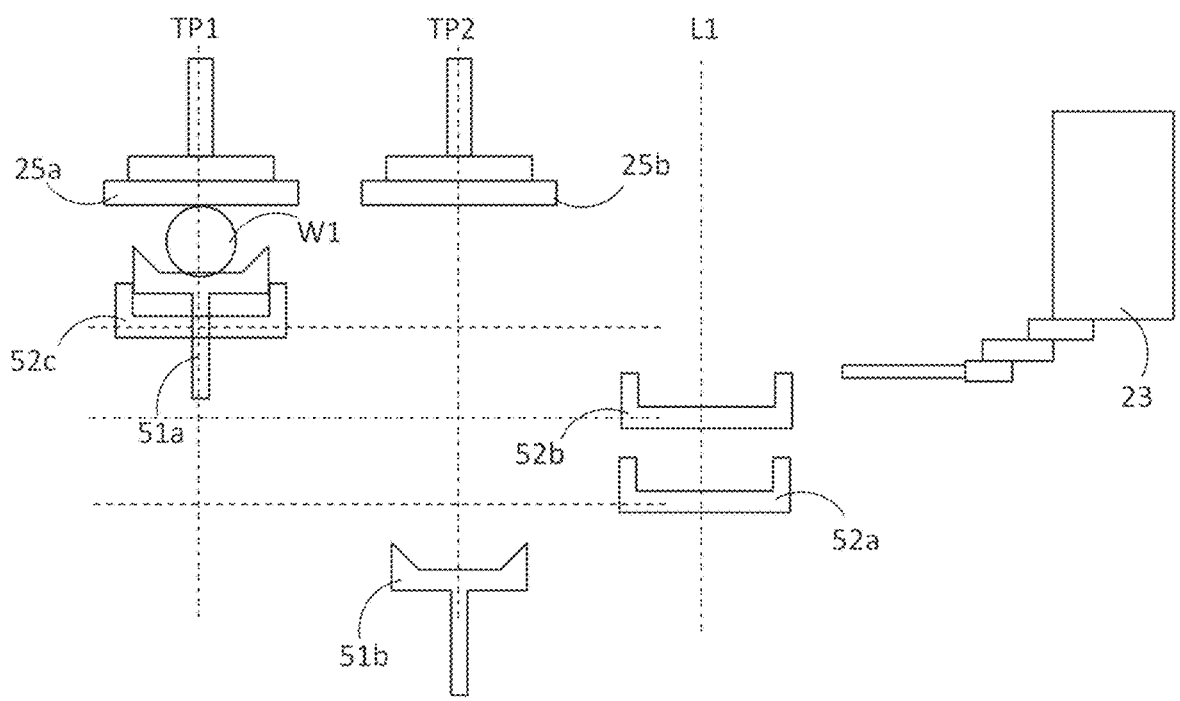
FIG. 18D is a schematic diagram for explaining the operation of the first transport mechanism.
Figure 18E:
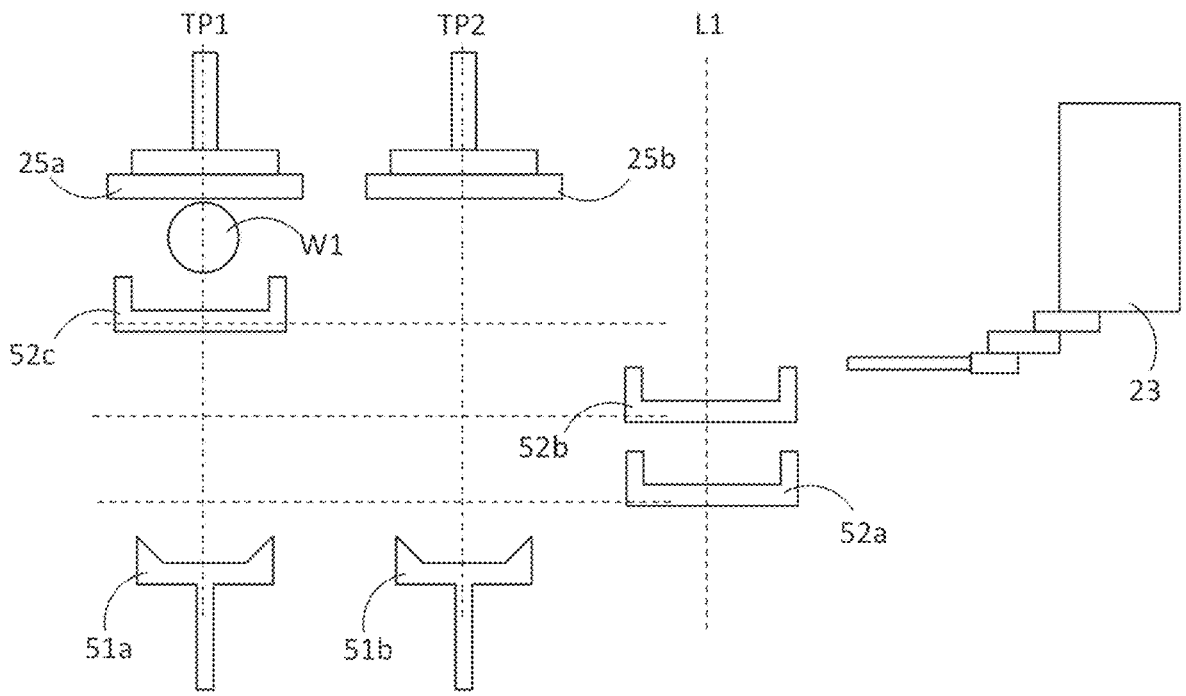
FIG. 18E is a schematic diagram for explaining the operation of the first transport mechanism.
Figure 18F:
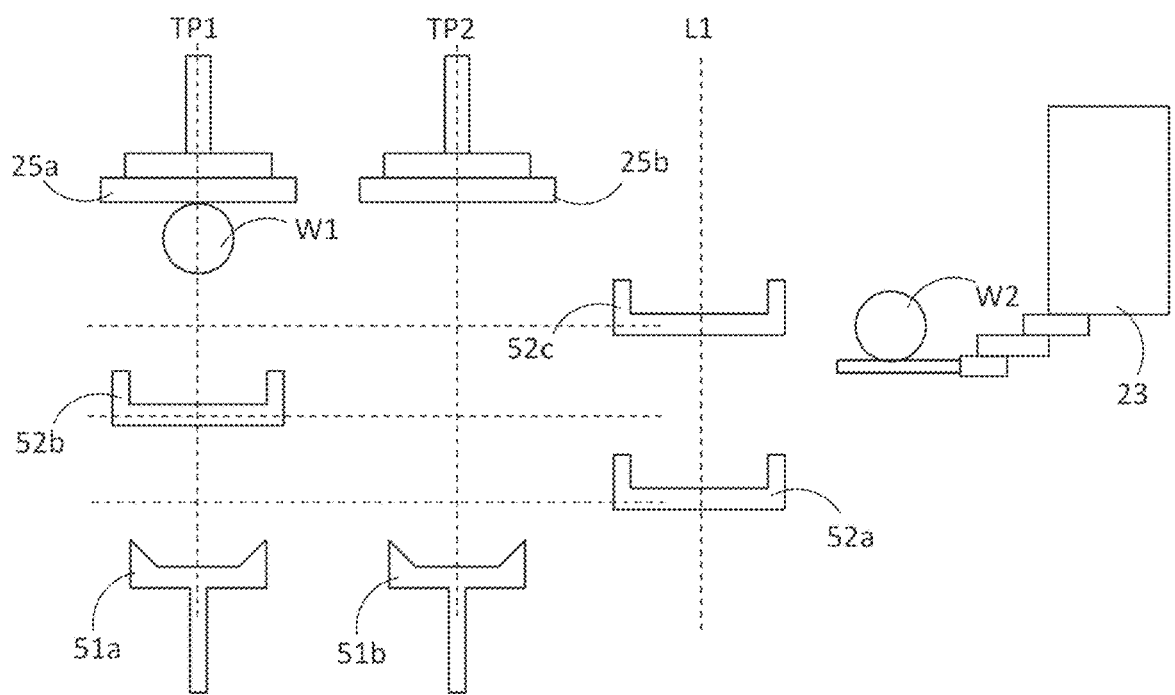
FIG. 18F is a schematic diagram for explaining the operation of the first transport mechanism.

Next, as shown in FIG. 18D, the first pusher 51a ascends to pass through the inside of the third stage 52c, and the first wafer W1 on the third stage 52c is pushed up by the first pusher 51a to be transferred to the top ring 25a of the first polishing apparatus 21a. Then, after the first wafer W1 is sucked by and held at the top ring 25a of the first polishing apparatus 21a, the first pusher 51a descends to the initial height position as shown in FIG. 18E. Afterwards, as shown in FIG. 18F, the first wafer W1 is polished at the polishing position of the first polishing apparatus 21a (For more details, referring to FIG. 4, the top ring 25a is moved onto a polishing pad 102a by moving means (not shown), the polishing pad 102a is brought into contact with the first wafer W1 held by the top ring 25a by elevating means (not shown), and the first wafer W is polished through the relative movement of the top ring 25a and the polishing table 101a. Hereinafter, the polishing of the wafer W at the polishing position of another polishing apparatus is similarly performed). At this time, the third stage 52c is moved from the first substrate transport position TP1 to the waiting position L1, and the second stage 52b is moved from the waiting position L1 to the first substrate transport position TP1. The transport robot 23 holds the second wafer W2 before polishing.

Figure 18G:
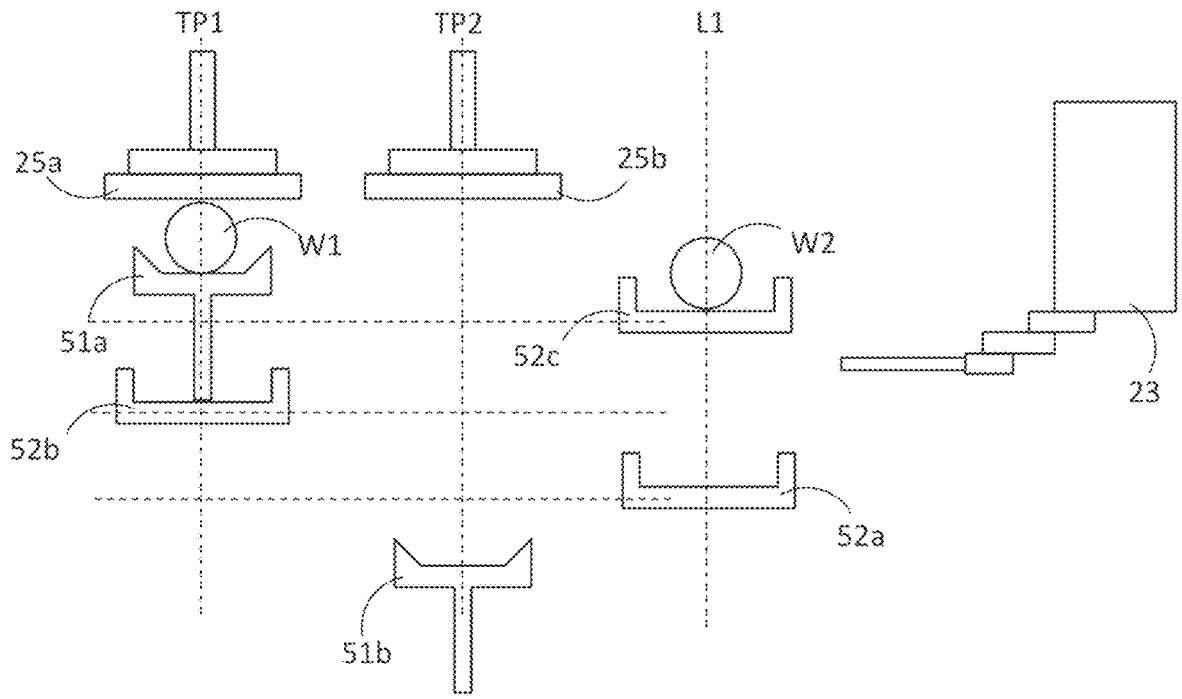
FIG. 18G is a schematic diagram for explaining the operation of the first transport mechanism.
Figure 18H:
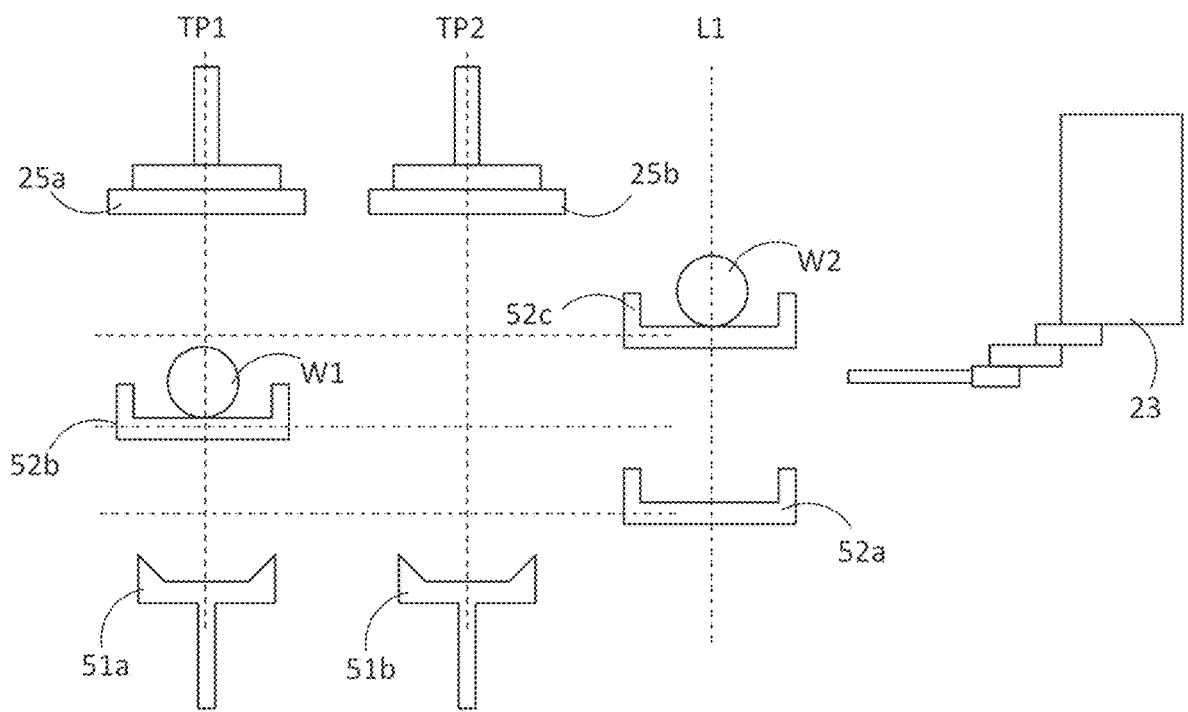
FIG. 18H is a schematic diagram for explaining the operation of the first transport mechanism.

After the polishing of the first wafer W1 by the first polishing apparatus 21a is completed, the first pusher 51a ascend to receive the polished first wafer W1 from the top ring 25a of the first polishing apparatus 21a as shown in FIG. 18G. Then, as shown in FIG. 18H, the first pusher 51a descends to pass through the second stage 52b, and the first wafer W1 on the first pusher 51a is transferred to the second stage 52b. The first wafer W1 held on the second stage 52b is cleaned by a cleaning nozzle (not shown) at the first substrate transport position TP1. Further, the unpolished second wafer W2 held by the transport robot 23 is transferred to the third stage 52c disposed at the waiting position L1.

Figure 18I:
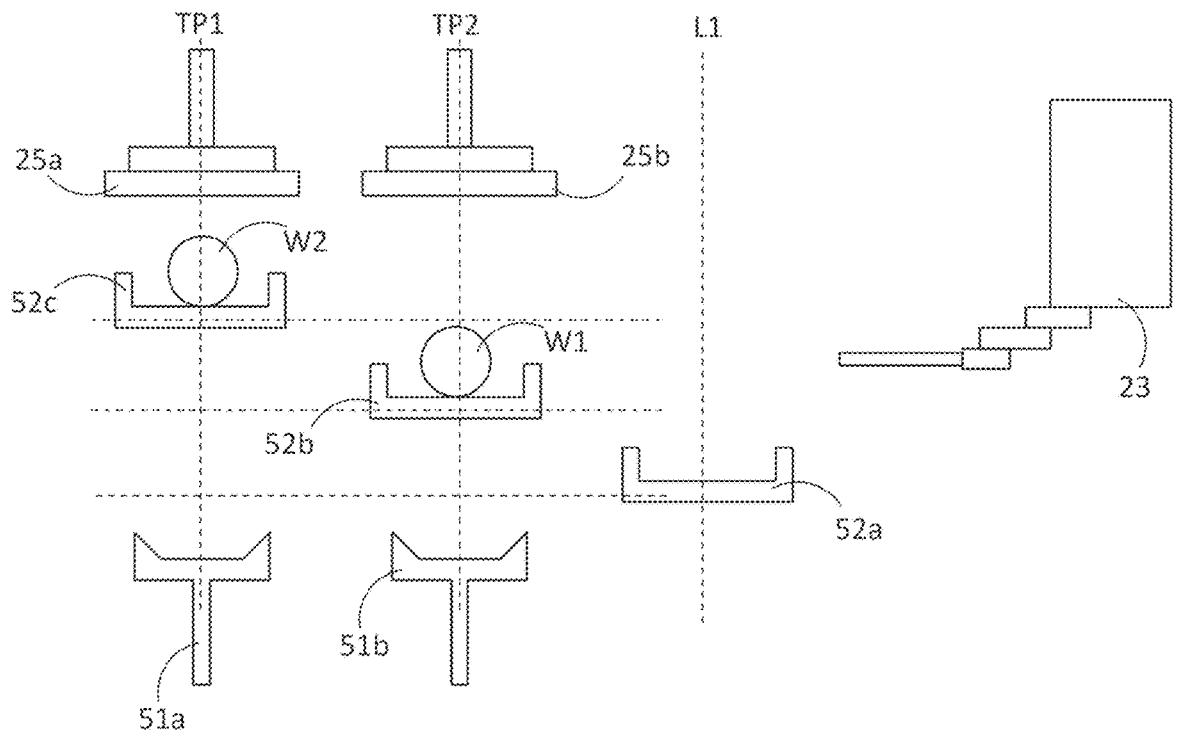
FIG. 18I is a schematic diagram for explaining the operation of the first transport mechanism.

Then, as shown in FIG. 18I, the third stage 52c holding the second wafer W2 is moved from the waiting position L1 to the first substrate transport position TP1 at the same time when the second stage 52b holding the first wafer W1 is moved from the first substrate transport position TP1 to a second transfer position TP2. In this way, since the two stages 52b and 52c holding the wafers W1 and W2, respectively, can be moved so as to intersect with each other in opposite directions, the throughput of the process is improved.

Figure 18J:
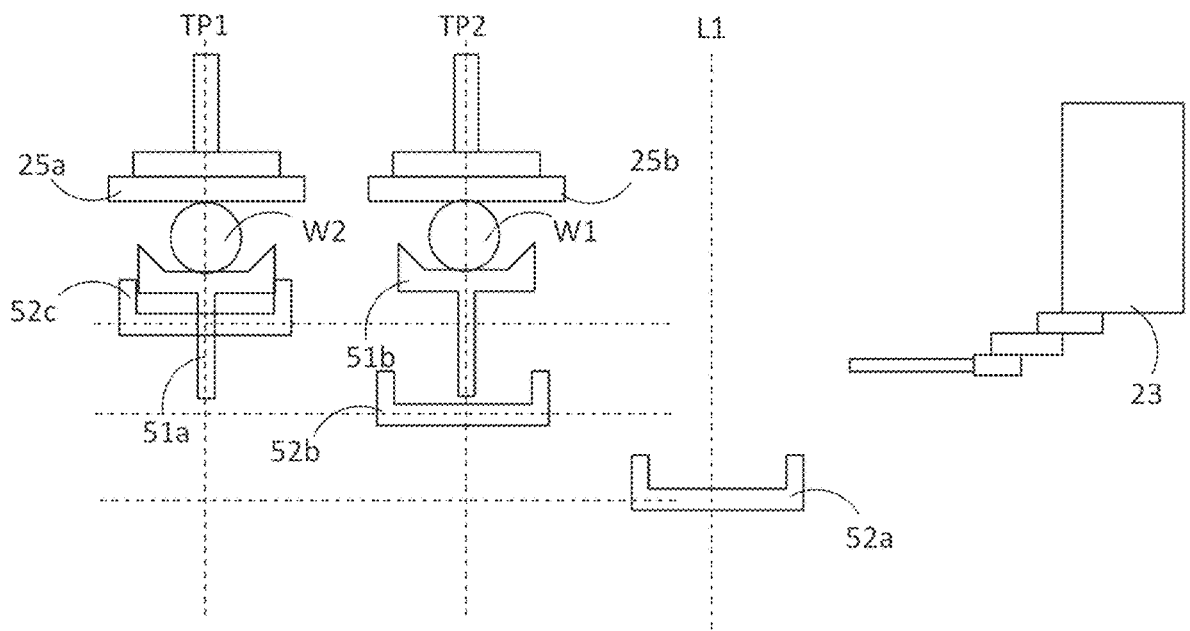
FIG. 18J is a schematic diagram for explaining the operation of the first transport mechanism.
Figure 18K:
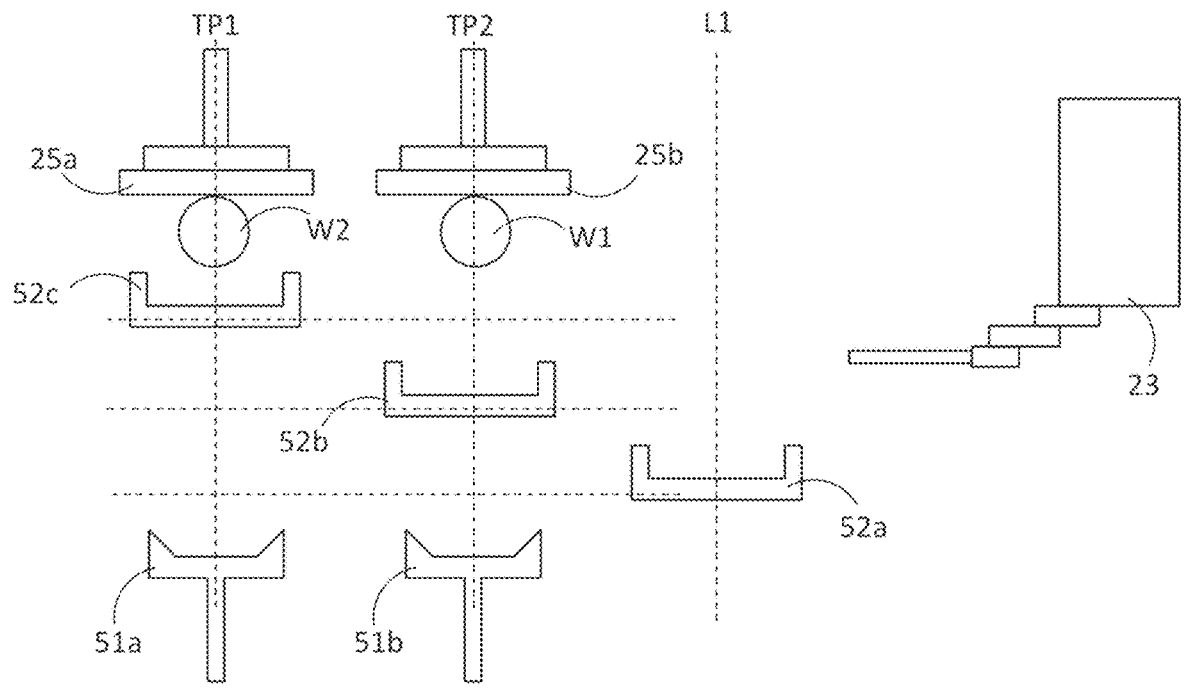
FIG. 18K is a schematic diagram for explaining the operation of the first transport mechanism.

Next, as shown in FIG. 18J, the second pusher 51b ascends to pass through the inside of the second stage 52b, and the first wafer W1 on the second stage 52b is pushed up by the second pusher 51b to be transferred to the top ring 25b of the second polishing apparatus 21b. Further, the first pusher 51a ascends to pass through the inside of the third stage 52c, and the second wafer W2 on the third stage 52c is pushed up by the first pusher 51a to be transferred to the top ring 25a of the first polishing apparatus 21a. Then, as shown in FIG. 18K, after the first wafer W1 is sucked by and held at the top ring 25b of the second polishing apparatus 21b, the second pusher 51b descends to the initial height position. Further, after the second wafer W2 is sucked by and held at the top ring 25a of the first polishing apparatus 21a, the first pusher 51a descends to the initial height position.

Figure 18L:
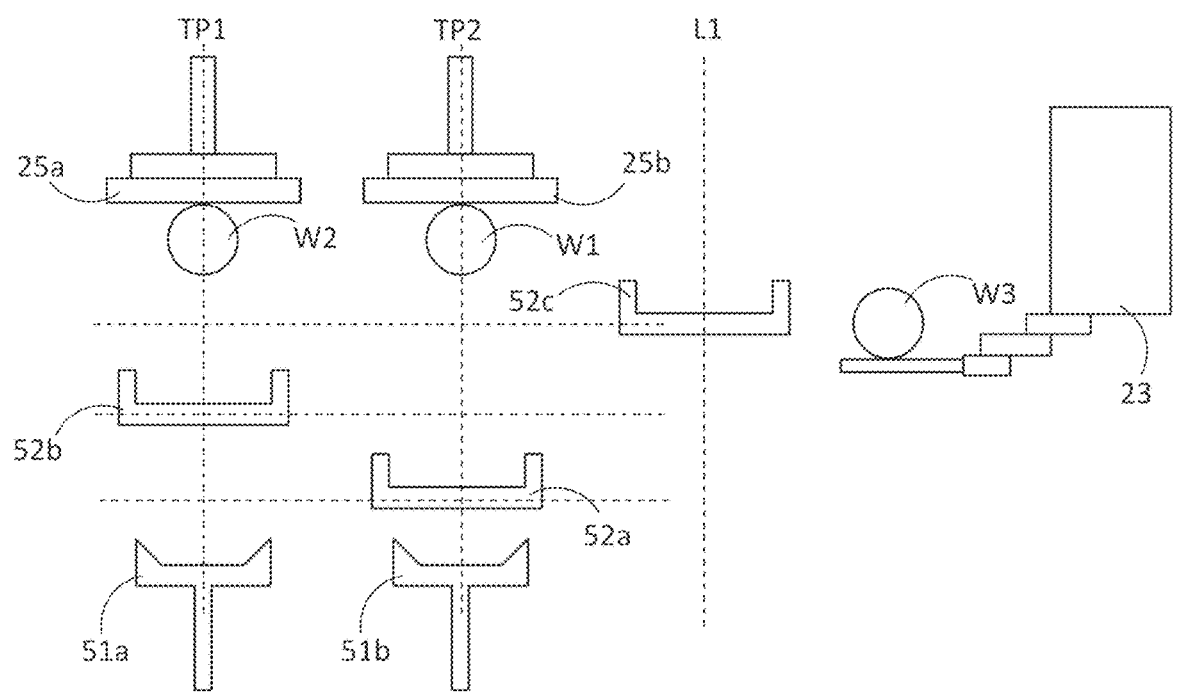
FIG. 18L is a schematic diagram for explaining the operation of the first transport mechanism.

Then, as shown in FIG. 18L, the second polishing apparatus 21b further polishes the first wafer W1 and the first polishing apparatus 21a polishes the second wafer W2. At this time, the third stage 52c is moved from the first substrate transport position TP1 to the waiting position L1, and the second stage 52b is moved from the second substrate transport position TP2 to the first substrate transport position TP1. Further, the first stage 52a is moved from the waiting position L1 to the second substrate transport position TP2. The transport robot 23 holds a third wafer W3 before polishing.

Figure 18M:
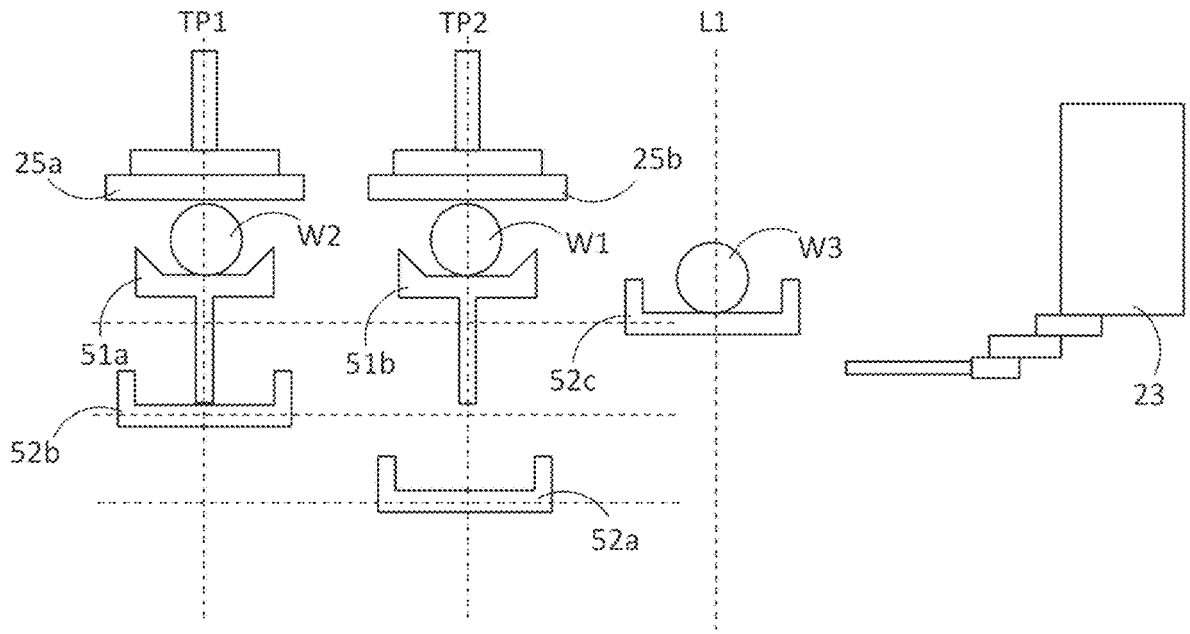
FIG. 18M is a schematic diagram for explaining the operation of the first transport mechanism.

After the polishing of the first wafer W1 by the second polishing apparatus 21b is completed, the second pusher 51b ascends to receive the polished first wafer W1 from the top ring 25b of the second polishing apparatus 21b as shown in FIG. 18M. Further, after the polishing of the second wafer W2 by the first polishing apparatus 21a is completed, the first pusher 51a ascends to receive the polished second wafer W2 from the top ring 25a of the first polishing apparatus 21a.

Figure 18N:
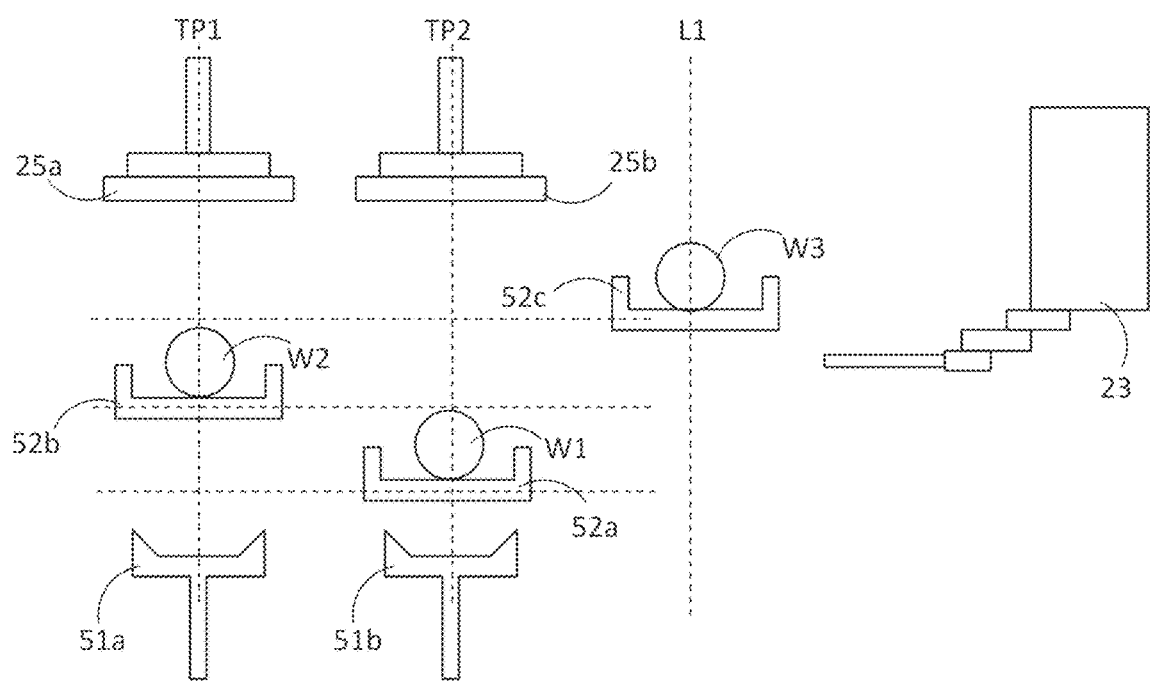
FIG. 18N is a schematic diagram for explaining the operation of the first transport mechanism.

Then, as shown in FIG. 18N, the second pusher 51b descends to pass through the first stage 52a, and the first wafer W1 on the second pusher 51b is transferred to the first stage 52a. The first wafer W1 held on the first stage 52a is cleaned by a cleaning nozzle (not shown) at the second substrate transport position TP2. Further, the first pusher 51a descends to pass through the second stage 52b, and the second wafer W2 on the first pusher 51a is transferred to the second stage 52b. The second wafer W2 held on the second stage 52b is cleaned by a cleaning nozzle (not shown) at the first substrate transport position TP1. The unpolished third wafer W3 held by the transport robot 23 is transferred to the third stage 52c disposed at the waiting position L1.

Figure 18O:
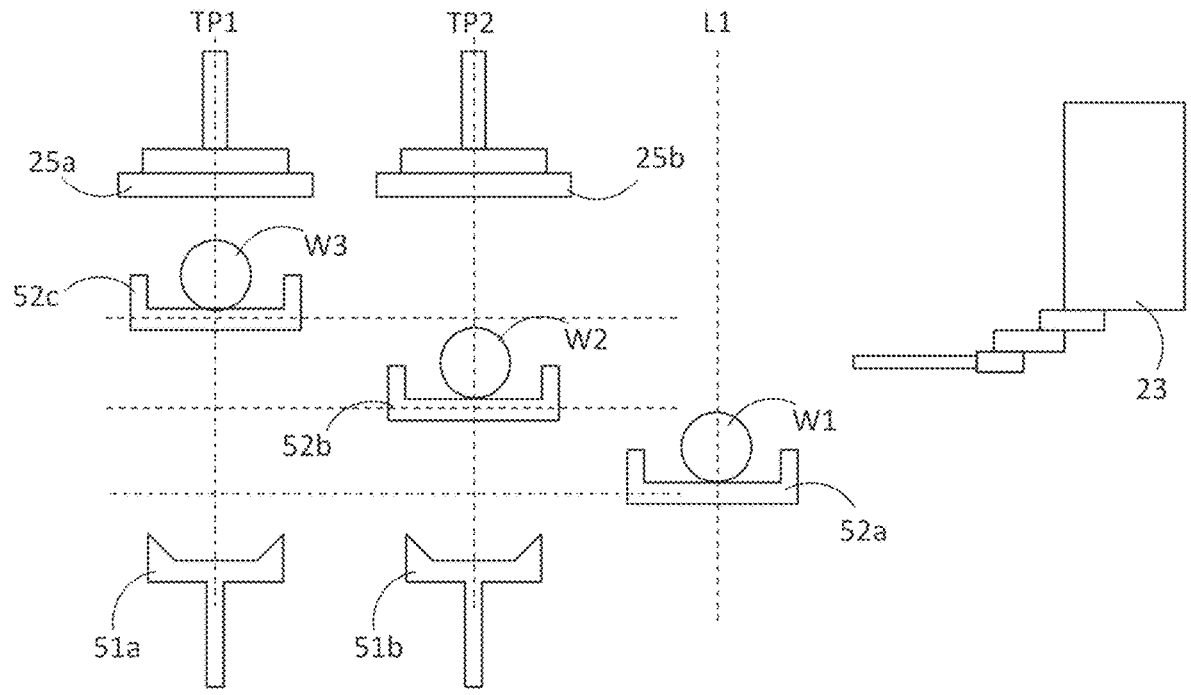
FIG. 18O is a schematic diagram for explaining the operation of the first transport mechanism.

Next, as shown in FIG. 18O the first stage 52a holding the first wafer W1 is moved from the second substrate transport position TP2 to the waiting position L1, and the first wafer W1 held on the first stage 52a is taken out of the first stage 52a by the transport robot 23. On the other hand, the second stage 52b holding the second wafer W2 is moved from the first substrate transport position TP1 to the second substrate transport position TP2 for the polishing process by the second polishing apparatus 21b. At the same time, the third stage 52c holding the third wafer W3 is moved from the waiting position L1 to the first substrate transport position TP1 for the polishing process by the first polishing apparatus 21b.

Figure 19A:
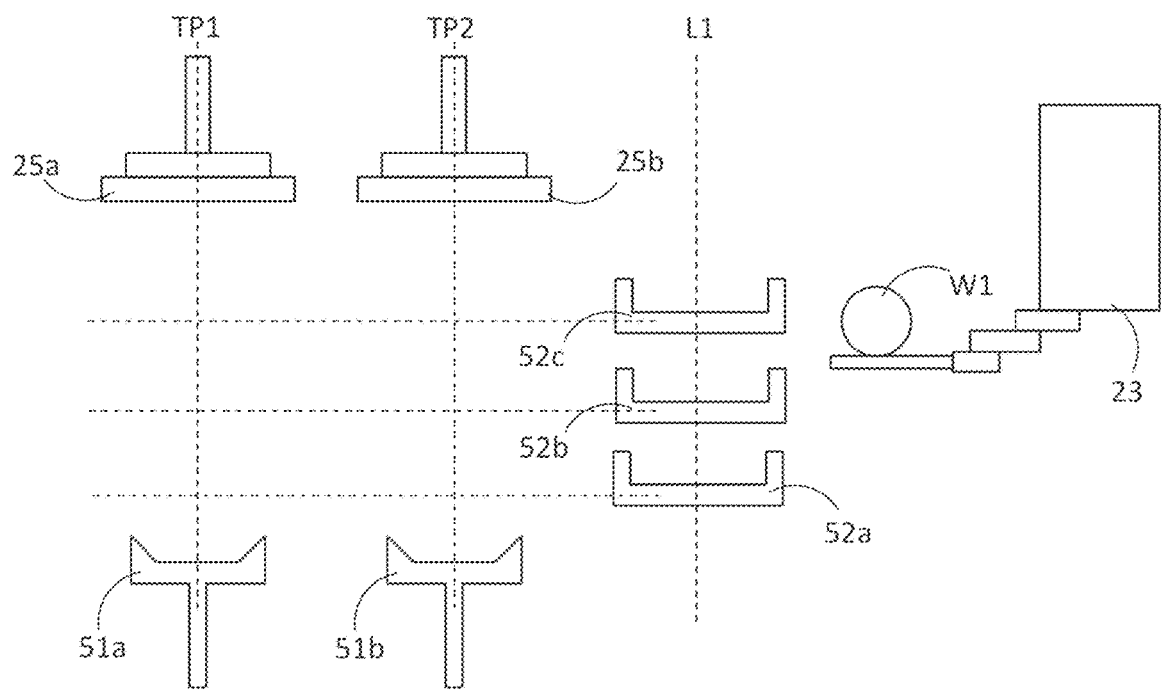
FIG. 19A is a schematic diagram for explaining the operation of the first transport mechanism.
Figure 19B:
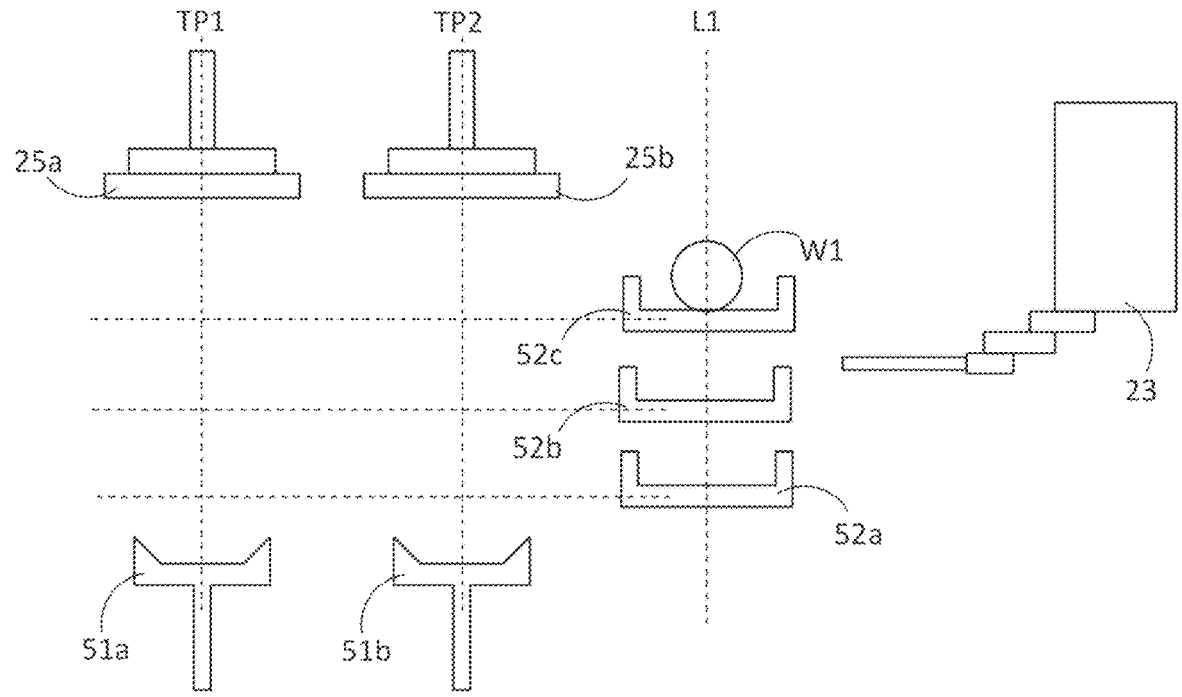
FIG. 19B is a schematic diagram for explaining the operation of the first transport mechanism.
Figure 19C:
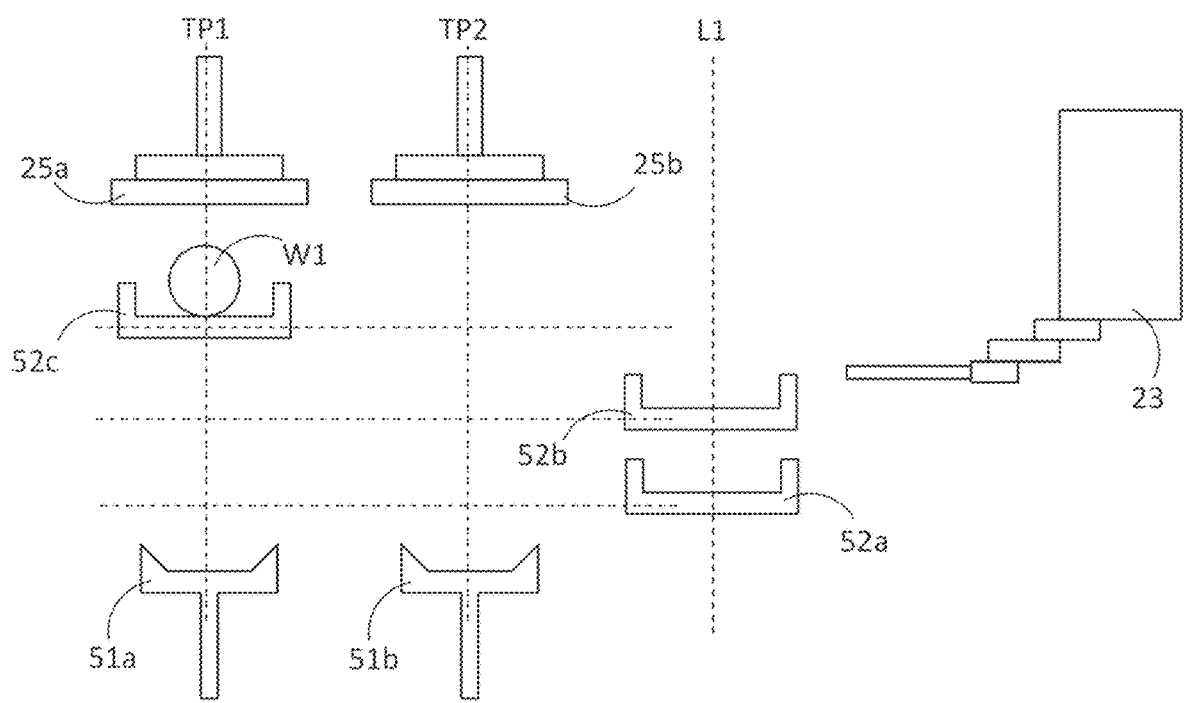
FIG. 19C is a schematic diagram for explaining the operation of the first transport mechanism.

When processing two wafers in parallel (in parallel) in the first polishing apparatus 21a and the second polishing apparatus 21b, the unpolished first wafer W1 held by the transport robot 23 is transferred to the third stage 52c of the exchanger 50 disposed at the waiting position L1 as shown in FIGS. 19A and 19B. Then, as shown in FIG. 19C, the third stage 52c holding the first wafer W1 is moved from the waiting position L1 to the first substrate transport position TP1.

Figure 19D:
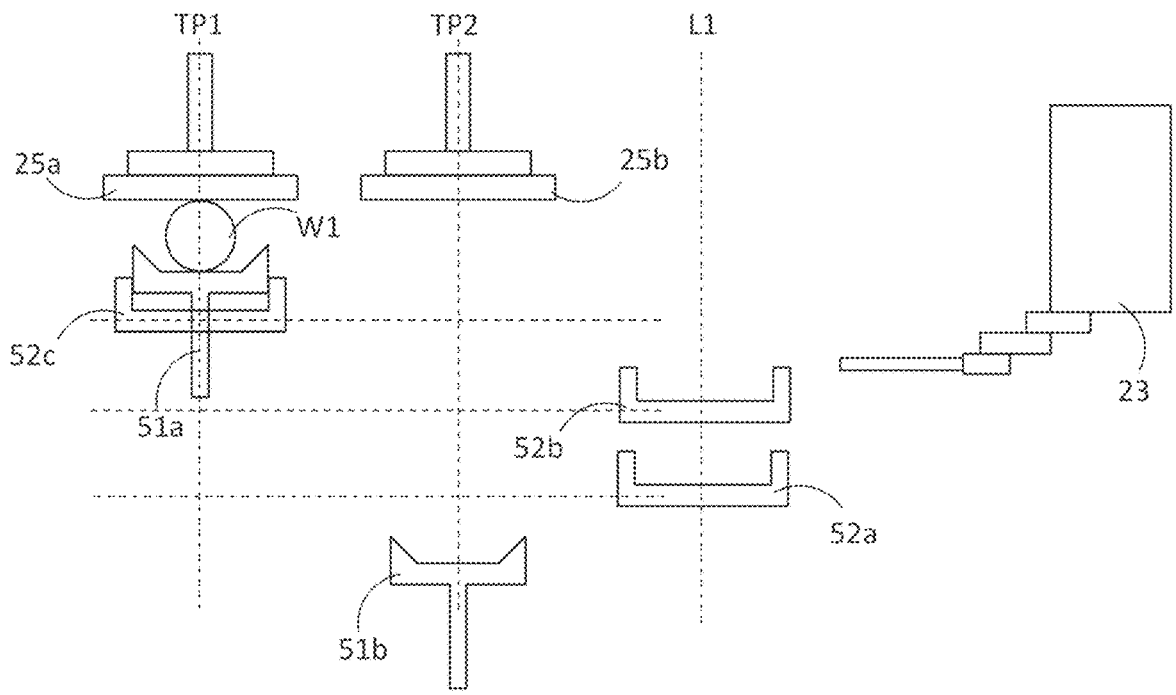
FIG. 19D is a schematic diagram for explaining the operation of the first transport mechanism.
Figure 19E:
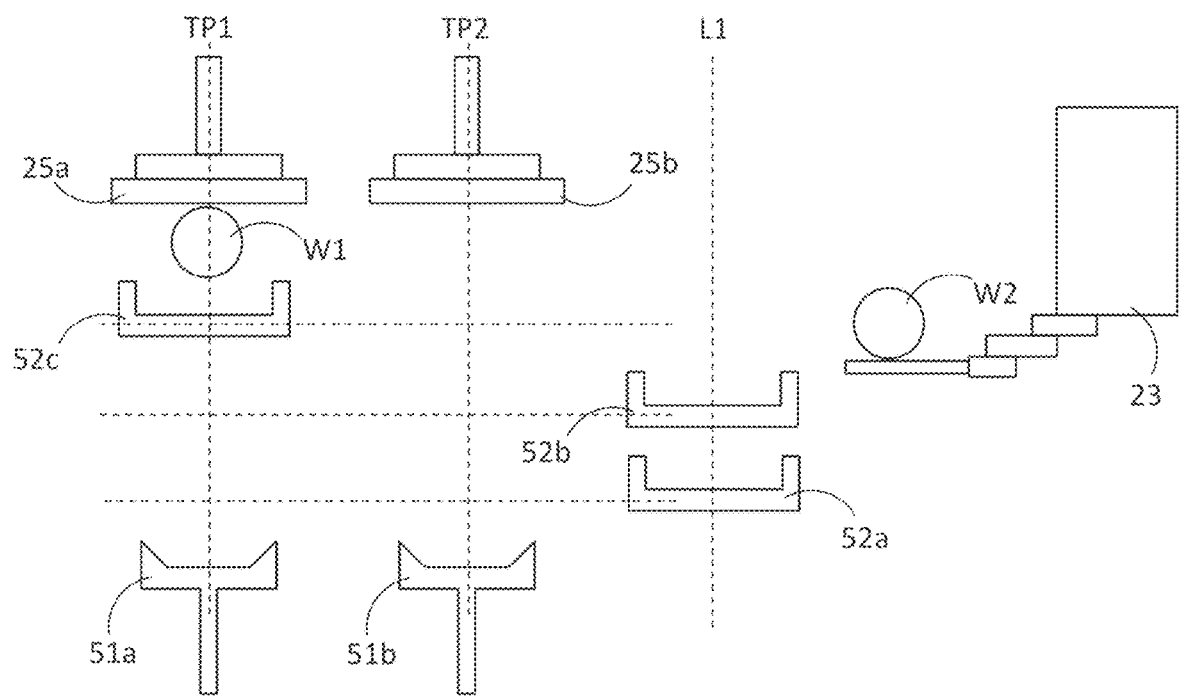
FIG. 19E is a schematic diagram for explaining the operation of the first transport mechanism.

Next, as shown in FIG. 19D, the first pusher 51a ascends to pass through the inside of the third stage 52c, and the first wafer W1 on the third stage 52c is pushed up by the first pusher 51a to be transferred to the top ring 25a of the first polishing apparatus 21a. Then, after the first wafer W1 is sucked by and held at the top ring 25a of the first polishing apparatus 21a, the first pusher 51a descends to the initial height position as shown in FIG. 19E. The transport robot 23 holds the second wafer W2 before polishing.

Figure 19F:
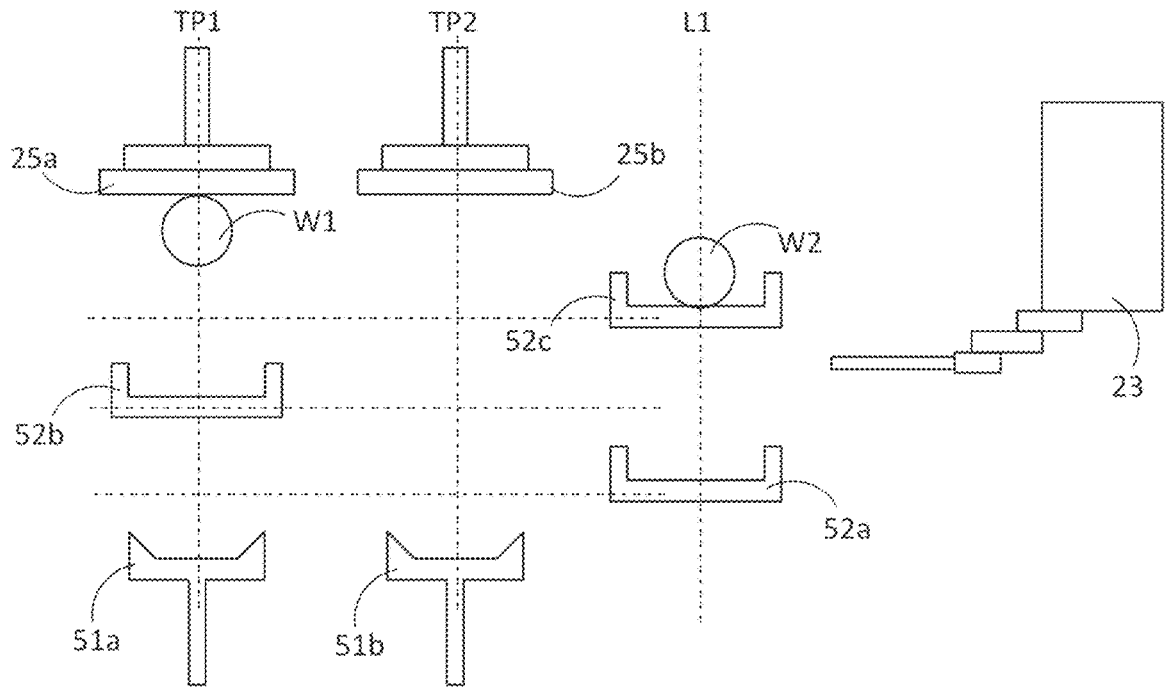
FIG. 19F is a schematic diagram for explaining the operation of the first transport mechanism.
Figure 19G:
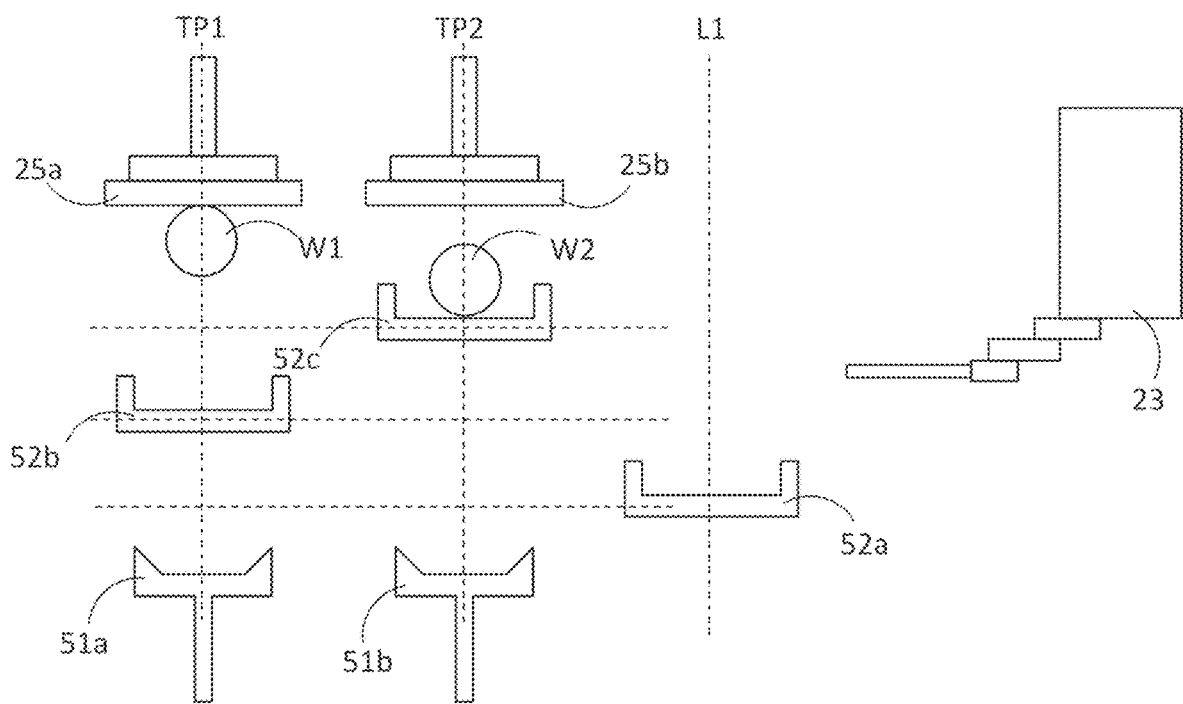
FIG. 19G is a schematic diagram for explaining the operation of the first transport mechanism.

After that, as shown in FIG. 19F, the first wafer W1 is polished by the first polishing apparatus 21a. At this time, the third stage 52c is moved from the first substrate transport position TP1 to the waiting position L1, and the second stage 52b is moved from the waiting position L1 to the first substrate transport position TP1. The unpolished second wafer W2 held by the transport robot 23 is transferred to the third stage 52c disposed at the waiting position L1. Then, as shown in FIG. 19G, the third stage 52c holding the second wafer W2 is moved from the waiting position L1 to the second substrate transport position TP2.

Figure 31:
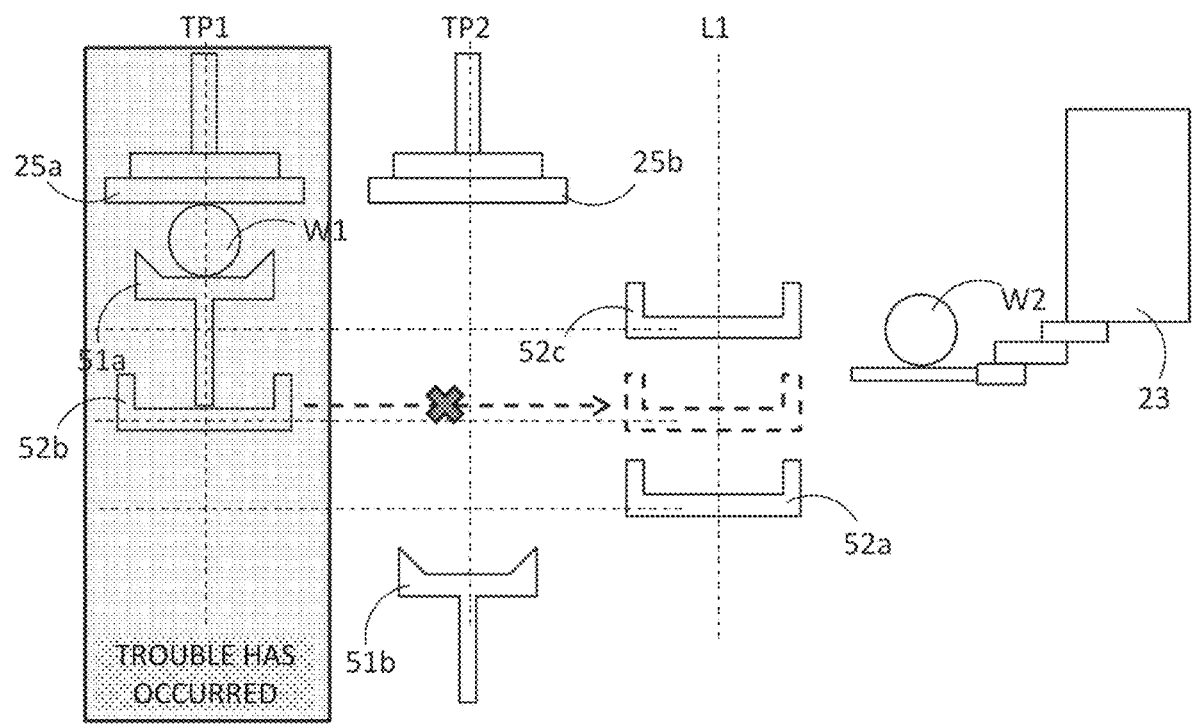
FIG. 31 is a schematic diagram for explaining the occurrence of deadlock in parallel processing.

Even when the parallel process is performed by the first polishing apparatus 21a and the second polishing apparatus 21b, as in the case where the series process is performed by the first polishing apparatus 21a and the second polishing apparatus 21b, it is possible to receive the wafer from the first polishing apparatus 21a using the second stage 52b, and transfer the wafer to the second polishing apparatus 21b using the same second stage 52b. However, in this case, as shown in FIG. 31, when a trouble occurs when receiving the wafer from the first polishing apparatus 21a and the second stage 52b cannot be used, due to this, the wafer cannot be transferred to the second polishing apparatus 21b (deadlock occurs).

On the other hand, in this embodiment, when polishing wafers in parallel by the first polishing apparatus 21a and the second polishing apparatus 21b, the wafers are transferred to both the first polishing apparatus 21a and the second polishing apparatus 21b using the same third stage 52c, and the second stage 52b and the first stage 52a are dedicated to receiving the wafers from the first polishing apparatus 21a and the second polishing apparatus 21b, respectively, so that even when the second stage 52b cannot be used due to a trouble occurring when receiving the wafer from the first polishing apparatus 21a, the wafer can be continuously transferred to the second polishing apparatus 21b (deadlock does not occur).

Figure 19H:
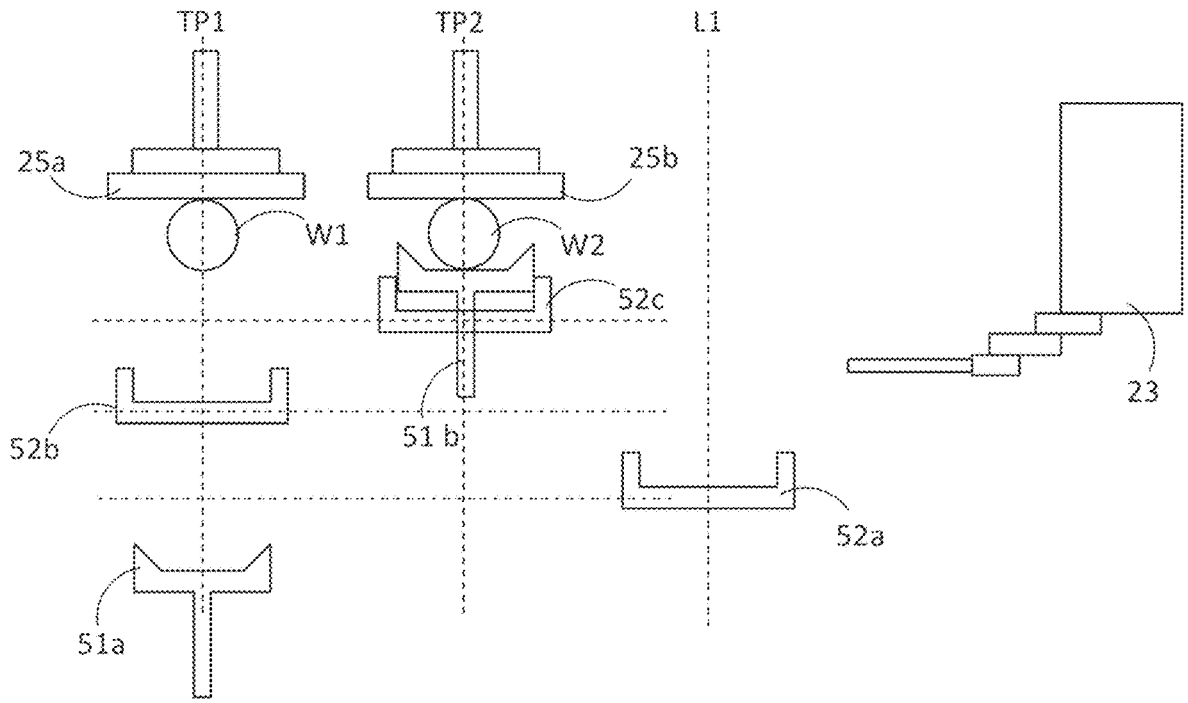
FIG. 19H is a schematic diagram for explaining the operation of the first transport mechanism.
Figure 19I:
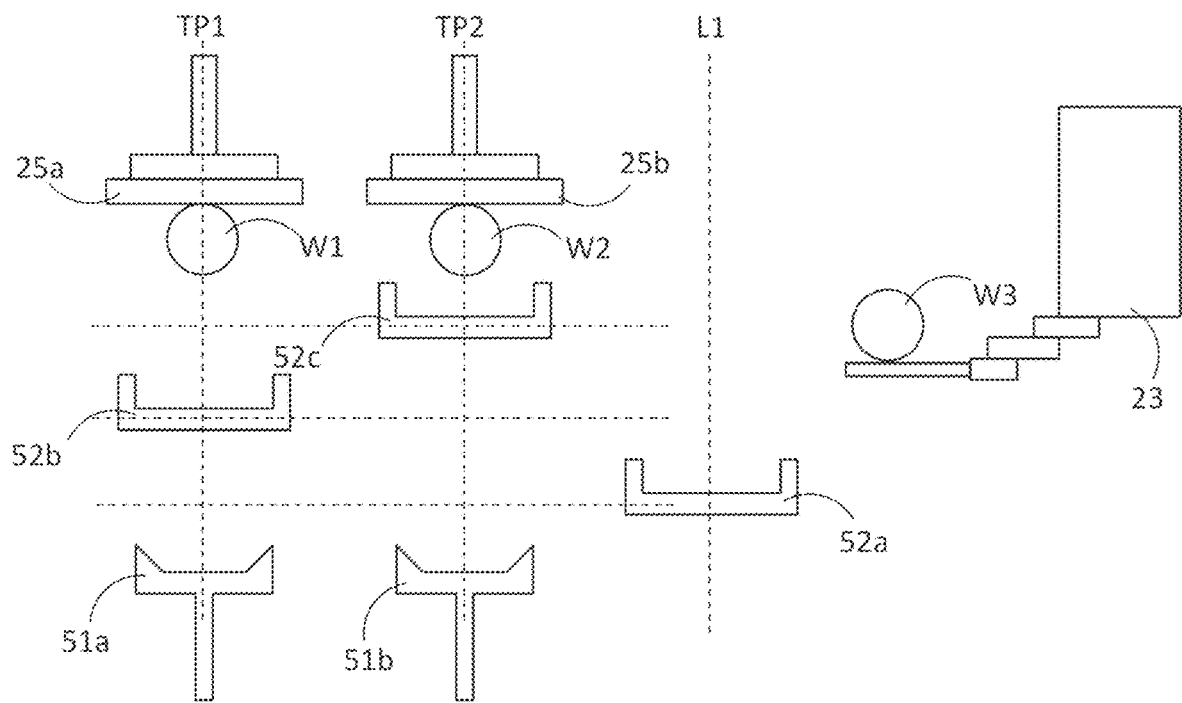
FIG. 19I is a schematic diagram for explaining the operation of the first transport mechanism.

Next, as shown in FIG. 19H, the second pusher 51b ascends to pass through the inside of the third stage 52c, and the second wafer W2 on the third stage 52c is pushed up by the second pusher 51b to be transferred to the top ring 25b of the second polishing apparatus 21b. Then, after the second wafer W2 is sucked by and held at the top ring 25b of the second polishing apparatus 21b, the second pusher 51b descends to the initial height position as shown in FIG. 19I. The transport robot 23 holds a third wafer W3 before polishing.

Figure 19J:
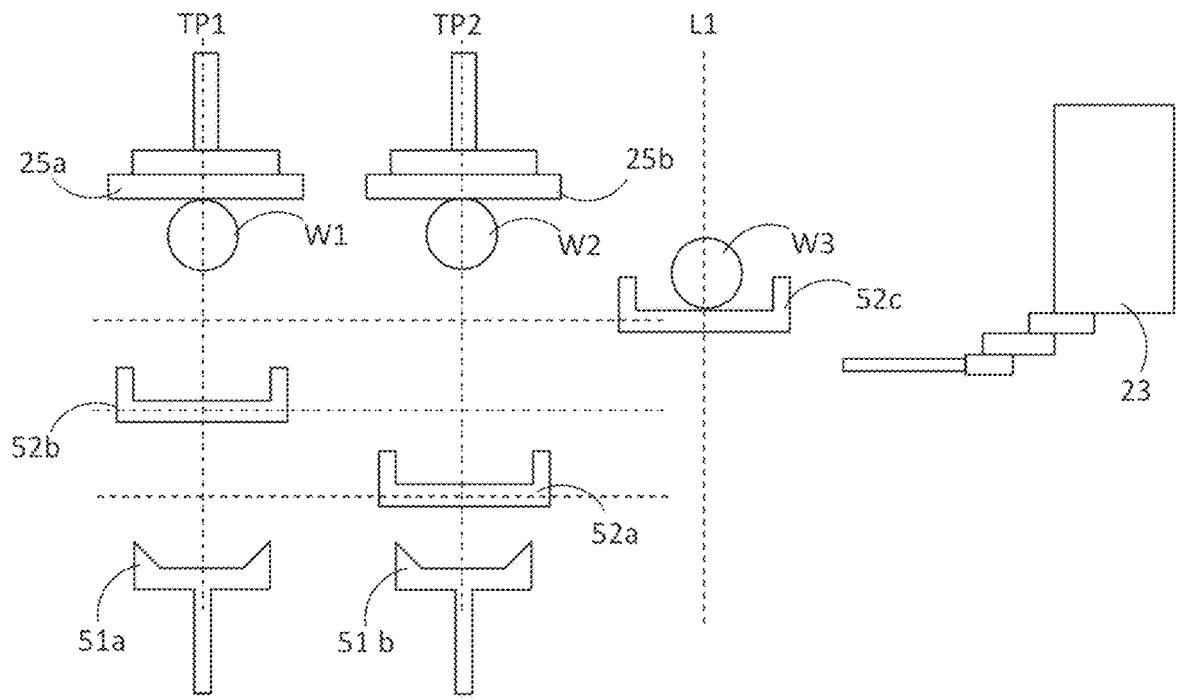
FIG. 19J is a schematic diagram for explaining the operation of the first transport mechanism.

After that, as shown in FIG. 19J, the second wafer W2 is polished by the second polishing apparatus 21b. At this time, the third stage 52c is moved from the second substrate transport position TP2 to the waiting position L1, and the first stage 52a is moved from the waiting position L1 to the second substrate transport position TP2. The unpolished third wafer W3 held by the transport robot 23 is transferred to the third stage 52c disposed at the waiting position L1.

Figure 19K:
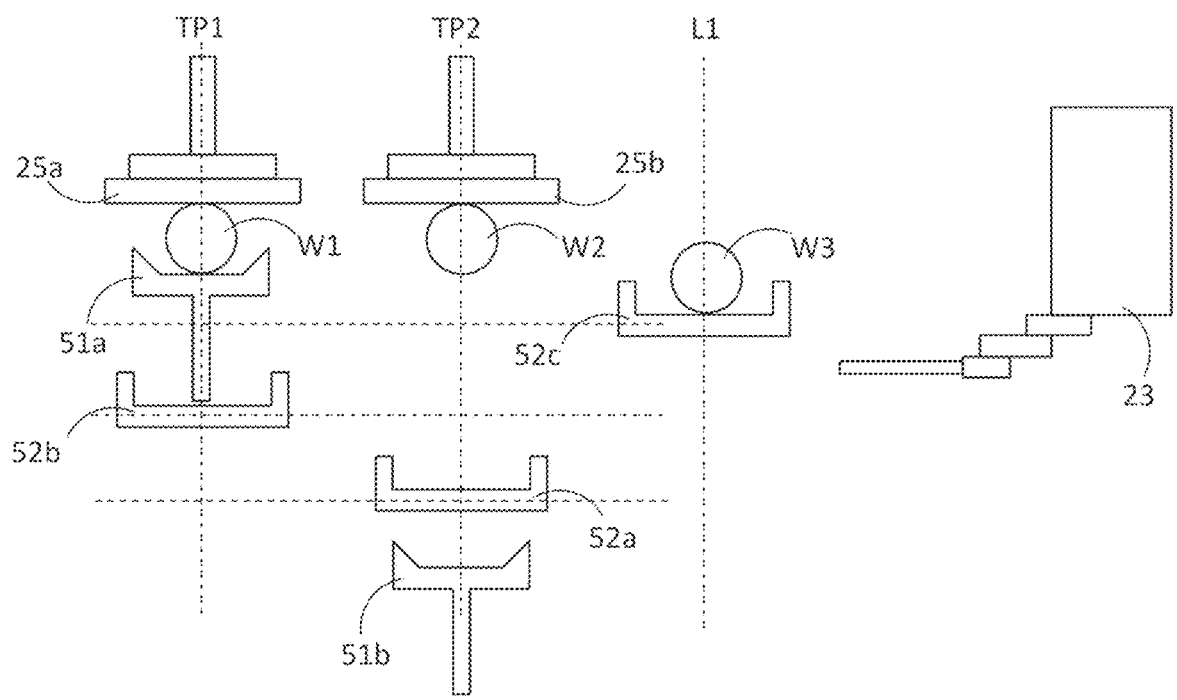
FIG. 19K is a schematic diagram for explaining the operation of the first transport mechanism.
Figure 19L:
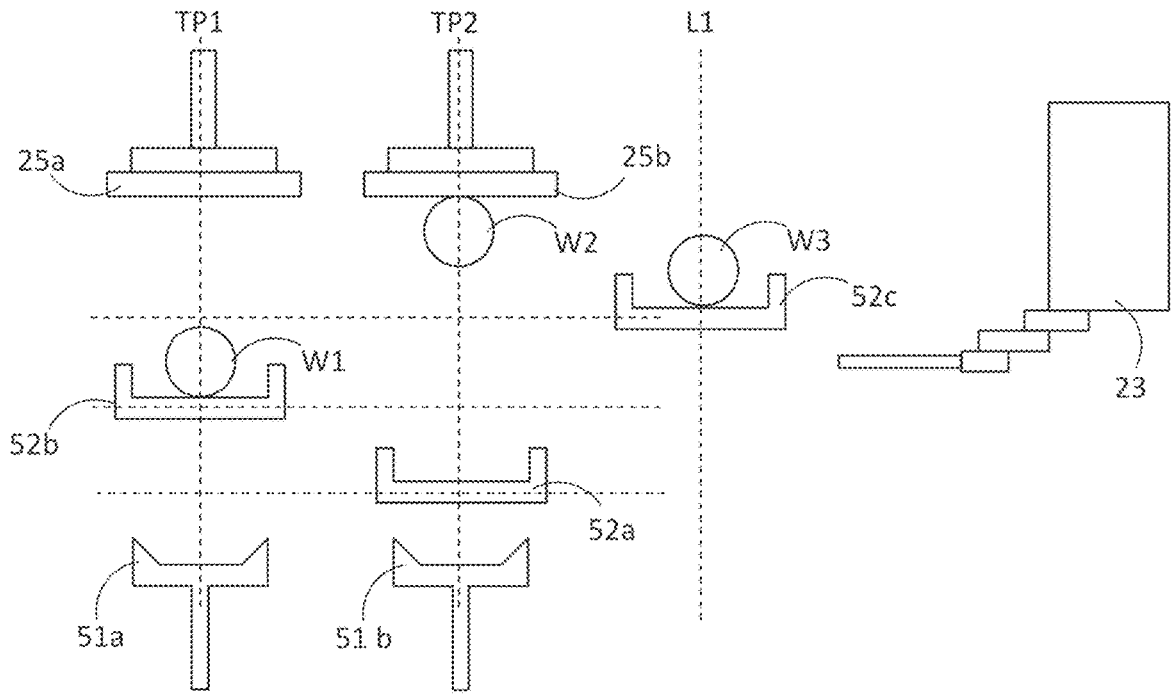
FIG. 19L is a schematic diagram for explaining the operation of the first transport mechanism.

When the polishing by the first polishing apparatus 21a is completed before the polishing by the second polishing apparatus 21b is completed, the first pusher 51a ascends to receive the polished first wafer W1 from the top ring 25a of the first polishing apparatus 21a as shown in FIG. 19K. Then, as shown in FIG. 19L, the first pusher 51a descends to pass through the second stage 52b, and the first wafer W1 on the first pusher 51a is transferred to the second stage 52b. The first wafer W1 held on the second stage 52b is cleaned by a cleaning nozzle (not shown) at the first substrate transport position TP1.

Figure 19M:
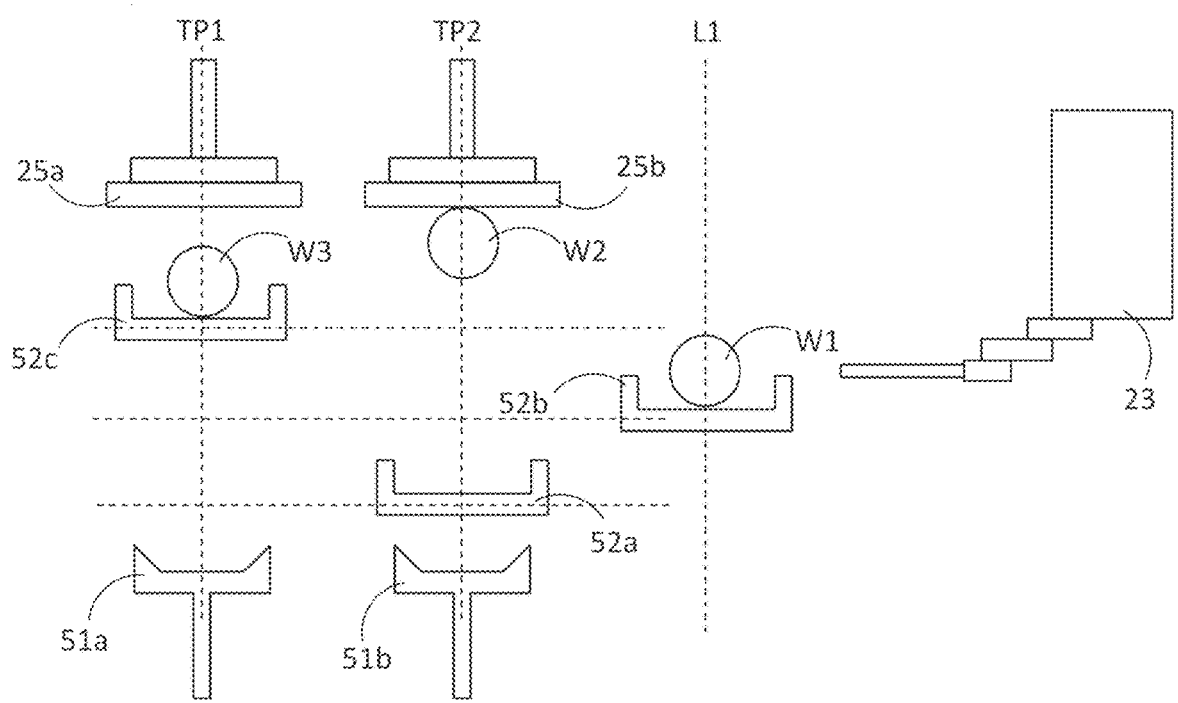
FIG. 19M is a schematic diagram for explaining the operation of the first transport mechanism.

Then, as shown in FIG. 19M, the third stage 52c holding the third wafer W3 is moved from the waiting position L1 to the first substrate transport position TP1 at the same time when the second stage 52b holding the first wafer W1 is moved from the first substrate transport position TP1 to the waiting position L1. The first wafer W1 held on the second stage 52b is taken out of the second stage 52b by the transport robot 23 at the waiting position L1.

Figure 19N:
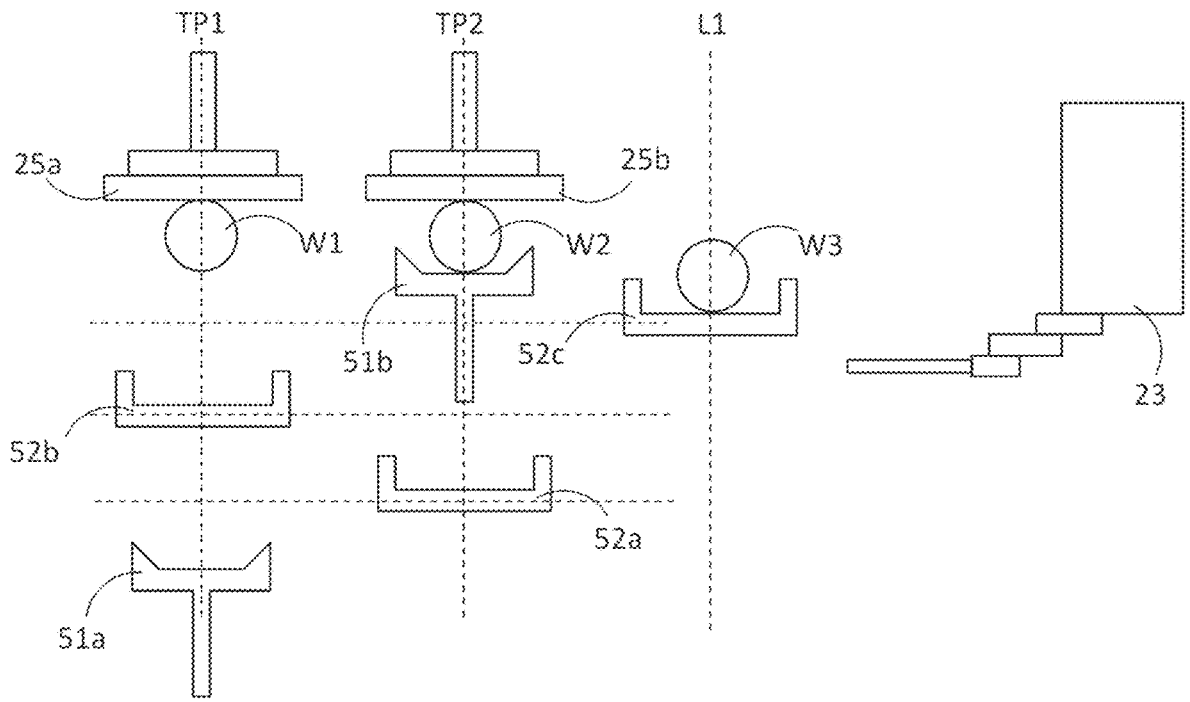
FIG. 19N is a schematic diagram for explaining the operation of the first transport mechanism.
Figure 19O:
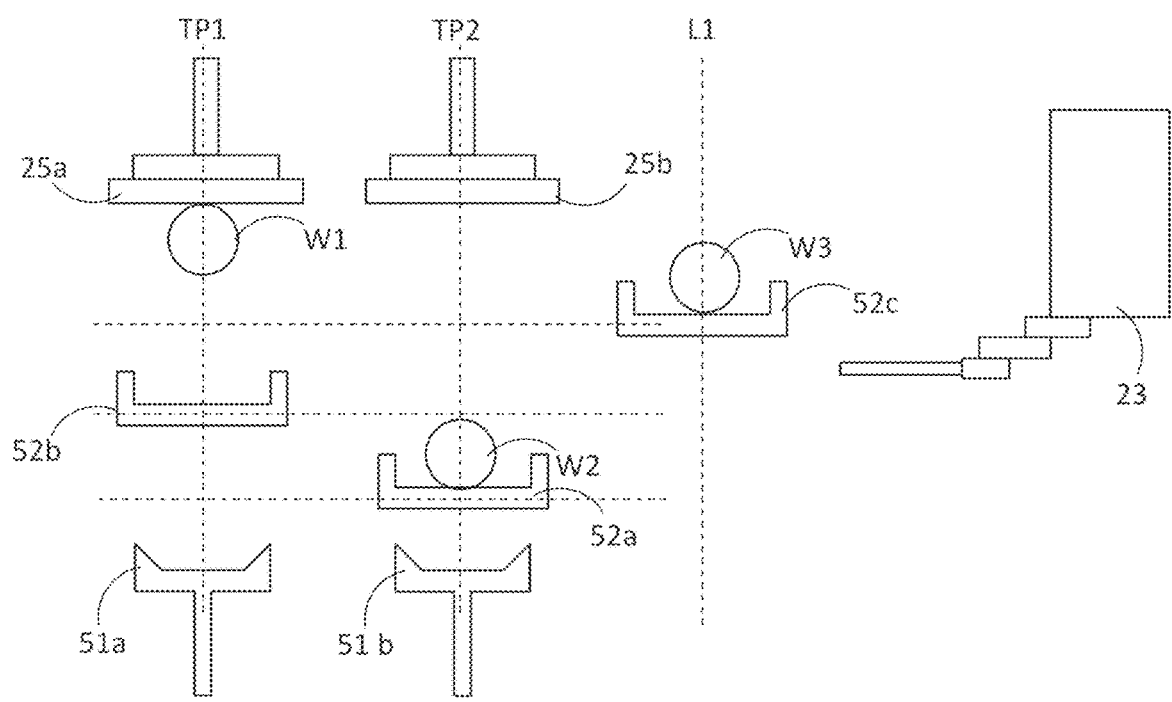
FIG. 19O is a schematic diagram for explaining the operation of the first transport mechanism.

On the other hand, when the polishing by the second polishing apparatus 21b is completed before the polishing by the first polishing apparatus 21a is completed, the second pusher 51b ascends to receive the polished second wafer W2 from the top ring 25b of the second polishing apparatus 21b as shown in FIG. 19N. Then, as shown in FIG. 19O, the second pusher 51b descends to pass through the first stage 52a, and the second wafer W2 on the second pusher 51b is transferred to the first stage 52a. The second wafer W2 held on the first stage 52a is cleaned by a cleaning nozzle (not shown) at the second substrate transport position TP2.

Figure 19P:
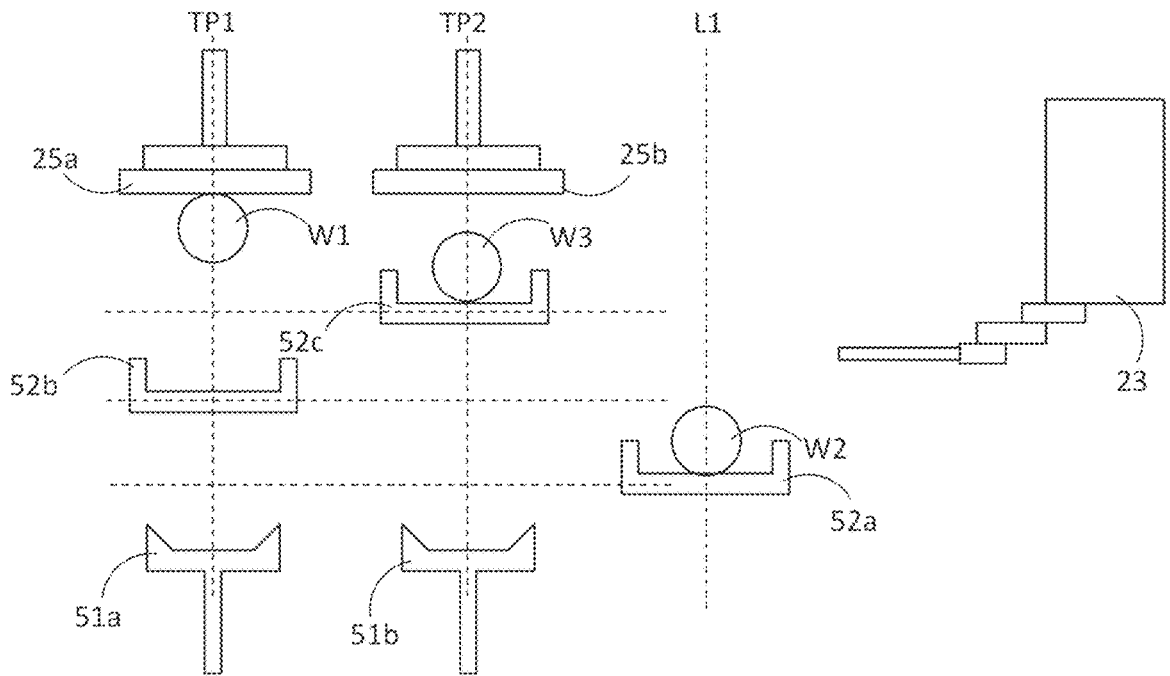
FIG. 19P is a schematic diagram for explaining the operation of the first transport mechanism.

Then, as shown in FIG. 19P, the third stage 52c holding the third wafer W3 is moved from the waiting position L1 to the second substrate transport position TP2 at the same time when the first stage 52a holding the second wafer W2 is moved from the second substrate transport position TP2 to the waiting position L1. The second wafer W2 held on the first stage 52a is taken out of the first stage 52a by the transport robot 23 at the waiting position L1.

Figure 20A:
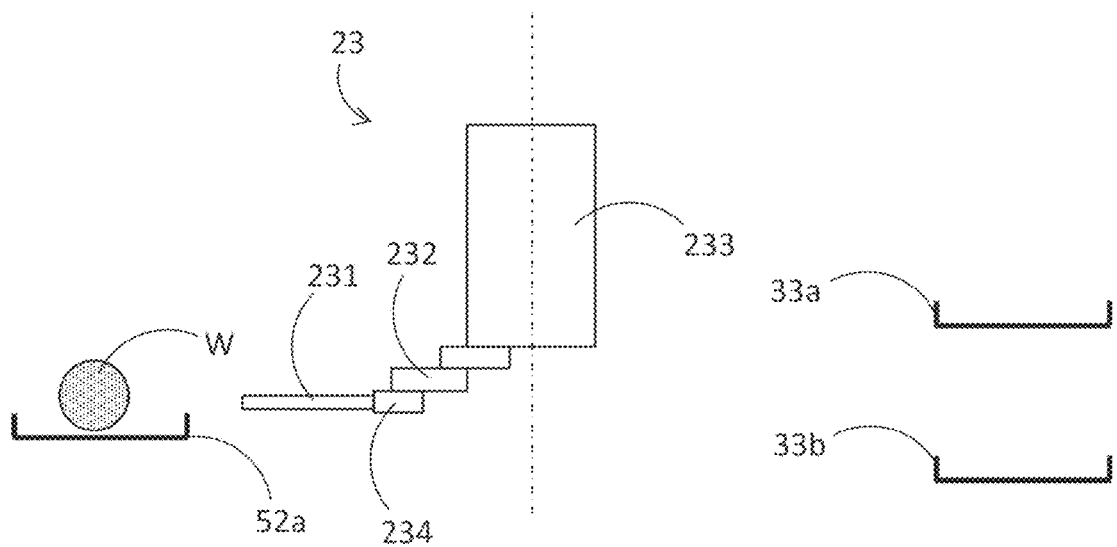
FIG. 20A is a schematic diagram for explaining the operation of the transport robot with respect to the cleaning section.

Although the above description is repeated, the wafer W held on the first stage 52a is taken out of the first stage 52a by the hand 231 of the transport robot 23, as shown in FIG. 20A. Then, the hand 231 is reversed upside down together with the wafer W by the reversing mechanism 234 of the transport robot 23.

Figure 20B:
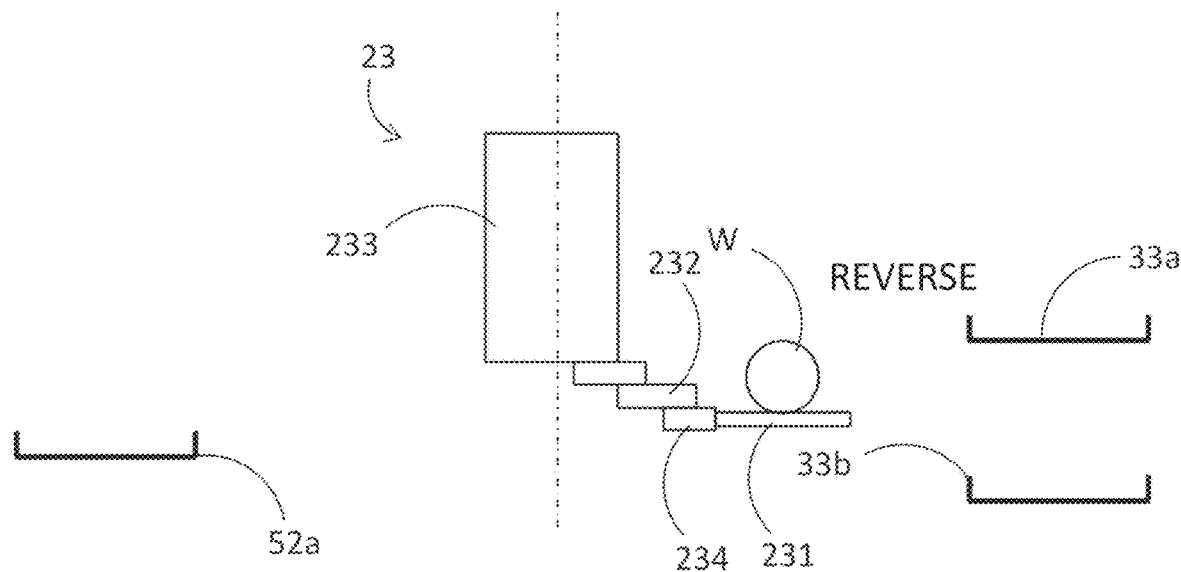
FIG. 20B is a schematic diagram for explaining the operation of the transport robot with respect to the cleaning section.
Figure 20C:
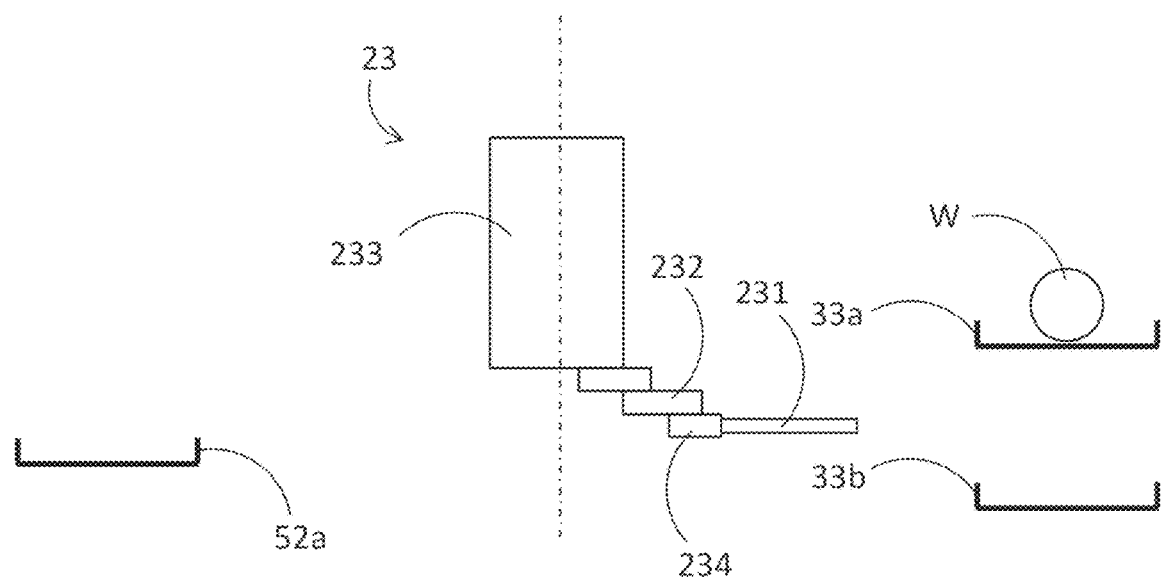
FIG. 20C is a schematic diagram for explaining the operation of the transport robot with respect to the cleaning section.

Next, as shown in FIG. 20B, the arm 232 of the transport robot 23 is rotated around the axis of the robot body 233, and the hand 231 is directed to the first wafer station 33a of the first cleaning unit 30a of the cleaning section 13. Then, as shown in FIG. 20C, the arm 232 is extended, and the wafer W held by the hand 231 is transferred to the first wafer station 33a. More specifically, with the hand 231 of the transport robot 23 positioned at the height as same that of the carry-in port 73 of the first wafer station 33a, the arm 232 is extended, and the wafer W held by the hand 231 is transferred inside of the housing 71 through the carry-in port 73 of the first wafer station 33a, and placed and supported on the stage 72.

In addition, when the first cleaning unit 30a is congested, the wafer W held by the hand 231 may be transferred to the second wafer station 33b of the second cleaning unit 30a. In the present embodiment, the wafers W transported from the polishing section to the cleaning section are distributed by the transport robot 23 to the first cleaning unit 30a and the second cleaning unit 30b, and are cleaned in parallel by the first cleaning unit 30a and the second cleaning unit 30b. Therefore, the throughput of the entire process is improved.

Since the wafer cleaning process in the second cleaning unit 30b is the same as the wafer cleaning process in the first cleaning unit 30a, the wafer cleaning process in the first cleaning unit 30a will be described below.

Figure 21A:
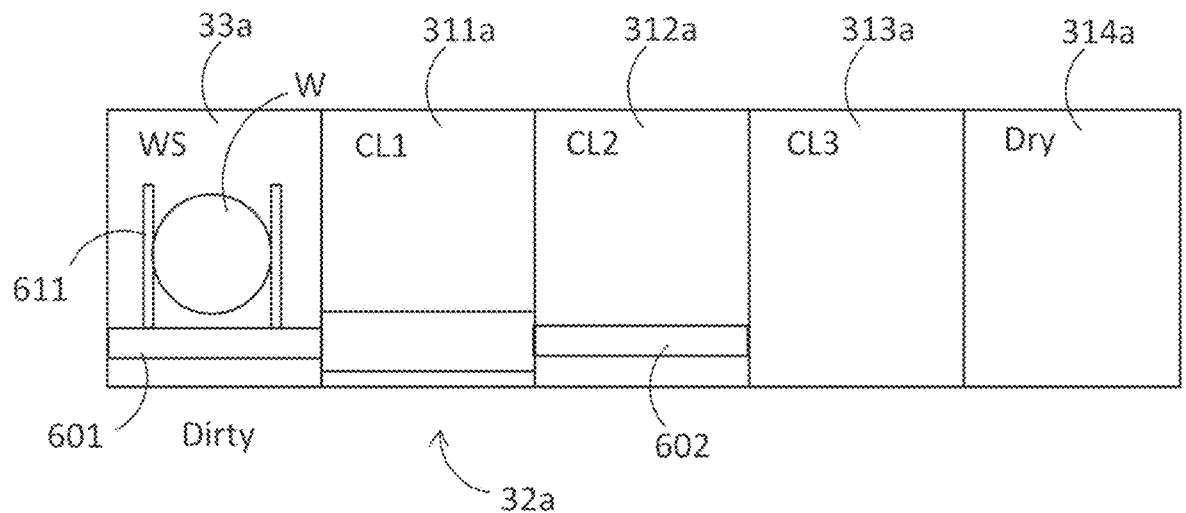
FIG. 21A is a schematic diagram for explaining the operation of the first cleaning unit.

As shown in FIG. 21A, first, with each of the pair of first arms 611 and the pair of second arms 612 having its tip directed upward, the first wafer holding mechanism 601 and the second wafer holding mechanism 602 are moved along the arrangement direction of the first cleaning modules 311a to 314a by driving the arm transport mechanism 62, and the pair of first arms 611 is stopped at a waiting position adjacent to the first wafer station 33a. The pair of first arms 611 is rotated around the rotation shaft 631A by driving the first rotating mechanism 631, and the tips of the pair of first arms 611 are directed sideways. After the shutter of the first wafer station 33a is retracted and the arm passage opening 74 is opened, the pair of first arms 611 is inserted into the first wafer station 33a through the arm passage opening 74, and holds the wafer W held on the stage 72. After the wafer W is held by the pair of first arms 611, the stage 72 is retracted downward.

Figure 21B:
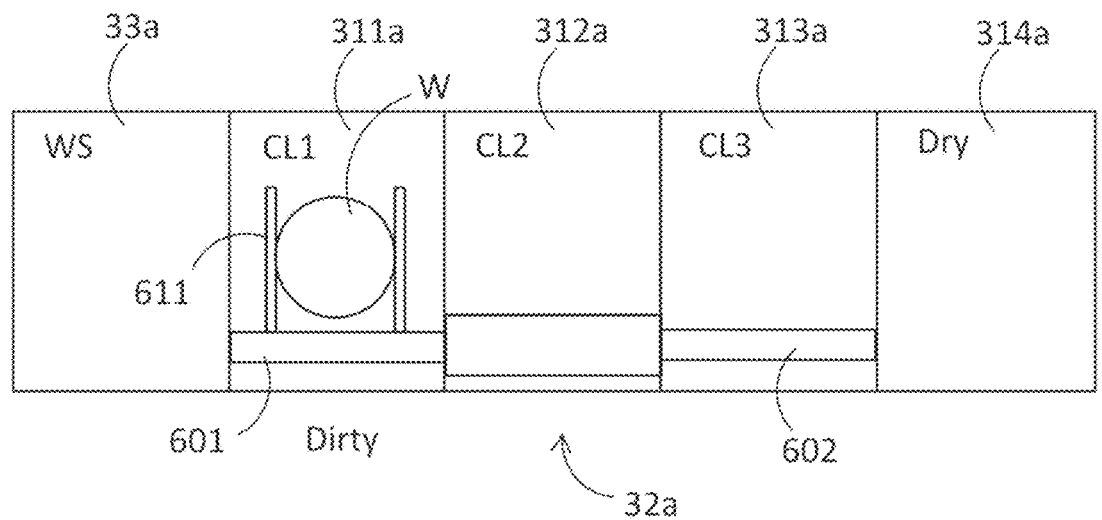
FIG. 21B is a schematic diagram for explaining the operation of the first cleaning unit.

Next, as shown in FIG. 21B, after the shutter 97 of the first cleaning module 311a is retracted and the arm passage opening 94 is opened, the first wafer holding mechanism 601 and the second wafer holding mechanism 602 are moved along the arrangement direction of the cleaning modules 311a to 314a by driving a hand transport mechanism 62, and the wafer W held by the pair of first arms 611 is transported from the first wafer station 33a to the first cleaning module 311a, and is transferred to the cleaning machine of the first cleaning module 311a. Then, after the pair of first arms 611 is put out to the outside of the housing 91 of the first cleaning module 311a, the arm passage opening 94 is closed by the shutter 97, and the wafer W is cleaned by the cleaning machine of the first cleaning module 311a.

After the cleaning process in the first cleaning module 311a is completed, the shutter 97 is retracted, and the arm passage opening 94 is opened. The pair of first arms 611 is inserted inside of the housing 91 of the first cleaning module 311a through the arm passage opening 94, and holds the wafer W cleaned by the cleaning machine.

Figure 21C:
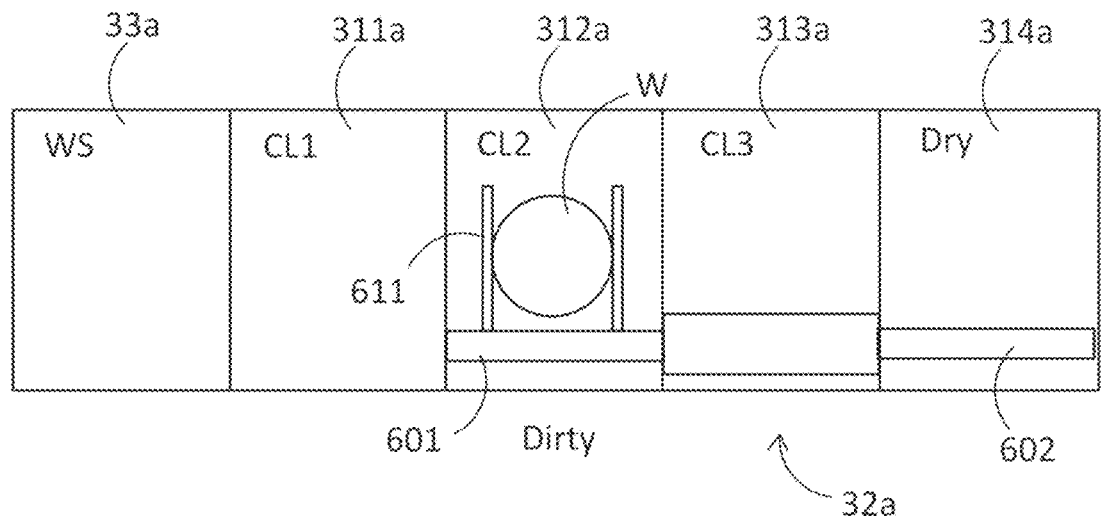
FIG. 21C is a schematic diagram for explaining the operation of the first cleaning unit.

Next, as shown in FIG. 21C, after the shutter 97 of the second cleaning module 312a is retracted, and the arm passage opening 94 is opened, the first wafer holding mechanism 601 and the second wafer holding mechanism 602 are moved along the arrangement direction of the cleaning modules 311a to 314a by driving the arm transport mechanism 62, the wafer W held by the pair of first arms 611 is transported from the first cleaning module 311a to the second cleaning module 312a, and is transferred to the cleaning machine of the second cleaning module 312a. Then, after the pair of first arms 611 is put out to the outside of the housing 91 of the second cleaning module 312a, the arm passage opening 94 is closed by the shutter 97, and the wafer W is cleaned by the cleaning machine of the second cleaning module 312a.

Figure 21D:
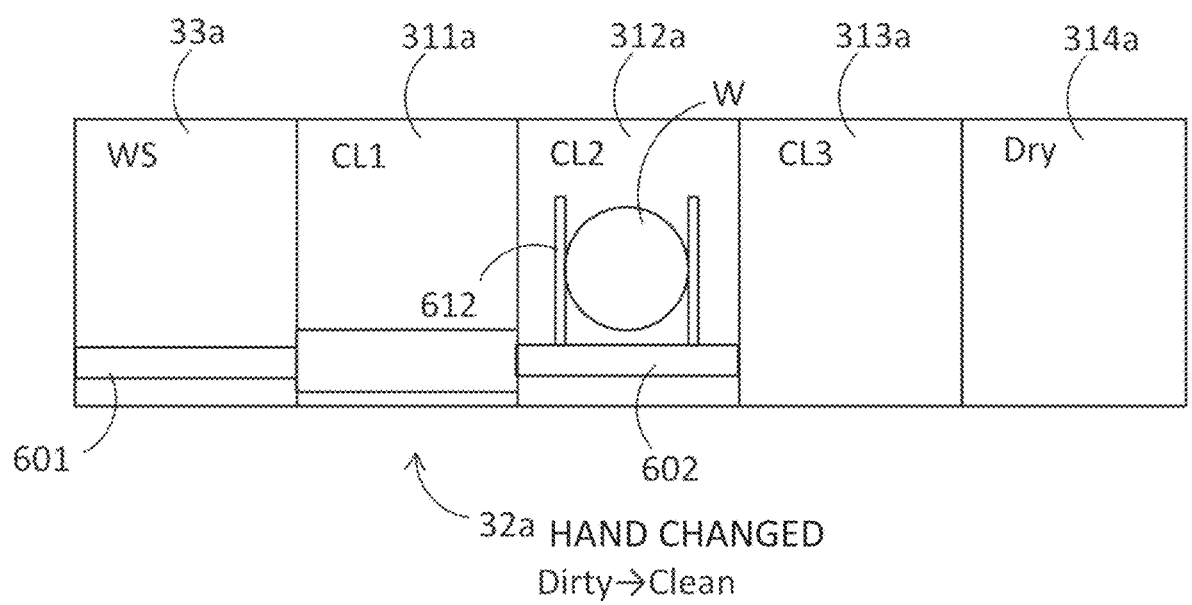
FIG. 21D is a schematic diagram for explaining the operation of the first cleaning unit.

Next, as shown in FIG. 21D, the pair of first arms 611 is rotated about the rotation shaft 631A by driving the first rotating mechanism 631, and the tips of the pair of first arms 611 are directed upward. With each of the pair of first arms 611 and the pair of second arms 612 having its tip directed upward, the first wafer holding mechanism 601 and the second wafer holding mechanism 602 are moved along the arrangement direction of the first cleaning modules 311a to 314a by driving the arm transport mechanism 62, and the pair of second arms 612 are stopped at a waiting position adjacent to the second cleaning module 312a. The pair of second arms 612 is rotated about the rotation shaft 632A by driving the second rotating mechanism 632, and the tip of the pair of second arms 612 are directed sideways.

After the cleaning process in the second cleaning module 312a is completed, the shutter 97 is retracted, and the arm passage opening 94 is opened. The pair of second arms 612 is inserted inside of the housing 91 of the second cleaning module 312a through the arm passage opening 94, and holds the wafer W cleaned by the cleaning machine.

As described above, in the present embodiment, the wafer W before cleaning in the second cleaning module 312a is held and transported by the pair of first arms 611, and the wafer W after cleaning in the second cleaning module 312a is held and transported by the pair of second arms 612. That is, the arm is replaced in the second cleaning module 312a. In this way, it is possible to prevent the wafer W from being contaminated by the pair of first arms 611 being brought into contact with the wafer W after cleaning in the second cleaning module 312a.

Figure 21E:
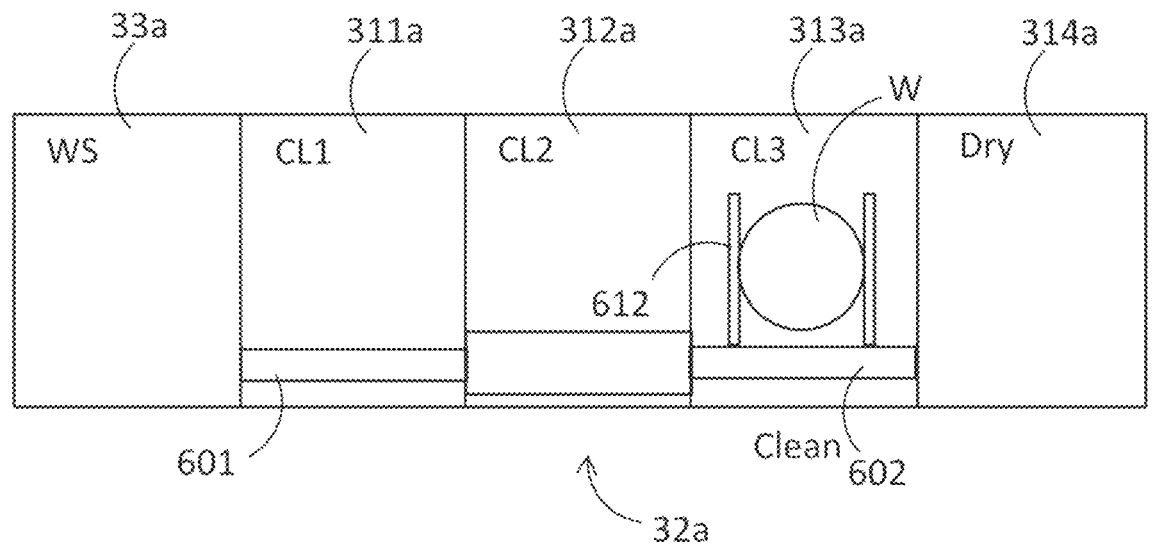
FIG. 21E is a schematic diagram for explaining the operation of the first cleaning unit.

Next, as shown in FIG. 21E, after the shutter 97 of the third cleaning module 313a is retracted and the arm passage opening 94 is opened, the first wafer holding mechanism 601 and the second wafer holding mechanism 602 are moved along the arrangement direction of the cleaning modules 311a to 314a by driving the arm transport mechanism 62, and the wafer W held by the pair of second arms 612 is transported from the second cleaning module 312a to the third cleaning module 313a, and is transferred to the cleaning machine of the third cleaning module 313a. Then, after the pair of second arms 612 is put out to the outside of the housing 91 of the third cleaning module 313a, the arm passage opening 94 is closed by the shutter 97, and the wafer W is cleaned by the cleaning machine of the third cleaning module 313a.

After the cleaning process in the third cleaning module 313a is completed, the shutter 97 is retracted, and the arm passage opening 94 is opened. The pair of second arms 612 is inserted inside of the housing 91 of the third cleaning module 313a through the arm passage opening 94, and holds the wafer W cleaned by the cleaning machine.

Figure 21F:
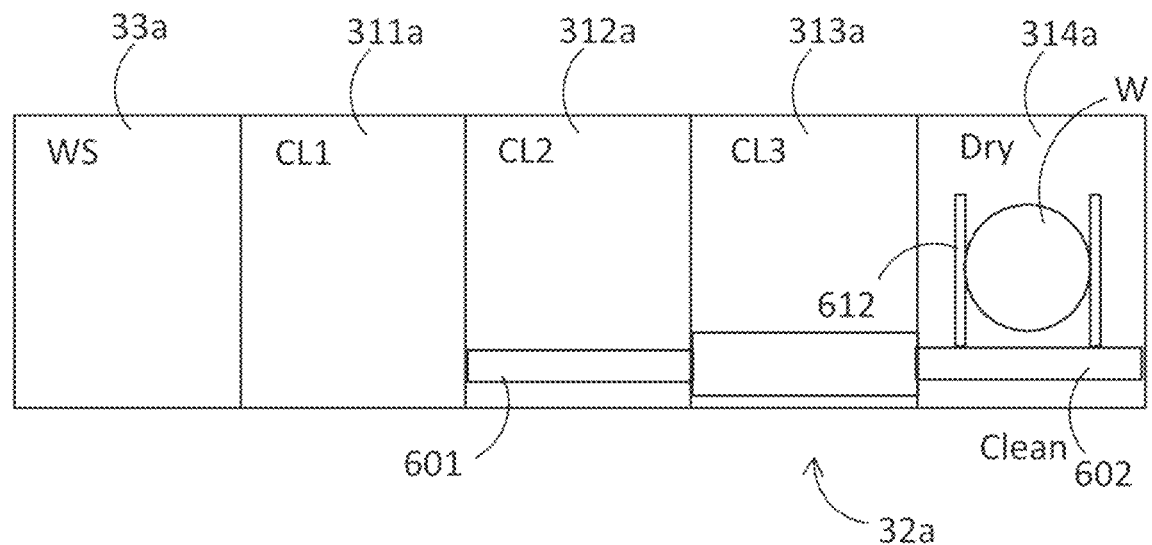
FIG. 21F is a schematic diagram for explaining the operation of the first cleaning unit.

Next, as shown in FIG. 21F, after the shutter 97 of the fourth cleaning module 314a is retracted, and the arm passage opening 94 is opened, the first wafer holding mechanism 601 and the second wafer holding mechanism 602 are moved along the arrangement direction of the cleaning modules 311a to 314a by driving the arm transport mechanism 62, and the wafer W held by the pair of second arms 612 is transported from the third cleaning module 313*a* to the fourth cleaning module 314*a* and is transferred to the cleaning machine of the fourth cleaning module 314*a*. Then, after the pair of second arms 612 is put out to the outside of the housing 91 of the fourth cleaning module 314*a*, the arm passage opening 94 is closed by the shutter 97, and the wafer W is cleaned and dried by the cleaning machine of the fourth cleaning module 314*a*.

After the cleaning process and the drying process in the fourth cleaning module 314*a* are completed, the shutter 97 is retracted, and the arm passage opening 94 is opened. The hand of the transport robot 111 of the load/unload unit 11 described above is inserted inside of the housing 91 of the fourth cleaning module 314*a* through the arm passage opening 94, and is cleaned by the cleaning machine. As the final step, the wafer W that has undergone (for example, spin) drying processing is taken out to the load/unload unit 11.

According to the present embodiment as described above, in each of the polishing apparatuses 21*a* to 21*d* of the polishing section 12, since the pairs of auxiliary unit mounting units 501*a*, 501*b* and 502*a*, 502*b* are provided at respective positions symmetrical with respect to the straight line La connecting the swing center of the top ring 301A and the center of rotation of the polishing table 300A, arrangement of the auxiliary unit 309A that performs a process on the polishing pad 305A during polishing, according to the rotation direction of the polishing table 300A, it is possible to switch symmetrically with respect to the straight line La. Accordingly, the rotation direction of the polishing table 300A can be changed for each of the polishing apparatuses 21*a* to 21*d* while maintaining the positional relationship of the rotation direction of the polishing pad 305A during polishing and the auxiliary unit 309A with respect to the wafer W.

Further, according to the present embodiment, the distance Da1 between the swing center of the top ring of the first polishing apparatus 21*a* and the swing center of the top ring of the second polishing apparatus 21*b* is shorter than the distance Da2 between the center of rotation of the polishing table of the first polishing apparatus 21*a* and the center of rotation of the polishing table of the second polishing apparatus 21*b*, and the distance Db1 between the swing center of the top ring of the third polishing apparatus 21*c* and the swing center of the top ring of the fourth polishing apparatus 21*d* is shorter than the distance Db2 between the center of rotation of the polishing table of the third polishing apparatus 21*c* and the center of rotation of the polishing table of the fourth polishing apparatus 21*d*, so that the interval between the swing range of the top ring of the second polishing apparatus 21*b* and the swing range of the top ring of the third polishing apparatus 21*c* is increased to secure a space for disposing the transport robot 23 in the center of the device, and it is possible to reduce the size of the device.

Further, according to the present embodiment, since the cleaning section 13 has the first cleaning unit 30*a* and the second cleaning unit 30*b* disposed in the upper and lower two stages, even when a plurality of wafers W is continuously transported from the polishing section 12 to the cleaning section 13, the plurality of wafers W can be cleaned in parallel by distributing the wafers W to the first cleaning unit 30*a* and the second cleaning unit 30*b*. Therefore, the throughput of the whole process can be improved.

Further, according to the present embodiment, since the wafer W before polishing is transported from the slide stage 42 of the transport section 14 to the polishing section 12, it is possible to prevent the transport robot 111 disposed in the load/unload unit 11 from being brought into contact with a polishing environment and being contaminated.

Further, according to the present embodiment, since the first cleaning unit 30*a* and the second cleaning unit 30*a* are disposed in upper and lower two stages, and the slide stage 42 is disposed between the first cleaning unit 30*a* and the second cleaning unit 30*b*, it is possible to suppress an increase in the footprint of the entire device.

Further, according to the present embodiment, the polishing section transport mechanism 22 is disposed so as to be adjacent to each of the transport section 14, the first polishing unit 20*a*, and the second polishing unit 20*b*, and the wafers W transported from the transport section 14 to the polishing section 12 are distributed to the first transport unit 24*a* and the second transport unit 24*b* by the transport robot 23 of the polishing section transport mechanism 22. The wafer W is transferred from the first transport unit 24*a* to the first polishing unit 20*a*, and the wafer W is transferred from the second transport unit 24*b* to the second polishing unit 20*b*. In this way, since the first polishing unit 20*a* and the second polishing unit 20*b* do not share the wafer carry-in route, congestion at the time of transferring the wafer into the first polishing unit 20*a* and the second polishing unit 20*b* is eliminated. Therefore, the throughput of the whole process can be improved.

Further, according to the present embodiment, even when an abnormality occurs in any of the cleaning modules 311*a* to 314*a* of the first cleaning unit 30*a*, the wafer W located in the first cleaning unit 30*a* is transported to the second cleaning unit 30*b* and cleaned, so that the wafer W located in the first cleaning unit 30*a* can be rescued.

Further, according to the present embodiment, the first transport unit 24*a* of the polishing section 12 can transport the wafer W received from the transport robot 23 to each of the first polishing apparatus 21*a* and the second polishing apparatus 21*b*. Further, the second transport unit 24*b* of the polishing section 12 can transport the wafer W received from the transport robot 23 to each of the third polishing apparatus 21*c* and the fourth polishing apparatus 21*d*. For example, the first stage 52*a* of the first transport unit 24*a* can receive a first wafer from the transport robot 23 and moves to the first substrate transport position TP1, the first pusher 51*a* can ascend and transfer the first wafer from the first stage 52*a* to the first polishing apparatus 21*a*, the second stage 52*b* can receive a second wafer from the transport robot 23 and move to the second substrate transport position TP2 while polishing the first wafer with the first polishing apparatus 21*a*, the second pusher 51*b* can ascend and transfer the second wafer from the second stage 52*b* to the second polishing apparatus 21*b*, and the second polishing apparatus 21*b* can polish the second wafer. By polishing two wafers in parallel in this way, the throughput of the entire process can be improved. After polishing the wafer with the first polishing apparatus 21*a*, the first pusher 51*a* can descend to transfer the substrate from the first polishing apparatus 21*a* to the second stage 52*b*, the second stage 52*b* can move to the second substrate transport position TP2, the second pusher 51*b* can ascend to transfer the wafer from the second stage 52*b* to the second polishing apparatus 21*b*, and the second polishing apparatus 21*b* can further continuously polish the wafer.

Further, according to the present embodiment, since the exchanger 50 of the polishing section 12 has three stages 52*a* to 52*c*, the third stage 52*c* can receive the next wafer and stand by while, for example, using both the first stage 52*a* and the second stage 52*b* to transfer the wafer between the first polishing apparatus 21a and the second polishing apparatus 21b. This makes it possible to accelerate the start timing of the polishing process for the next wafer and further improve the throughput.

Further, according to the present embodiment, when polishing the first wafer W1 and the second wafer W2 in parallel (parallel) in the first polishing apparatus 21a and the second polishing apparatus 21b, the wafers are transferred to both the first polishing apparatus 21a and the second polishing apparatus 21b using the same third stage 52c, and the second stage 52b and the first stage 52a are dedicated to receiving the wafers from the first polishing apparatus 21a and the second polishing apparatus 21b, respectively, so that even when a trouble occurs when receiving the wafer from one of the polishing apparatus 21a, the wafer can be continuously transferred to the another polishing apparatus 21b (deadlock can be avoided).

Further, according to the present embodiment, since the cleaning section transport mechanism 32a that transports the wafer W between the cleaning modules 311a to 314a has the pair of arms 611 that can be opened and closed and the rotating mechanism 631, and the rotating mechanism 631 can rotate the pair of arms 611 so that the tips thereof are directed upward, even when the shutter 97 of a specific cleaning module among the plurality of cleaning modules 311a to 314a is closed, the arm 611 can be moved while avoiding (skipping) this cleaning module. Therefore, when the arms 611 are moved so as to pass through the cleaning module, it is not necessary to wait for the shutter 97 to open, and the throughput of the entire process can be improved.

In the present embodiment, when the rotating mechanism 631 rotates the pair of arms 611 so that their tips are directed upward, the vertical movement mechanism 641 lowers the pair of arms 611, so that it is possible to reduce the space required above the pair of arms 611.

Further, according to the present embodiment, since there are two sets where one set consists of the pair of arms 611 or 612, the vertical movement mechanism 641 or 642, and the rotating mechanism 631 or 632, two sets of arms can be selectively used according to the degree of cleanliness that the wafer is to have. For example, of the cleaning processes in each cleaning module, one set of arms is used in the first half of the cleaning process, and the other set of arms is used in the latter half of the cleaning process, so that it is possible to prevent the wafer undergoing the latter half of the cleaning process from being contaminated by the contact with the one set of arms.

Further, according to the present embodiment, since the pair of arms 611 is provided with the chuck tops 612a and 612b that can contact the outer peripheral part of the wafer in upper and lower two stages, the chuck tops 612a and 612b can be selectively used according to the cleanliness that the wafer is to have. For example, of the cleaning process in each cleaning module the lower stage chuck top 612b is used in the first half cleaning process, the upper stage chuck top 612a is used in the latter half of the cleaning process, so that it is possible to prevent the wafer undergoing the latter half cleaning process from being contaminated by the contact with the lower stage chuck top 612b.

Further, according to the present embodiment, since a wafer holding mechanism 601 having the pair of arms 611, the vertical movement mechanism 641 and the rotating mechanism 631 is disposed in a suspended manner below the arm transport mechanism 62, the wafer holding mechanism 601 can have an enlarged maintenance space. Therefore, the time required for maintenance can be shortened.

Further, according to the present embodiment, before polishing the unpolished wafer W by the polishing apparatus 12, the surface of the wafer W can be cleaned by the preliminary cleaning module 39a. As a result, it is possible to reduce troubles such as the occurrence of scratches due to the coarse particles being caught during the polishing process of the wafer W.

As described above, in the present embodiment, the wafer W before cleaning in the second cleaning module 312a is held and transported by the pair of first arms 611, and the wafer W after cleaning in the second cleaning module 312a is held and transported by the pair of second arms 612, but the present invention is not limited to this. For example, the wafer W before cleaning in the first cleaning module 311a may be held and transported by the pair of first arms 611, the wafer W after cleaning in the first cleaning module 311a may be held and transported by the pair of second arms 612, the wafer W before cleaning in the third cleaning module 313a may be held and transported by the pair of first arms 611, and the wafer W after cleaning in the third cleaning module 313a may be held and transported by the pair of second arms 612.

Further, in the above-described embodiment, the transport unit of the polishing section 12 (for example, the first transport unit 24a) has two pushers (first pusher 51a and second pusher 51b) which are disposed at two substrate transport positions (first substrate transport position TP1 and the second substrate transport position TP2) for respective two polishing apparatus (first polishing apparatus 21a and second polishing apparatus 21b), and that vertically move, and the exchanger 50 including at least two stages (first stage 52a and second stage 52b) that are disposed in vertically two stages, and that horizontally move independently of each other between the waiting position L1 at which the wafer W is transferred to and from the transport robot 23 and the two substrate transport positions TP1 and TP2, but the present invention is not limited to this. The transport unit of the polishing section 12 may have M pushers that are disposed at M substrate transport positions for respective M polishing apparatuses (M is a natural number of 3 or more), and that vertically move, and the exchanger 50 including at least M stages that are disposed in vertically M stages, and that horizontally move independently of each other between the waiting position L1 at which the wafer W is transferred to and from the transport robot 23 and the M substrate transport positions. In this case, it is preferable that the exchangers 50 have one additional stage that is disposed in a plurality of stages in the vertical direction with respect to the M stages and that horizontally moves independently of the M stages between the waiting position L1 and the M substrate transport positions.

Further, in the example shown in FIGS. 18A to 18O and FIGS. 19A to 19P, the waiting position L1 is positioned closer to the transport robot 23 (right side of paper) than the first substrate transport position TP1 and the second substrate transport position TP2, but present invention is not limited to such a positional relationship. The waiting position L1 may be positioned between the first substrate transport position TP1 and the second substrate transport position TP2, or may be positioned further away from the transport robot 23 (left side of paper) than the first substrate transport position TP1 and the second substrate transport position TP2.

In the above embodiment, a polishing apparatus that polishes a wafer has been described as an example. The present technology is applicable not only to the polishing apparatus but also to other substrate processing apparatuses.

For example, a plurality of polishing units may be replaced by another substrate processing unit (for example, a film forming processing unit such as a plating processing unit and a CVD unit, a wet etching unit a dry etching unit, etc.), and a substrate processing apparatus different from the polishing apparatus may be configured. Further, a plurality of different substrate processing units may be combined and disposed in a predetermined direction.

Although the preferred embodiments of the present technology have been described so far, the present technology is not limited to the above-described embodiments, and it goes without saying that the present technology may be implemented in various forms within the scope of the technical idea thereof.

The invention claimed is:

1. A substrate processing apparatus comprising:
a polishing section that polishes a substrate; and
a transport section that transports a substrate before polishing to the polishing section, wherein
the polishing section has
a first polishing unit and a second polishing unit, and
a polishing section transport mechanism disposed so as to be adjacent to each of the transport section, the first polishing unit, and the second polishing unit,
the polishing section transport mechanism has
a first transport unit that transports a substrate to the first polishing unit,
a second transport unit that transports a substrate to the second polishing unit, and
a transport robot disposed between the first transport unit and the second transport unit, the transport robot performing a transfer of a substrate between the transport section, and the first transport unit and the second transport unit,
the first polishing unit has a first polishing apparatus and a second polishing apparatus,
the second polishing unit has a third polishing apparatus and a fourth polishing apparatus,
each of the first polishing apparatus, the second polishing apparatus, the third polishing apparatus and the fourth polishing apparatus has
a polishing table to which a polishing pad having a polishing face is mounted,
a top ring that polishes a wafer while holding the wafer and pressing the wafer against the polishing pad on the polishing table, and
auxiliary units that perform a process on the polishing pad during polishing, and
a pair of auxiliary unit mounting units for mounting the respective auxiliary units in a left-right switchable manner with respect to a straight line connecting a swing center of the top ring and a center of rotation of the polishing table is provided at respective positions symmetrical with respect to the straight line around the polishing table.

2. The substrate processing apparatus according to claim 1, wherein
the first polishing apparatus, the second polishing apparatus, the third polishing apparatus and the fourth polishing apparatus are disposed in a line,
a distance between a swing center of a top ring of the first polishing apparatus and a swing center of a top ring of the second polishing apparatus is shorter than a distance between a center of rotation of a polishing table of the first polishing apparatus and a center of rotation of a polishing table of the second polishing apparatus, and
a distance between a swing center of a top ring of the third polishing apparatus and a swing center of a top ring of the fourth polishing apparatus is shorter than a distance between a center of rotation of a polishing table of the third polishing apparatus and a center of rotation of a polishing table of the fourth polishing apparatus.

3. The substrate processing apparatus according to claim 1, wherein
the auxiliary units are one or more of a polishing liquid supply nozzle that supplies a polishing liquid or dressing liquid to a polishing pad, a dressing device that dresses a polishing face of the polishing pad, an atomizer that atomizes a mixed gas of a liquid and a gas, or a liquid to spray the atomized mixed gas or the atomized liquid onto a polishing face, and a polishing pad temperature control slider that adjust a surface temperature of the polishing pad.

4. The substrate processing apparatus according to claim 1, wherein
the auxiliary unit mounting units each include a hole, opened in a base, through which a swing shaft or a column of each of the auxiliary units passes, or a pedestal, provided on the base, to which the swing shaft or the column of each of the auxiliary units is mounted.

5. The substrate processing apparatus according to claim 1, wherein
unit cleaning mechanisms that clean the respective auxiliary units are provided around the polishing table at respective positions symmetrical with respect to the straight line.

6. The substrate processing apparatus according to claim 1, wherein
with respect to the polishing table, first end point detection sensor mounting holes each for mounting a first end point detection sensor are formed at a position away from a center of rotation of the polishing table by a first distance, and second end point detection sensor mounting holes each for mounting a second end point detection sensor are formed at a position away from the center of rotation of the polishing table by a second distance different from the first distance, and
the first end point detection sensor mounting holes are formed one by one at respective positions symmetrical with respect to one reference line, on the polishing table, that passes through a center of rotation defined on the polishing table, and the second end point detection sensor mounting holes are formed one by one at respective positions symmetrical with respect to the one reference line on the polishing table.

7. The substrate processing apparatus according to claim 6, wherein
each of the first end point detection sensor and the second end point detection sensor is an optical end point detection sensor or an eddy current end point detection sensor.

8. The substrate processing apparatus according to claim 1, wherein
with respect to the polishing table, first end point detection sensor mounting holes each for mounting a first end point detection sensor are formed at a position away from a center of rotation of the polishing table by a first distance, and a second end point detection sensor mounting hole for mounting a second end point detection sensor is formed at a position away from the center of rotation of the polishing table by a second distance different from the first distance, and the first end point detection sensor mounting holes are formed one by one at respective positions symmetrical with respect to one reference line, on the polishing table, that passes through a center of rotation defined on the polishing table, and the second end point detection sensor mounting hole is formed on the one reference line on the polishing table.

9. The substrate processing apparatus according to claim 8, wherein each of the first end point detection sensor and the second end point detection sensor is an optical end point detection sensor or an eddy current end point detection sensor.

* * * * *